(12) United States Patent
Chuang et al.

(10) Patent No.: US 12,015,081 B2
(45) Date of Patent: Jun. 18, 2024

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Ming-Yen Chuang, Hsinchu (TW); Katherine H. Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 332 days.

(21) Appl. No.: 17/377,339

(22) Filed: Jul. 15, 2021

(65) Prior Publication Data

US 2023/0018869 A1 Jan. 19, 2023

(51) Int. Cl.
*H01L 29/78* (2006.01)
*H01L 21/8234* (2006.01)
*H01L 29/423* (2006.01)
*H01L 29/786* (2006.01)

(52) U.S. Cl.
CPC .......... *H01L 29/7827* (2013.01); *H01L 21/823487* (2013.01); *H01L 29/42392* (2013.01); *H01L 29/7869* (2013.01)

(58) Field of Classification Search
CPC ......... H01L 29/7827; H01L 21/823487; H01L 29/42392; H01L 29/7869; H01L 21/823475; H01L 27/088; H01L 29/78642; H10B 12/02; H10B 12/30
See application file for complete search history.

(56) References Cited

U.S. PATENT DOCUMENTS 10,629,732 B1 * 4/2020 Sills ................. H01L 29/78391
11,532,641 B2 * 12/2022 Kang .................. G11C 15/046

* cited by examiner

*Primary Examiner* — David Vu
(74) *Attorney, Agent, or Firm* — JCIPRNET

(57) ABSTRACT

A semiconductor die includes semiconductor substrate and interconnection structure. Interconnection structure includes first conductive lines, first conductive patterns, first pillar stacks, second pillar stacks, gate patterns. First conductive lines extend parallel to each other in first direction and are embedded in interlayer dielectric layer. First conductive patterns are disposed in row along first direction and are embedded in interlayer dielectric layer beside first conductive lines. First pillar stacks include first pairs of metallic blocks separated by first dielectric material blocks. Second pillar stacks include second pairs of metallic blocks separated by second dielectric material blocks. Each second pillar stack is electrically connected to respective first conductive pattern. Gate patterns extend substantially perpendicular to first conductive lines. Each gate pattern directly contacts one respective second pillar stack and extends over a group of first pillar stacks.

20 Claims, 40 Drawing Sheets

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 19A are schematic top views of a region of structures formed during a manufacturing method of a semiconductor device according to some embodiments of the disclosure.

FIG. 5B to FIG. 19B are schematic top views of a region of structures formed during a manufacturing method of a semiconductor device according to some embodiments of the disclosure.

FIG. 5C to FIG. 19C are schematic cross-sectional views of regions of structures formed during a manufacturing method of a semiconductor device according to some embodiments of the disclosure.

FIG. 5D to FIG. 19D are schematic cross-sectional views of regions of structures formed during a manufacturing method of a semiconductor device according to some embodiments of the disclosure.

DETAILED DESCRIPTION

Figure 1:
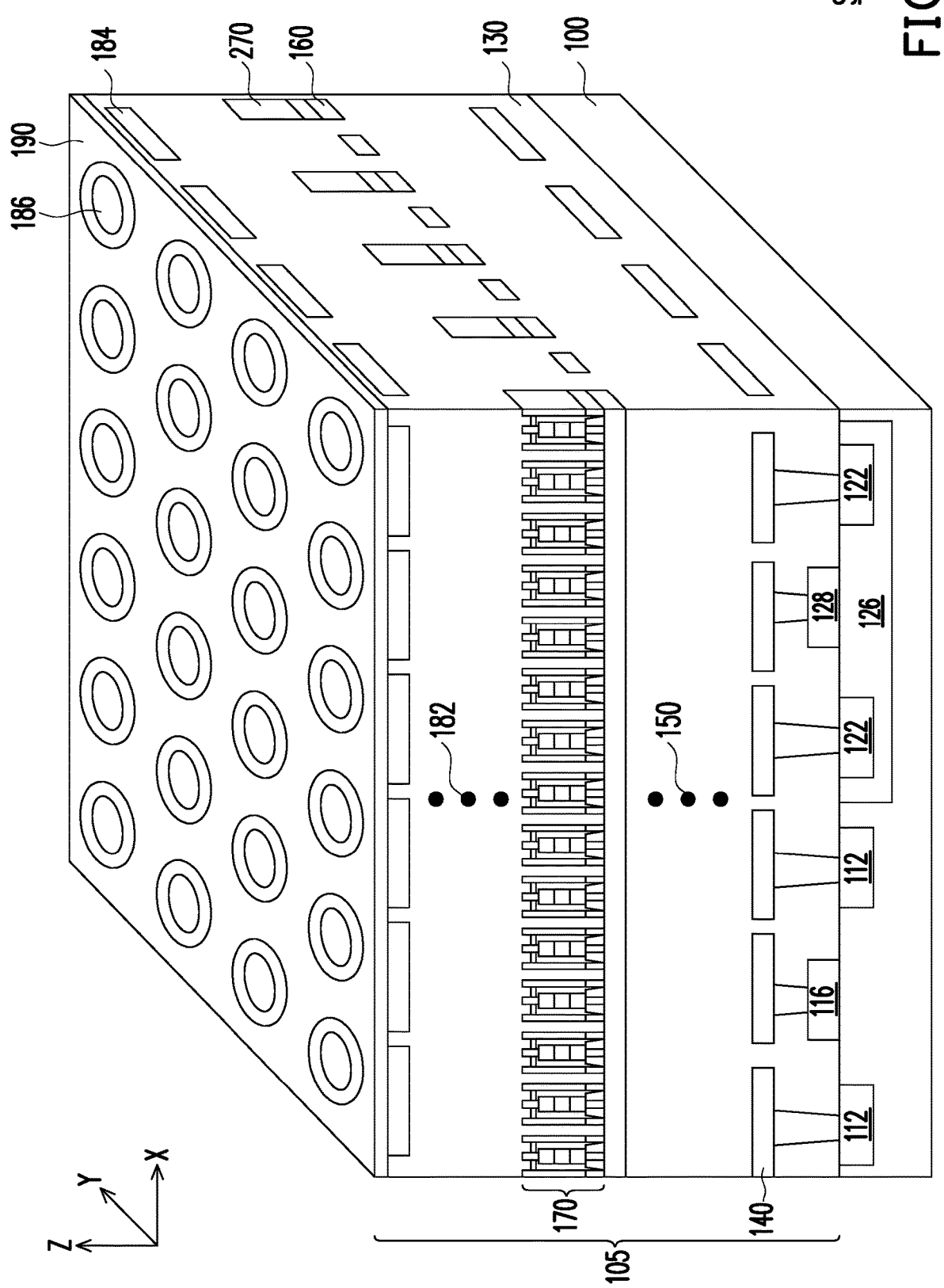
FIG. 1 is a schematic perspective view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
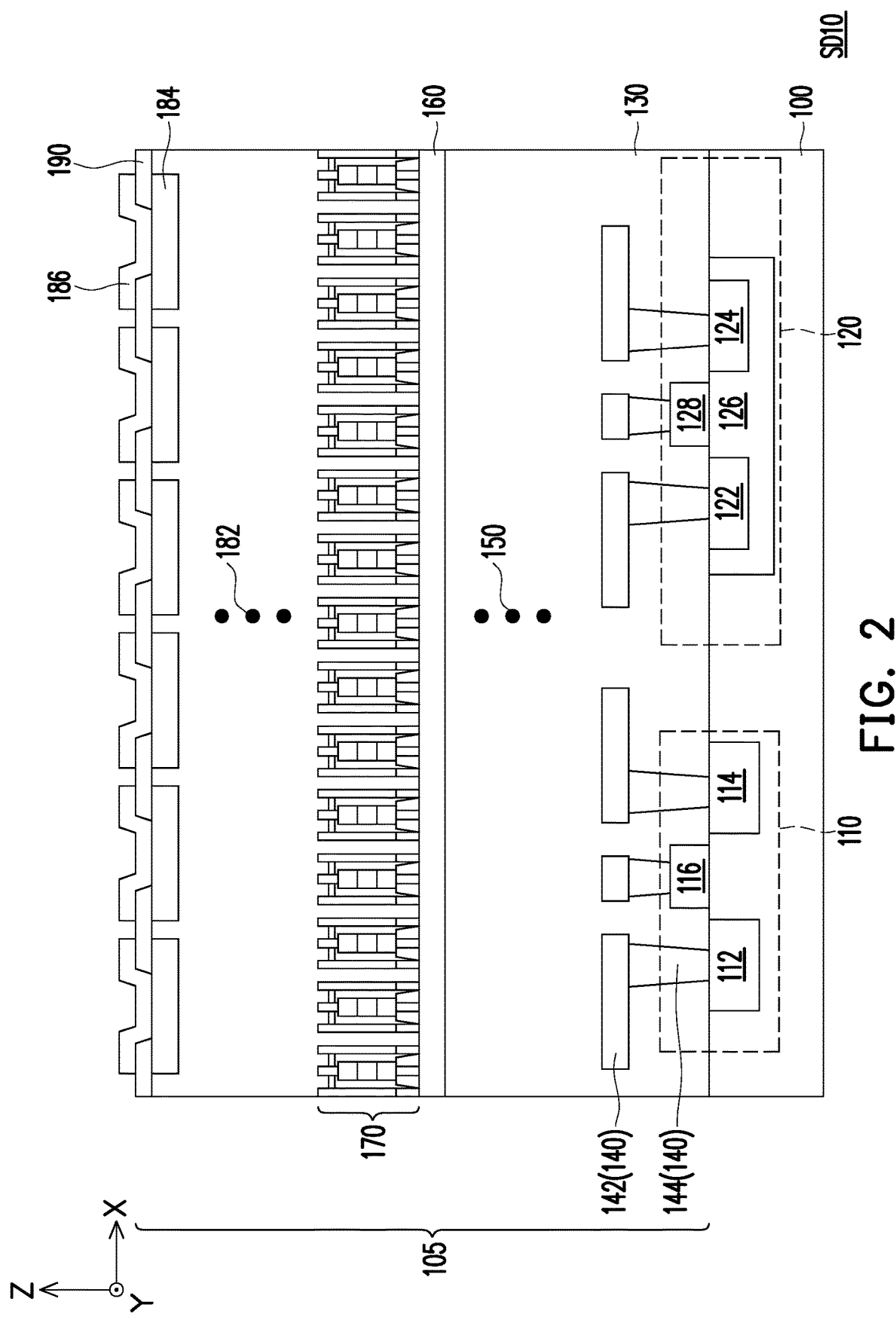
FIG. 2 is a schematic cross-sectional view of a semiconductor device according to some embodiments of the disclosure.

FIG. 1 is a schematic perspective view of a semiconductor device SD10 according to some embodiments of the disclosure. FIG. 2 is a schematic cross-sectional view of the semiconductor device SD10 according to some embodiments of the disclosure. The view of FIG. 2 may be taken in an XZ plane, where the X, Y, and Z directions form a set of orthogonal Cartesian coordinates. In some embodiments, the semiconductor device SD10 includes a semiconductor substrate 100 and an interconnection structure 105 formed on the semiconductor substrate 100. In some embodiments, the semiconductor substrate 100 includes one or more semiconductor materials, which may be elemental semiconductor materials, compound semiconductor materials, or semiconductor alloys. For instance, the elemental semiconductor material may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 100 may be a semiconductor-on-insulator, including at least one layer of dielectric material (e.g., a buried oxide layer) disposed between a pair of semiconductor layers. FIG. 1 and FIG. 2 further illustrate functional circuits that may be formed over the semiconductor substrate 100. For example, a transistor 110 and a transistor 120 are illustrated on the semiconductor substrate 100. The transistor 110 may include a pair of source and drain regions 112, 114 embedded in the semiconductor substrate 100, separated from each other by a portion of semiconductor substrate 100 which functions as a channel region of the transistor 110. A gate structure 116 is disposed on the channel region in between the source and drain regions 112, 114. In some embodiments, the source and drain regions 112, 114 may be doped, for example with n-type materials or p-type materials.

In some embodiments, the transistor 120 may also include a pair of source and drain regions 122, 124, which may be optionally doped with n-type materials or p-type materials. In some embodiments, the source and drain regions 122, 124 are doped with materials of opposite conductivity type with respect to the source and drain regions 112, 114. In some embodiments, the source and drain regions 122, 124 may be embedded in a region 126 of different composition. For example, the region 126 may be doped with a material of opposite conductivity type with respect to the source and drain regions 122, 124, or the region 126 may include a same dopant as the source and drain regions 122, 124, but in different concentration. For example, the source and drain regions 122, 124 may be doped with a p-type material, and the region 126 may be doped with an n-type material. In some embodiments, a gate structure 128 is disposed on the region 126 in between the source and drain regions 122, 124.

It should be noted that the disclosure does not limit the architecture of the transistors 110, 120. For example, the transistors 110, 120 may be planar field effect transistors, fin field effect transistors, gate all around transistors, or any other transistor architecture. Furthermore, different gate contact schemes, such as front-gate, back-gate, double-gate, staggered, etc., are contemplated within the scope of the disclosure. Although in FIGS. 1 and 2 are illustrated transistors 110, 120 formed over the semiconductor substrate 100, other active devices (e.g., diodes or the like) and/or passive devices (e.g., capacitors, resistors, or the like) may also be formed as part of the functional circuit.

The interconnection structure 105 may be formed over the semiconductor substrate 100 to integrate the circuit devices formed on the semiconductor substrate 100 in one or more functional circuits. For example, the interconnection structure 105 may include an interlayer dielectric 130 in which are embedded metallization layers (e.g., 140, 150, etc.) that interconnect the circuit devices with each other. It should be noted that the interlayer dielectric 130 is shown as a single layer for simplicity, but, in practice, it may be constituted by multiple interlayer dielectric layers stacked on each other and possibly containing different materials. Additional layers (not shown) such as barrier layers, etch stop layers, etc., may also be formed in between the interlayer dielectric layers. The interlayer dielectric 130 may be formed on the semiconductor substrate 100, extending on the transistors 110, 120 and on other circuit devices which may be formed on the semiconductor substrate 100. Each metallization layer (e.g., the bottommost metallization layer 140) may include conductive patterns 142 and interconnect vias 144 extending through the interlayer dielectric 130 to electrically couple to the circuit devices formed on the semiconductor substrate 100, for example to couple to the source/drain regions 112, 114, 122, 124 and to the gate structures 116, 128 of the transistors 110, 120. In some embodiments, one or more additional metallization layers 150 (schematically represented as dots in FIG. 1 and FIG. 2) are formed over the semiconductor substrate 100. In some embodiments, the functional circuits formed by the interconnection structure 105 may comprise logic circuits, memory circuits, sense amplifiers, controllers, input/output circuits, image sensor circuits, the like, or combinations thereof. The disclosure does not limit the number of additional metallization layers 150 formed in an interconnection structure 105, which may be adapted according to routing and design requirements.

In some embodiments, the interlayer dielectric 130 of the interconnection structure 105 may include low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. In some embodiments, the individual interlayer dielectric layers of the interlayer dielectric 130 may be fabricated to a suitable thickness by flowable CVD (FCVD), CVD, HDPCVD, SACVD, spin-on, sputtering, or other suitable methods. In some embodiments, the metallization layers (e.g., 140, 150) may include cobalt (Co), tungsten (W), copper (Cu), titanium (Ti), tantalum (Ta), aluminum (Al), zirconium (Zr), hafnium (Hf), a combination thereof, or other suitable metallic materials, and may be fabricated through a sequence of deposition (e.g., CVD, PVD, ALD, plating, or other suitable processes) and planarization steps (e.g., chemical mechanical polishing). In some embodiments, the interconnection structure 105 may be formed via damascene, dual damascene, or other suitable processes.

In some embodiments, in one of the metallization layers of the interconnection structure 105 are formed conductive lines 160 extending parallel to each other along a direction (e.g., the X direction) and spaced from each other along another direction perpendicular to the extending direction (e.g., the Y direction). A transistor array 170 may be formed on the conductive lines 160, and the conductive lines 160 may be used to drive the transistor array 170, for example being configured as bit lines. Additional metallization layers (e.g., 182, 184) may be formed over the transistor array 170, to further integrate the transistor array 170 with the remaining circuitry of the semiconductor device SD10, and to bring signals generated or processed by the semiconductor device SD10 towards an I/O interface. For example, the conductive patterns 184 may be formed as the topmost metallization level, at the top of the interlayer dielectric 130 (e.g., the side of the interlayer dielectric 130 further away from the semiconductor substrate 100). Contact pads 186 may be formed to land on the conductive patterns 184, and to act as I/O interfaces to integrate the semiconductor device SD10 into larger devices. A passivation layer 190 may be disposed on the interconnection structure 105. The passivation layer 190 may include a dielectric material, and may protect the underlying components of the semiconductor device SD10.

Figure 3:
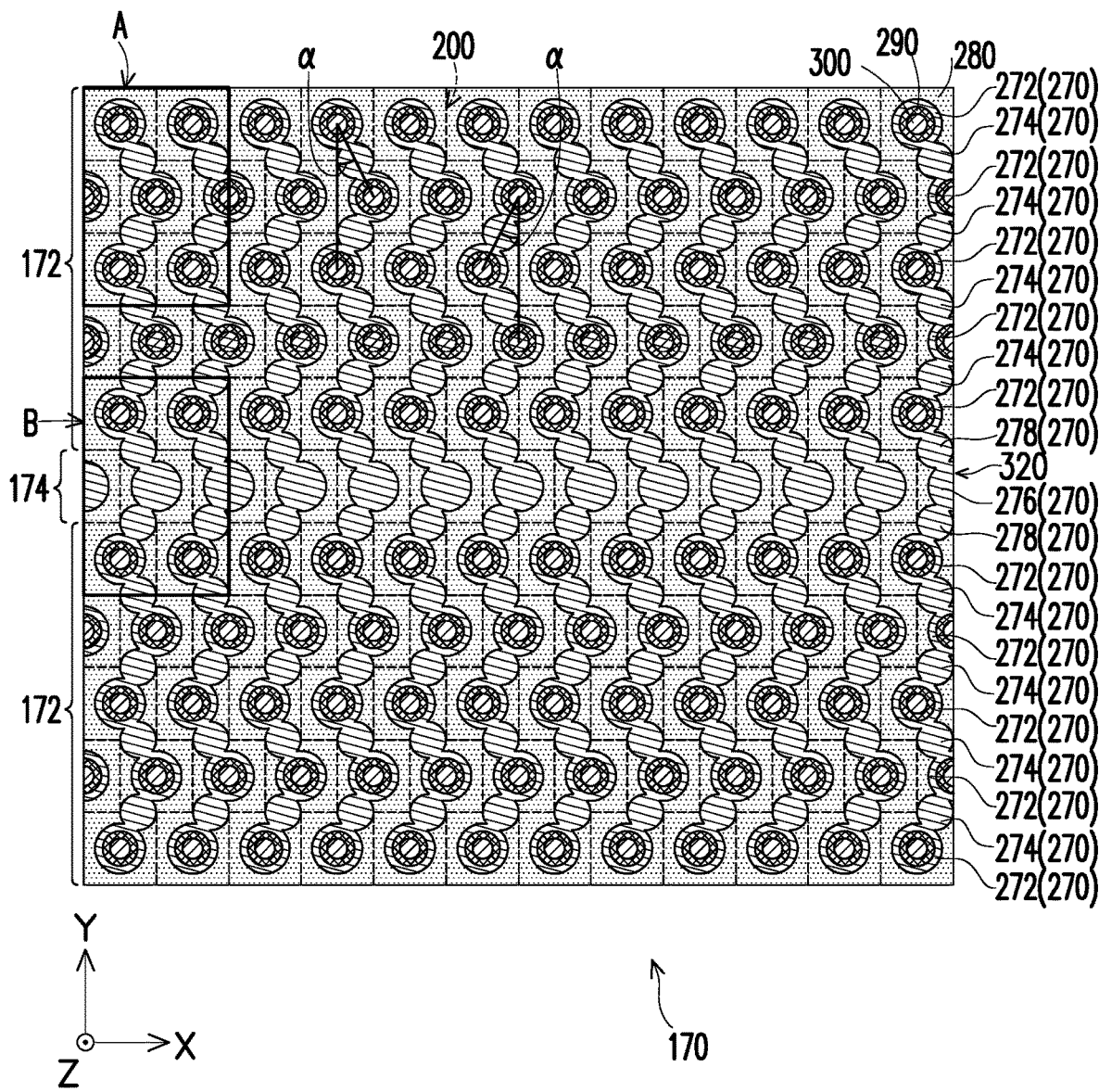
FIG. 3 is a schematic top view of a region of a semiconductor device according to some embodiments of the disclosure.
Figure 4A:
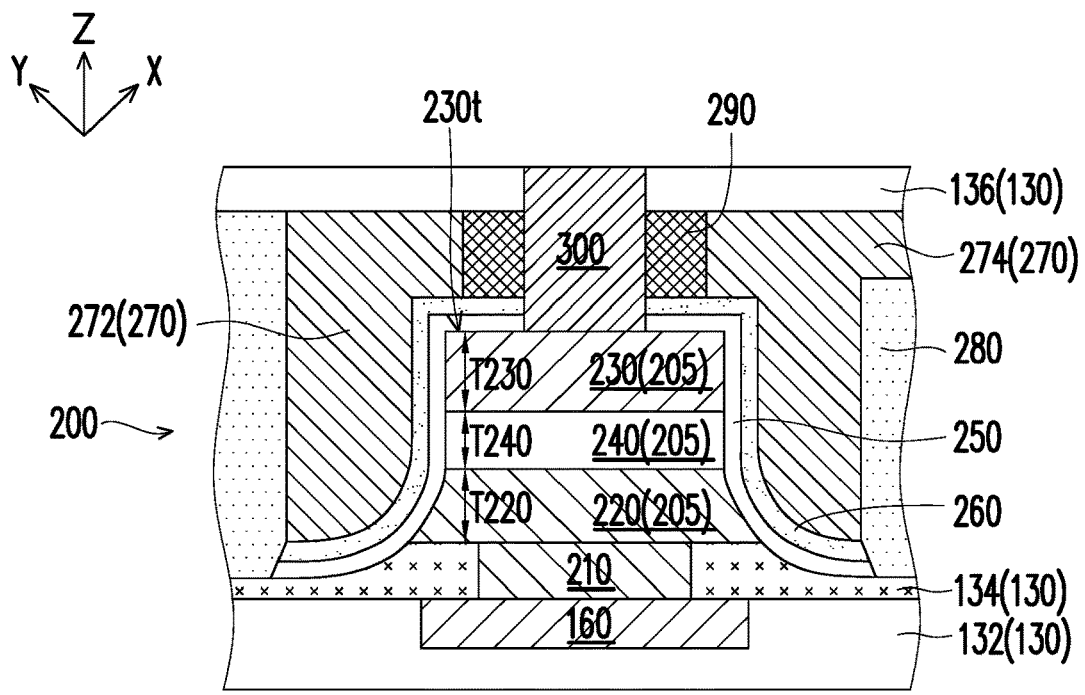
FIG. 4A is a schematic cross-sectional view of a region of a semiconductor device according to some embodiments of the disclosure.

FIG. 3 is a schematic top view of the transistor array 170 according to some embodiments of the disclosure. As will become apparent from the rest of the description, for discussion purposes, in FIG. 3 are illustrated elements which would be visible in cross-sectional views taken in XY planes located at different level heights along the Z direction. FIG. 4A is a schematic cross-sectional view of a transistor 200 of the transistor array 170 according to some embodiments of the disclosure. Referring to FIG. 1, FIG. 2, FIG. 3 and FIG. 4A, in some embodiments, the transistor array 170 includes a plurality of transistors 200 connected at one terminal to the conductive lines 160. For example, the conductive lines 160 may be embedded in an interlayer dielectric layer 132 of the interlayer dielectric 130, extending parallel to each other along the X direction. Another interlayer dielectric layer 134 may be formed on the interlayer dielectric layer 132. Contact vias 210 may extend across the interlayer dielectric layer 134 to connect the conductive lines 160 to corresponding drain contacts 220 of the transistors 200. In some embodiments, the transistors 200 further include source contacts 230 stacked over the drain contacts 220 and separated from the drain contacts 220 by a spacer 240. The drain contact 220, the spacer 240, and the source contact 230 may be sequentially stacked, in this order, on the interlayer dielectric layer 134 and the via contact 210, to form a pillar stack 205. The pillar stacks 205 may be formed in rows extending along the same direction as the conductive lines 160 (e.g., the X direction). Pillar stacks 205 formed in the same row (e.g., at the same level height along the Y direction) may be connected to the same conductive line 160, while pillar stacks 205 formed on different rows (e.g., at different level heights along the Y direction) may be connected to different conductive lines 160. A semiconductor channel layer 250 may be conformally formed over the pillar stack 205, extending from the interlayer dielectric 134 to the top surface of the source contact 230. A gate dielectric layer 260 is conformally disposed over the semiconductor channel layer 250, separating the semiconductor channel layer 250 from the gate pattern 270. Individual transistors 200 may be isolated from each other by isolation structures 280, which may extend through the gate dielectric layer 260 and the semiconductor channel layer 250 to reach the underlying interlayer dielectric layer 134. In some embodiments, the isolation structures 280 may partially extend within the interlayer dielectric layer 134. In some embodiments, at least a portion of the interlayer dielectric layer 134 still extends between the isolation structures 280 and the underlying conductive lines 160. In some embodiments, a dielectric cap 290 is formed on sections of the gate dielectric layer 260 extending on the top surface 230t of the source contact 230. A contact via 300 extends through the dielectric cap 290 to establish electrical connection to the source contact 230. The dielectric cap 290 separates the contact via 300 from the gate pattern 270. An interlayer dielectric layer 136 may be formed on the gate patterns 270, the isolation structures 280 and the dielectric caps 290, to cover the transistor array 170. The contact via 300 may extend through both of the dielectric cap 290 and the interlayer dielectric layer 136 to integrate the associated transistor 200 within the remaining circuitry.

The spacer 240, the isolation structures 280, and the dielectric caps 290 may include a dielectric material, such as an oxide (e.g., silicon oxide), a nitride (e.g., silicon nitride), a carbide (e.g., silicon carbide), an oxynitride (e.g., silicon oxynitride), or the like. In some embodiments, the isolation structures 280 and the dielectric caps 290 may include a same material. For example, the isolation structures 280 and the dielectric caps 290 may be formed of the same dielectric material.

In some embodiments, the conductive material of the source and drain contacts 220, 230 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be formed by chemical vapor deposition (CVD), physical vapor deposition (PVD), atomic layer deposition (ALD), other deposition techniques, or a combination thereof. In some embodiments, the conductive material may be provided on one or more seed layers, barrier layers, etc. (not shown). That is, the source and drain contacts 220, 230 may include one or more seed layers, barrier layers, etc.

The semiconductor channel layer 250 may include suitable semiconducting materials, such as semiconductor oxides or the like. The semiconductor oxide materials may be metal oxide materials including one or more of In, Zn, G, Sn, Pb, Zr, Sr, Ru, Mn, Mg, Nb, Ta, Hf, Al, La, Sc, Ti, V, Cr, Mo, W, Fe, Co, Ni, Pd, Ir, Ag, or combination thereof. Some elements may be present as dopant of other metal oxides. In some embodiments, the semiconductor oxide material may be ternary or higher (e.g., quaternary and so on) semiconductor oxides, such as indium gallium zinc oxide (IGZO), indium zinc oxide (IZO), or indium tin oxide (ITO).

The gate dielectric layer 260 may include dielectric oxides or nitrides (such as silicon oxide, silicon nitride, silicon oxynitride) and high-k materials, such as hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), zirconium silicate, zirconium aluminate, zirconium oxide, titanium oxide, aluminum oxide ($Al_2O_3$), a hafnium dioxide-alumina ($HfO_2$—$Al_2O_3$) alloy, $Gd_2O_3$, $BaTiO_3$, $LaO_2$, $Ta_2O_5$, $Y_2O_3$, BaZrO, HfLaO, or combinations thereof.

The gate pattern 270 may include suitable metallic materials, such as metals or alloys thereof (e.g., cobalt (Co), tungsten (W), copper (Cu), titanium (Ti), tantalum (Ta), aluminum (Al), zirconium (Zr), hafnium (Hf), their alloys, a combination thereof, etc.); metallic compounds such as conductive nitrides (e.g., titanium nitride, tantalum nitride, etc.), metal silicides (e.g., silicides of palladium, platinum, tungsten, titanium, tantalum, cobalt, nickel, etc.); polysilicon or doped silicon; or combination thereof.

In some embodiments, an extending direction of the gate patterns 270 may be angled (e.g., intersecting) with respect to an extending direction of the conductive lines 160. In some embodiments, an individual gate pattern 270 contacts a plurality of transistors 200 disposed at different level heights along a distribution direction of the conductive lines 160 (e.g., the Y directions), each transistor 200 contacted by a same gate pattern 270 being connected to a different conductive line 160. While the gate patterns 270 may be considered as extending towards a direction (e.g., the Y direction) substantially perpendicular to the extending direction of the conductive lines 160 (e.g., the X direction), the gate patterns 270 do not necessarily extend straightly along said direction (e.g., the Y direction). That is, the gate patterns 270 may have a repeatedly bending shape, with multiple bends following one another. For example, a pair of transistors 200 which are consecutively contacted by a same gate pattern 270, may be staggered along the X direction (the extending direction of the conductive lines 160), so that an imaginary line joining the transistors 200 of the pair (e.g., an alignment direction) defines a staggering angle $\alpha$ with respect to the direction perpendicular to the extending direction of the conductive lines 160 (e.g., the Y direction, perpendicular to the X direction). The absolute value of the magnitude of the staggering angle $\alpha$ is not particularly limited, and may be up to about 45 degrees, for example in a range from 0 to 45 degrees, such as about 30 degrees. The staggering angle $\alpha$ may be taken as the smallest angle between the direction perpendicular to the extending direction of the conductive lines 160 (e.g., the Y direction) and an alignment direction of a pair of transistors 200 consecutively contacted by the gate pattern 270. In some embodiments, the transistors 200 are located in correspondence of intersection points of the gate patterns 270 and the conductive lines 160. For example, each transistor 200 may be located at a dedicated intersection point, and may be individually addressed by selecting (e.g., applying suitable voltages to) the corresponding combination of gate pattern 270 (for example, configured as word lines) and conductive line 160 (for example, configured as bit lines). For example, when a suitable potential difference is applied between the drain contact 220 and the gate pattern 270 of a given transistor 200, electric current may flow through the semiconductor channel layer 250 of the transistor 200, from the source contact 230 to the drain contact 220.

In some embodiments, the gate pattern 270 includes gate sections 272 extending on the gate dielectric layer 260 to encircle the pillar stacks 205 including the stacked source contacts 230 and drain contacts 220. The gate pattern 270 further includes connecting sections 274 extending over the isolation structures 280 to connect consecutive gate sections 272 of a same gate pattern 270. That is, to each transistor 200 may be associated a gate section 272 of a gate pattern 270, and the gate sections 272 of a pair of transistors 200 contacted by the same gate pattern 270 may be connected to each other by a connecting section 274. In some embodiments, gate sections 272 and connecting sections 274 may be alternately disposed along the gate pattern 270, In some embodiments, the transistor array 170 may include a unit region (a cell region) 172 in which rows of transistors 200 contacting the same conductive line 160 are distributed so as to form (possibly staggered) columns of transistors 200 contacted by the same gate pattern 270. In order to apply a voltage (e.g., a word line signal) to the individual gate patterns 270, the gate patterns 270 are connected to the remaining circuitry of the semiconductor device SD10 in correspondence of a contact region 174 of the transistor array 170. In the contact region 174, gate contacts 320 are formed to connect the gate patterns 270 to the circuitry of the semiconductor device SD10.

Figure 4B:
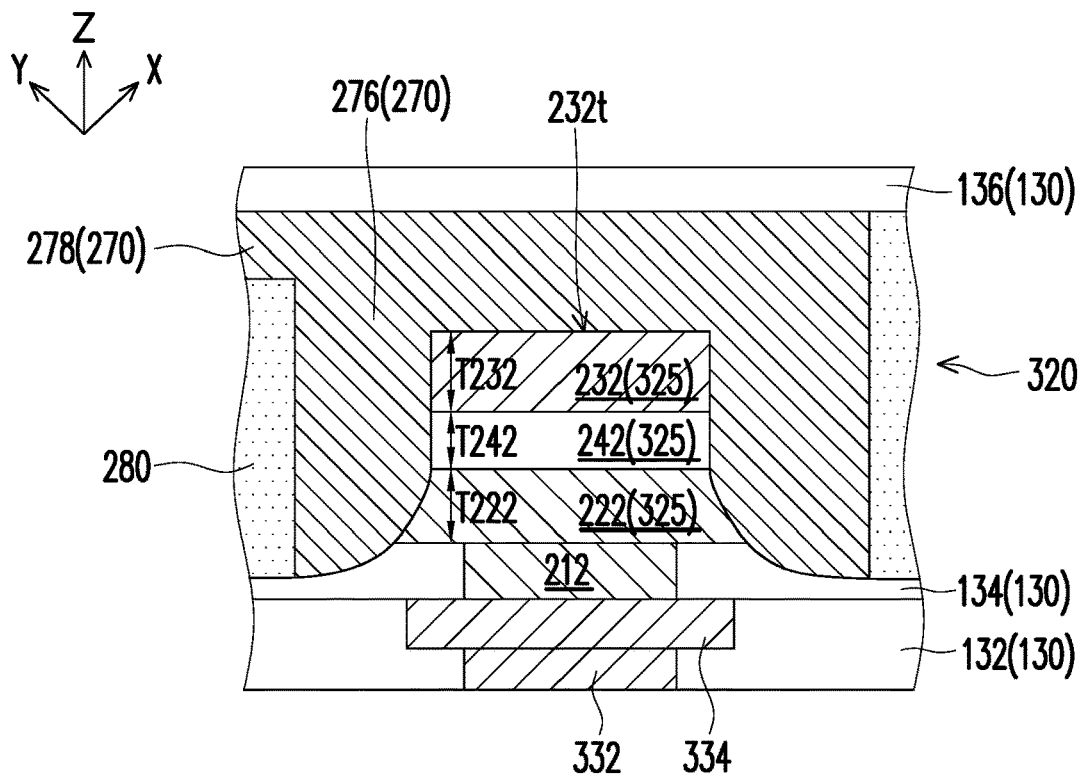
FIG. 4B is a schematic cross-sectional view of a region of a semiconductor device according to some embodiments of the disclosure.

FIG. 4B is a schematic cross-sectional view of a gate contact 320 of a gate pattern 270 of the transistor array 170 according to some embodiments of the disclosure. Referring to FIG. 1 to FIG. 4B, a gate contact 320 may be disposed on the interlayer dielectric layer 134, and may include a pillar stack 325 of a pair of metallic blocks 222, 232 separated by a dielectric spacer 242 and encircled by a contact section 276 of the gate pattern 270. The contact section 276 may encircle the pillar stacks 325, and may further extend on the top surface 232t of the upper metallic block 232. In some embodiments, the metallic blocks 222, 232 and the spacers 242 may be formed of the same materials and have substantially the same thicknesses T222, T232, T242 along the Z direction as the drain contacts 220, the source contact 230, and the spacers 240, respectively. For example, the thickness T222 of the lower metallic blocks 222 may be the same as the thickness T220 of the drain contacts 220, the thickness T232 of the upper metallic blocks 232 may be the same as the thickness T230 of the source contacts 230, and the thickness T242 of the spacers 242 may be the same as the thickness T240 of the spacers 240. For example, the lower metallic blocks 222 may have the same composition as the drain contacts 220, the upper metallic blocks 232 may have the same composition as the source contacts 230, and the spacers 242 may have the same composition as the spacers 240. In some embodiments, the contact section 276 of the gate pattern 270 directly contacts each one of the metallic blocks 222, 232 and the spacers 242, extending on the interlayer dielectric layer 134. Isolation structures 280 may encircle the contact sections 276 of the gate patterns 270, and separate the contact sections 276 from the gate sections 272 of the adjacent transistors 200. Additional connecting sections 278 of the gate pattern 270 may extend over the isolation structures 280 to connect the contact sections 276 to the adjacent gate sections 272. The interlayer dielectric 136 may extend over the contact sections 276 and the connecting sections 278. For example, the contact section 276 may be (completely) covered by the interlayer dielectric layer 136. In some embodiments, the lower metallic blocks 222 are connected by contact vias 212 extending through the interlayer dielectric layer 134 to conductive patterns 332, 334 extending through the interlayer dielectric layer 132, which conductive patterns 332, 334 may be used to apply voltage to the corresponding gate patterns 270. That is, each gate pattern 270 may be associated to corresponding conductive patterns 332, 334, which are thus used to control the voltage applied to the gate pattern 270. In some embodiments, the conductive patterns 334 are formed in the interlayer dielectric layer 132, at the same level height along the Z direction as the conductive lines 160.

As comparison of FIG. 4A and FIG. 4B readily reveals, the transistors 200 and the gate contacts 320 may have overall similar structures, and, as discussed further below, may be formed simultaneously during the manufacturing process of the transistor array 170. This, in turn, allows the gate contacts 320 to be formed within the transistor array 170 without the need of including a safety region which may be required if the gate patterns are connected to signal sources by simple conductive vias. That is, the gate contacts 320 may be formed in the transistor array 170 in place of a single row of transistors 200, without the need of additional space at the sides of the gate contacts 320. In some embodiments, a row of conductive patterns 334 is formed in place of one of the conductive lines 160, and a row of pillar stacks 325 is formed in place of a row of pillar stacks 200. For example, as illustrated in FIG. 3, the contact sections 276 and the connecting section 278 may have similar footprint and shape to the gate sections 272 and connecting sections 274, respectively. In some embodiments, the contact sections 276 and the connecting sections 278 may have same footprint and shape as the gate sections 272 and the connecting sections 274. In the cell regions 172, the gate sections 272 and the connecting sections 274 are alternately disposed, and at the boundaries between the cell regions 172 and the contact region 174, the gate sections 272 are connected to the contact sections 276 by the connecting sections 278. In some embodiments, it may be considered that, within the structure of a gate pattern 270, a contact section 276 takes the place of a gate section 272. As such, area penalty imposed by the need of a safety region around the gate contacts 320 may be reduced or even eliminated, thus increasing the available area density for the transistor array 170. For example, while the conductive lines 160 may be spaced from each other at a certain distance along the Y direction, a gap between consecutive conductive lines 160 in correspondence of the contact region 174 may be about twice the gap in the cell region 172, and the conductive patterns 334 may be formed in the contact region 174 within such larger gap.

In some embodiments, the contact region 174 with the gate contacts 320 may be formed in a central area of the transistor array 170, with a cell region 172 at each side of the contact region 174. For example, in the embodiment illustrated in FIG. 3, the transistor array 170 includes a pair of cell regions 172 disposed at opposite sides along the Y direction (the direction perpendicular to the extending direction of the conductive lines 160) of the contact region 174. In some embodiments, the cell regions 172 at opposite sides of the contact region 174 includes about the same number of conductive lines 160 and rows of transistors 200. In some embodiments, by having the contact region 174 located at a center of the transistor array 170, the contact resistance between the gate patterns 270 and the transistors 200 may be overall minimized (even for the transistors 200 located at the periphery of the transistor array 170) compared with a case in which the transistor array 170 includes a single cell region 172 with the contact region 174 formed beside (outside of, at one side) of the single cell region 172. In some embodiments, the gate contacts 320 may allow to minimize contact resistance without incurring in area penalty because of the need of safety regions around the gate contacts 320.

It should be noted that while the above description presented the semiconductor device SD10 as including one transistor array 170 within the interconnection structure 105, the disclosure is not limited thereto. For example, in some embodiments, multiple transistor arrays 170 may be stacked on each other. Furthermore, while the conductive lines 160 were shown to contact the transistors 200 from the side of the semiconductor substrate 100, so that the drain contacts 220 are the lower metal block of the transistor stacks, the disclosure is not limited thereto. In some embodiments, the conductive lines 160 may contact the transistors 200 from the top (e.g., via the contact vias 300), so that the upper metal blocks (corresponding to the source contacts 230 in FIG. 3A) may act as drain contacts.

Figure 5A:
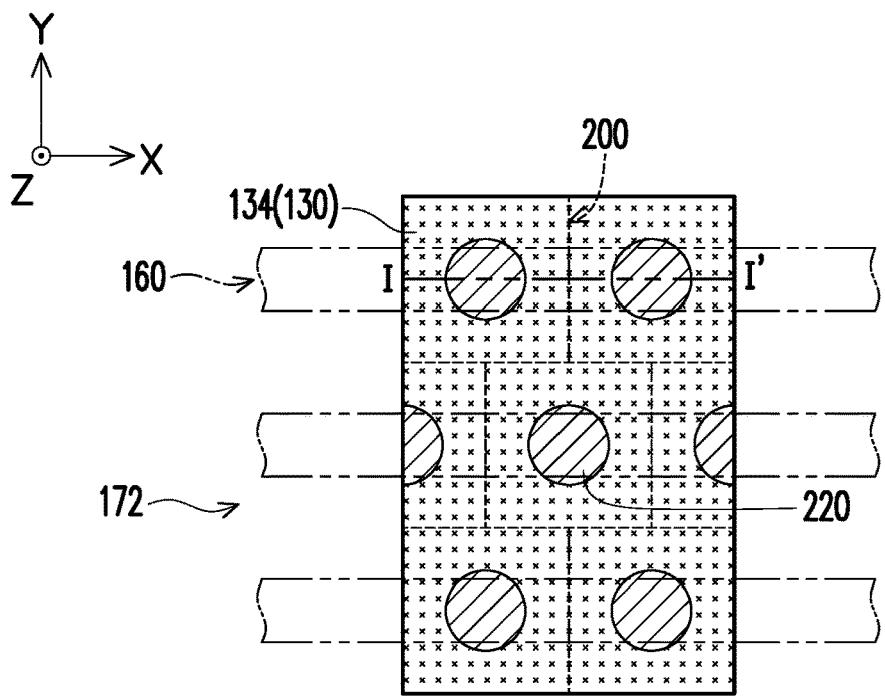
Figure 5B:
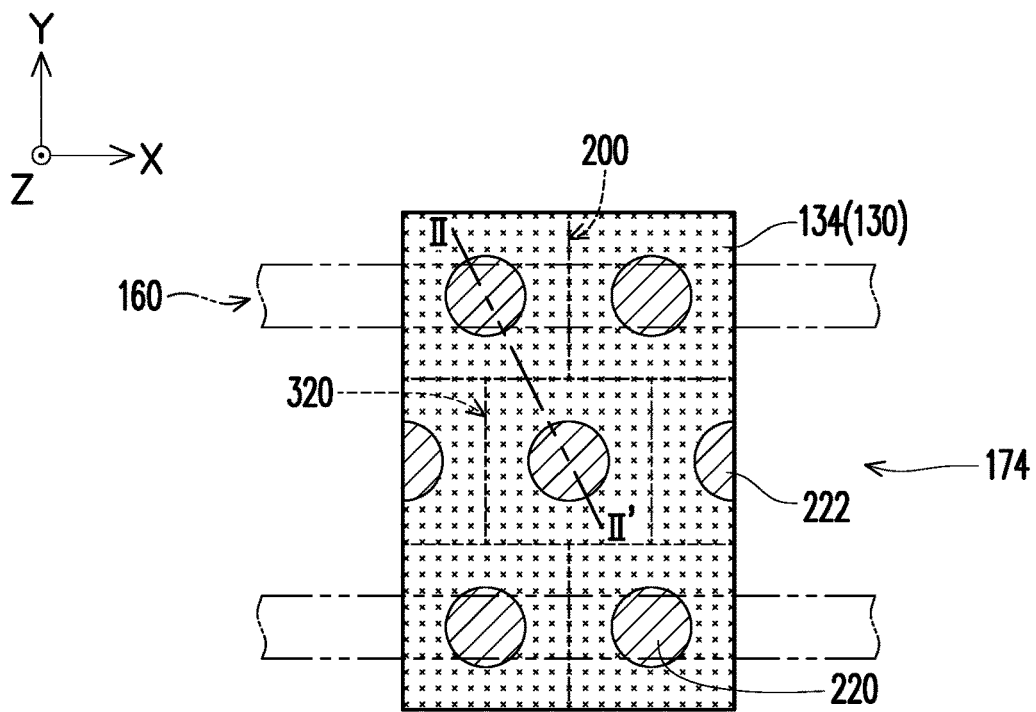
Figure 5C:
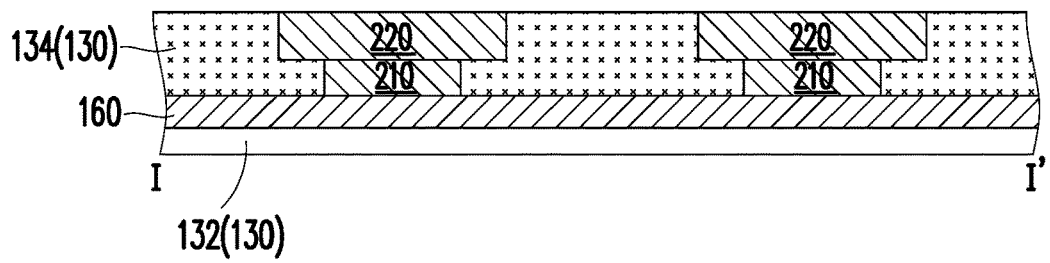
Figure 5D:
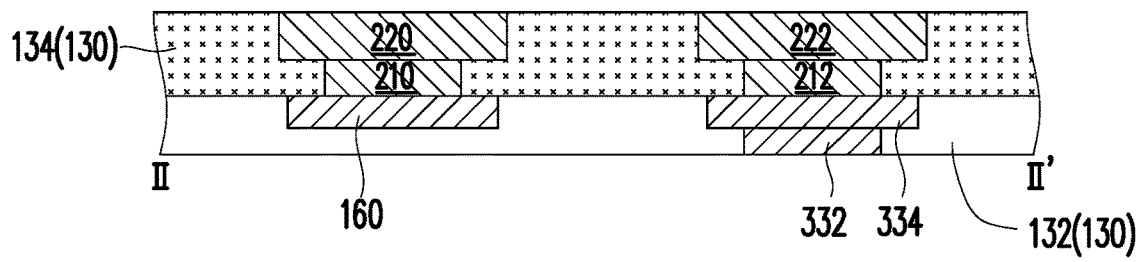
Figure 6A:
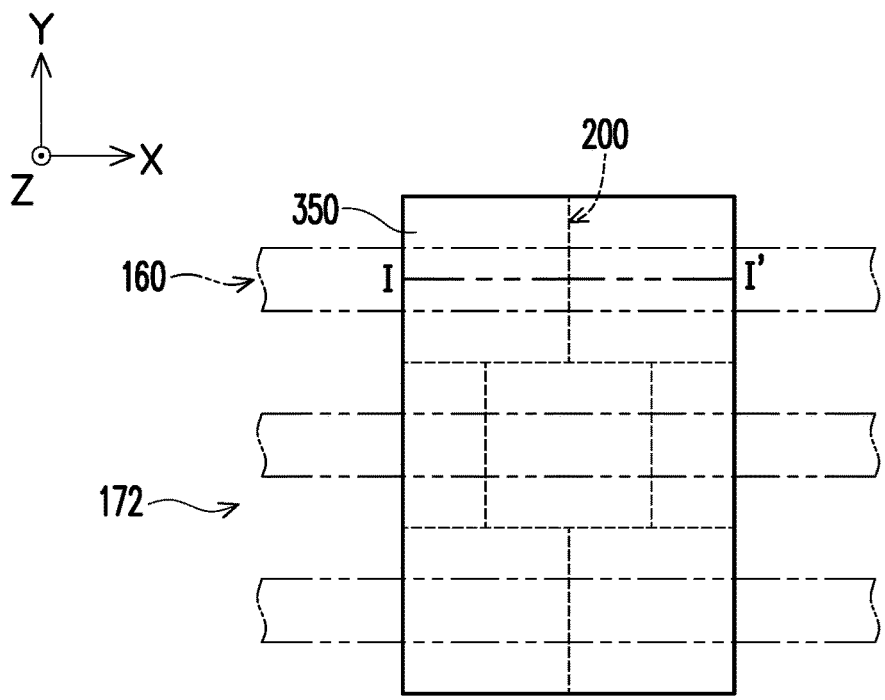
Figure 6B:
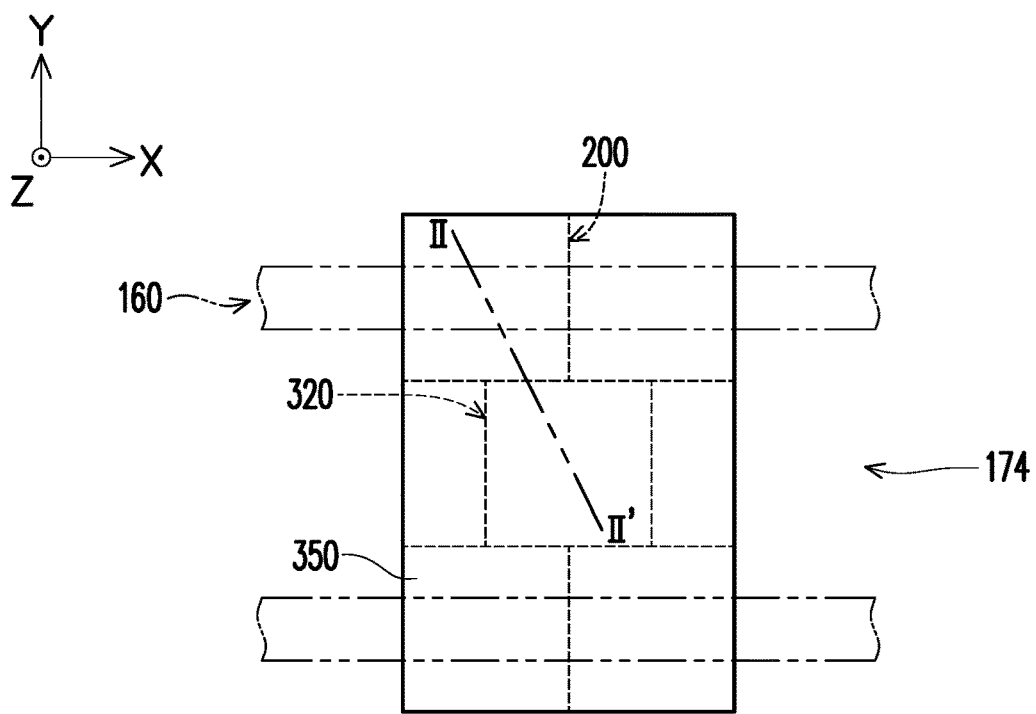
Figure 6C:
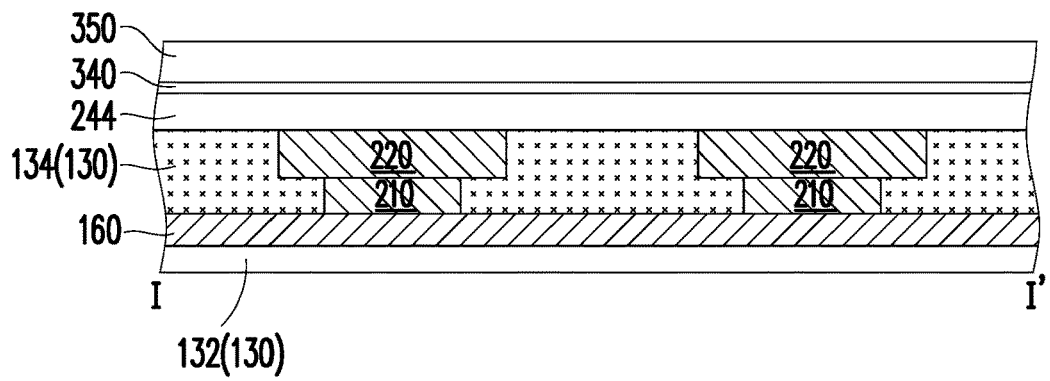
Figure 6D:
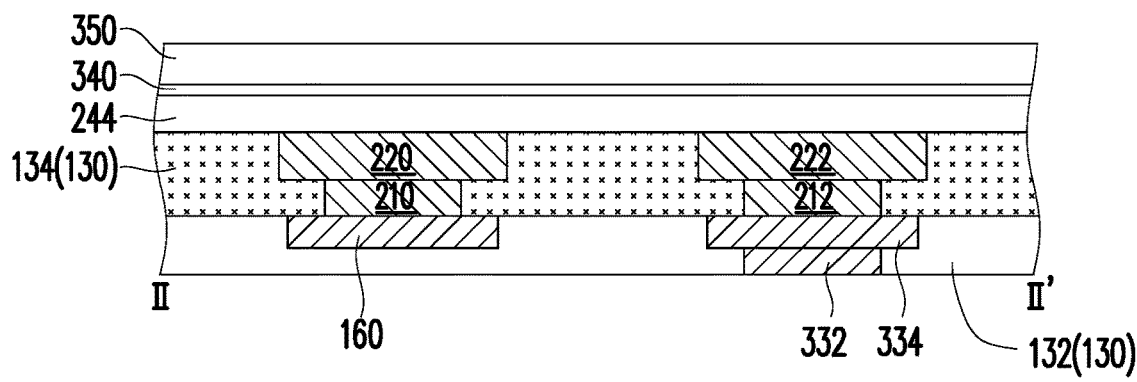
Figure 7A:
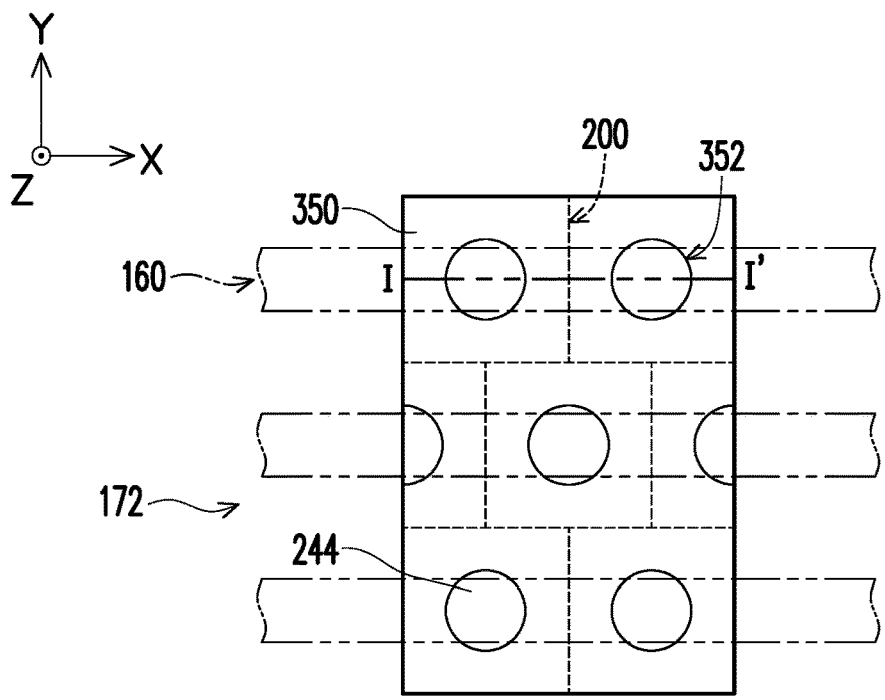
Figure 7B:
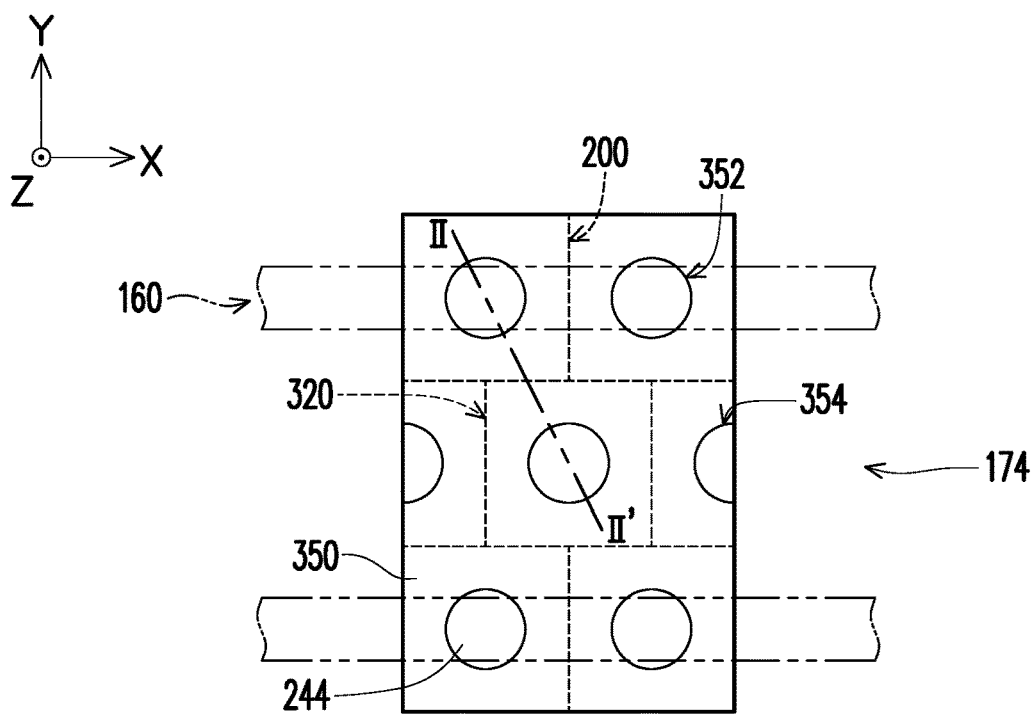
Figure 7C:
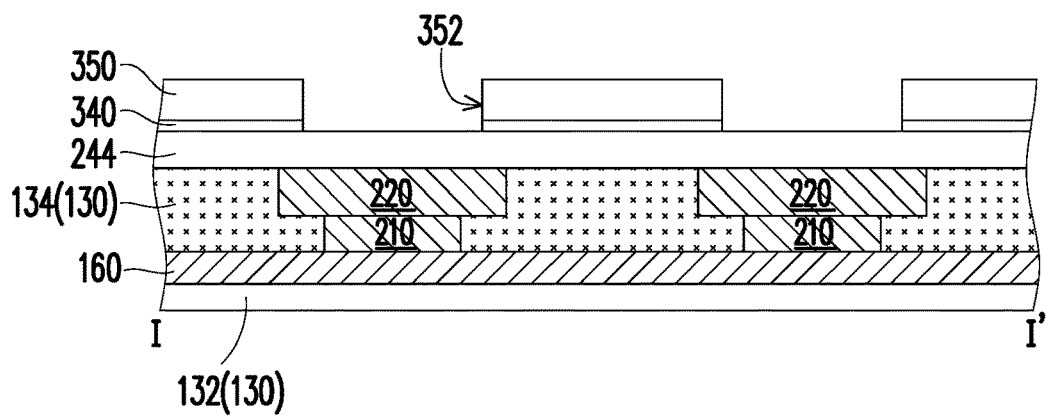
Figure 7D:
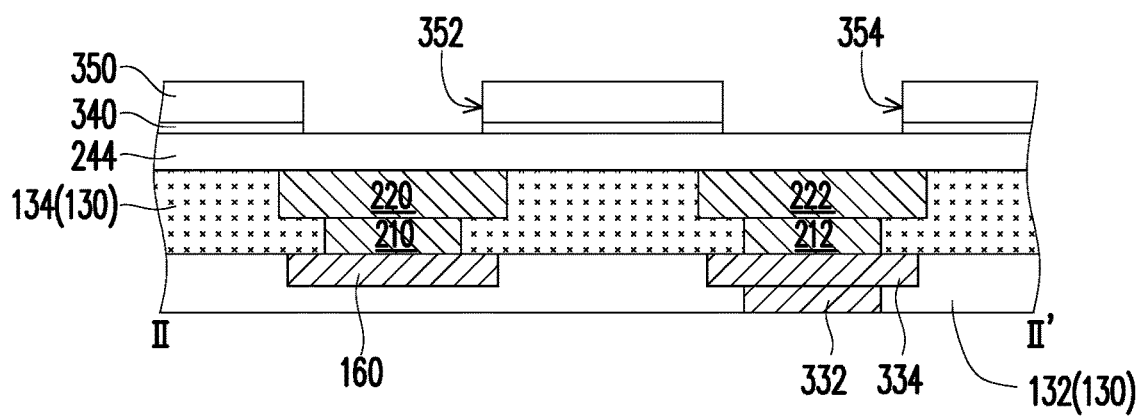
Figure 8A:
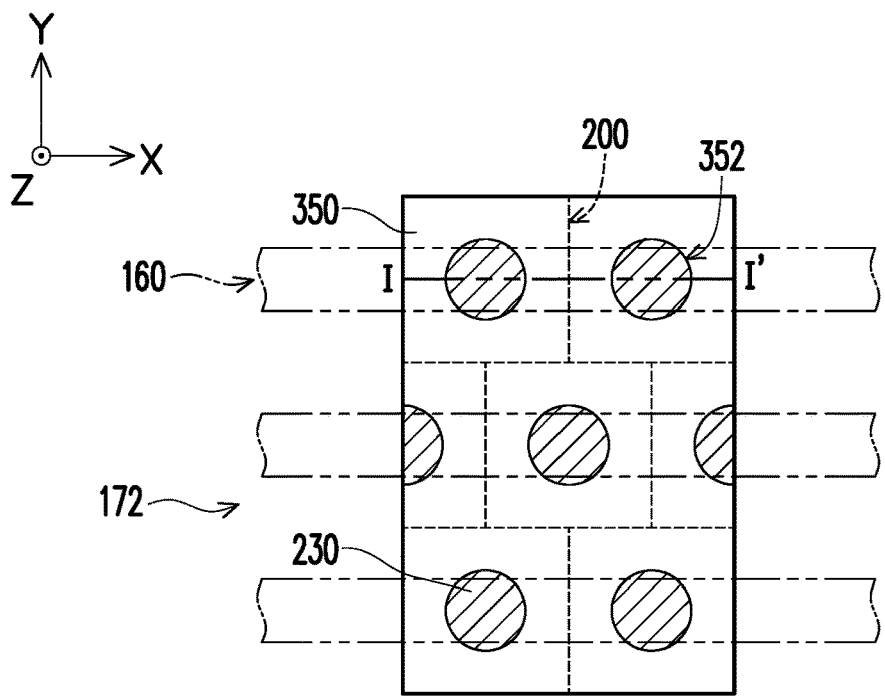
Figure 8B:
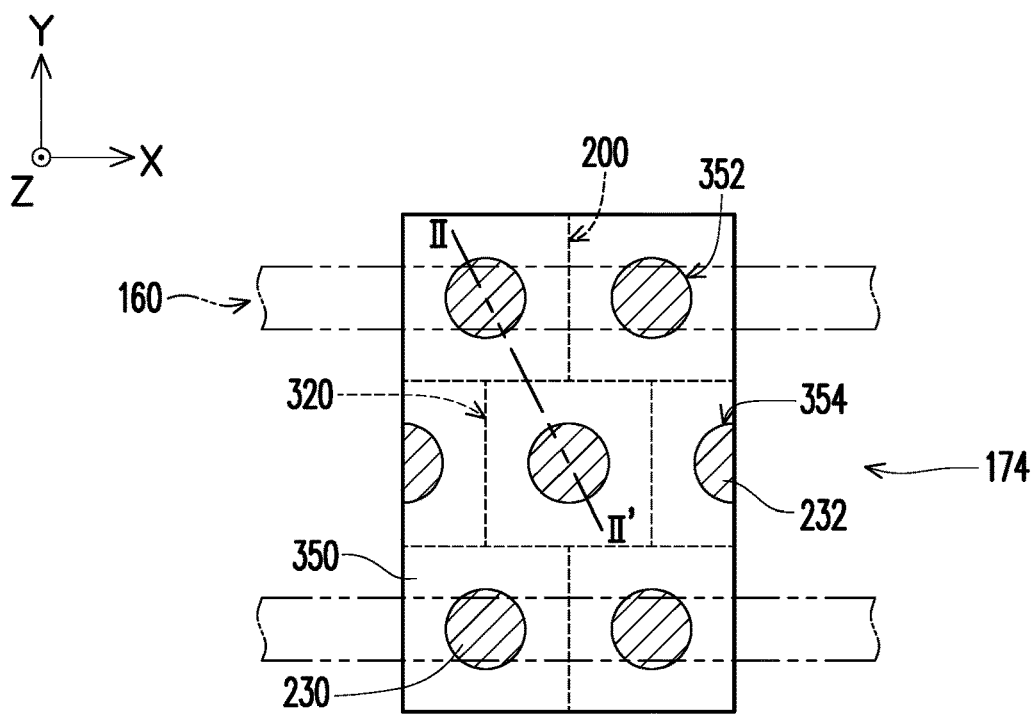
Figure 8C:
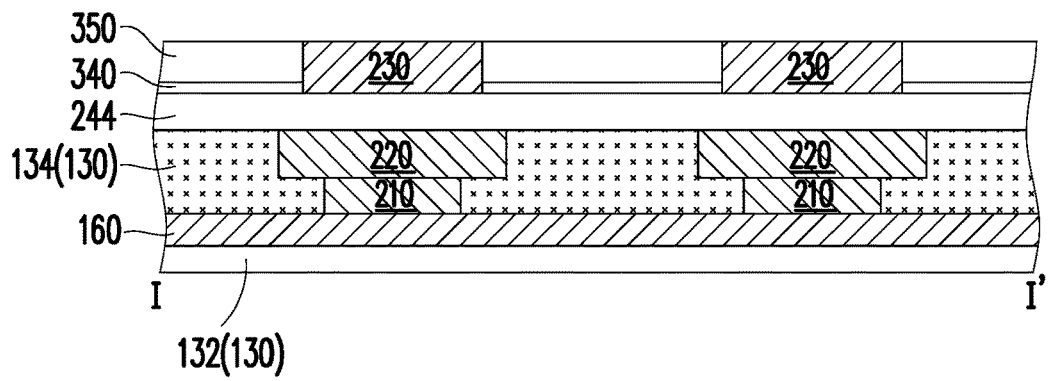
Figure 8D:
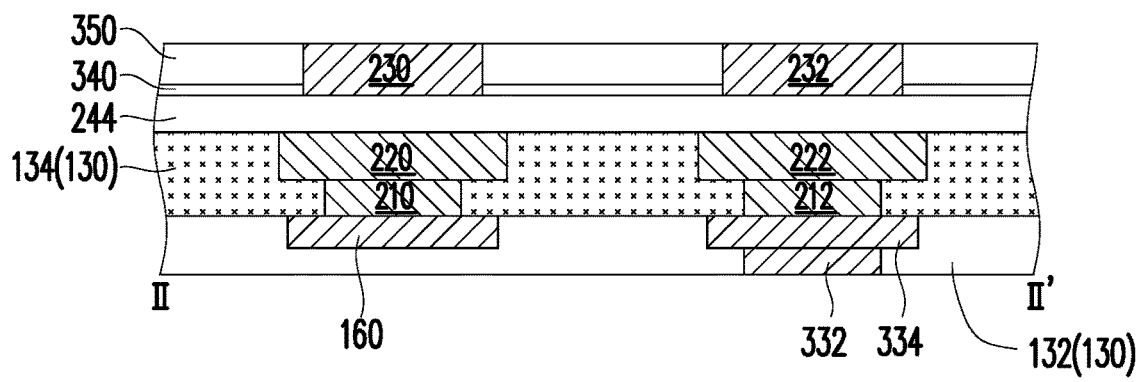
Figure 9A:
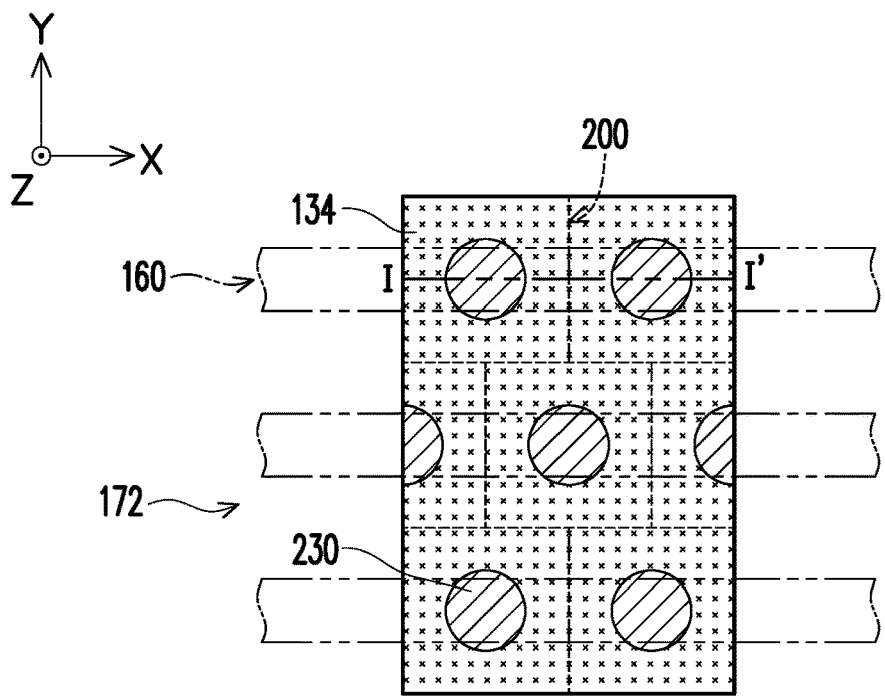
Figure 9B:
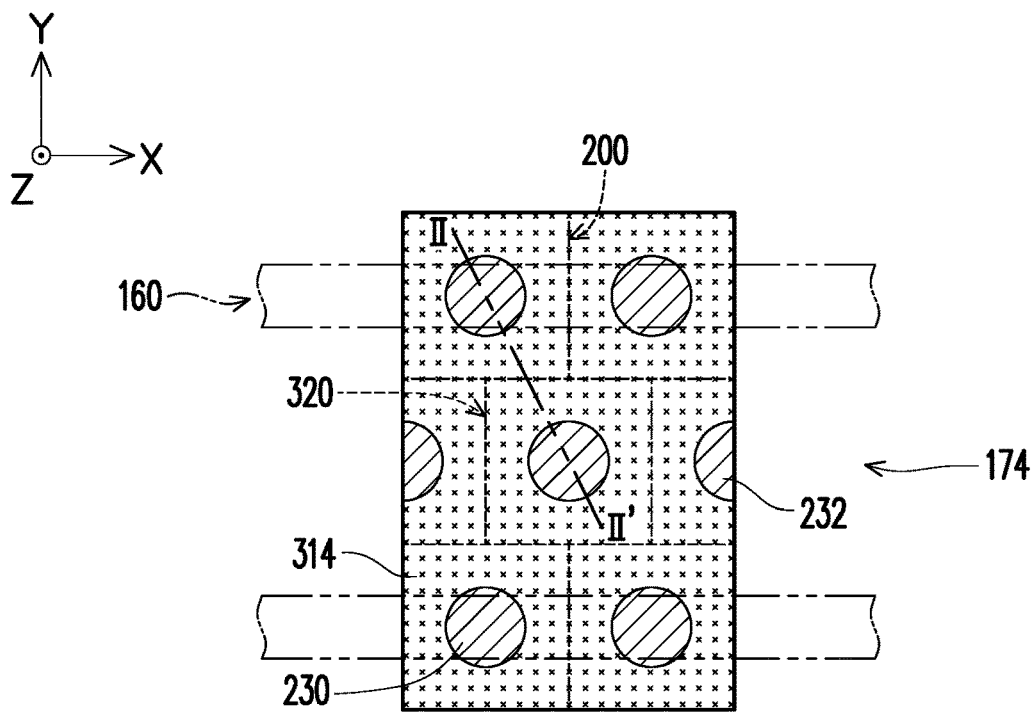
Figure 9C:
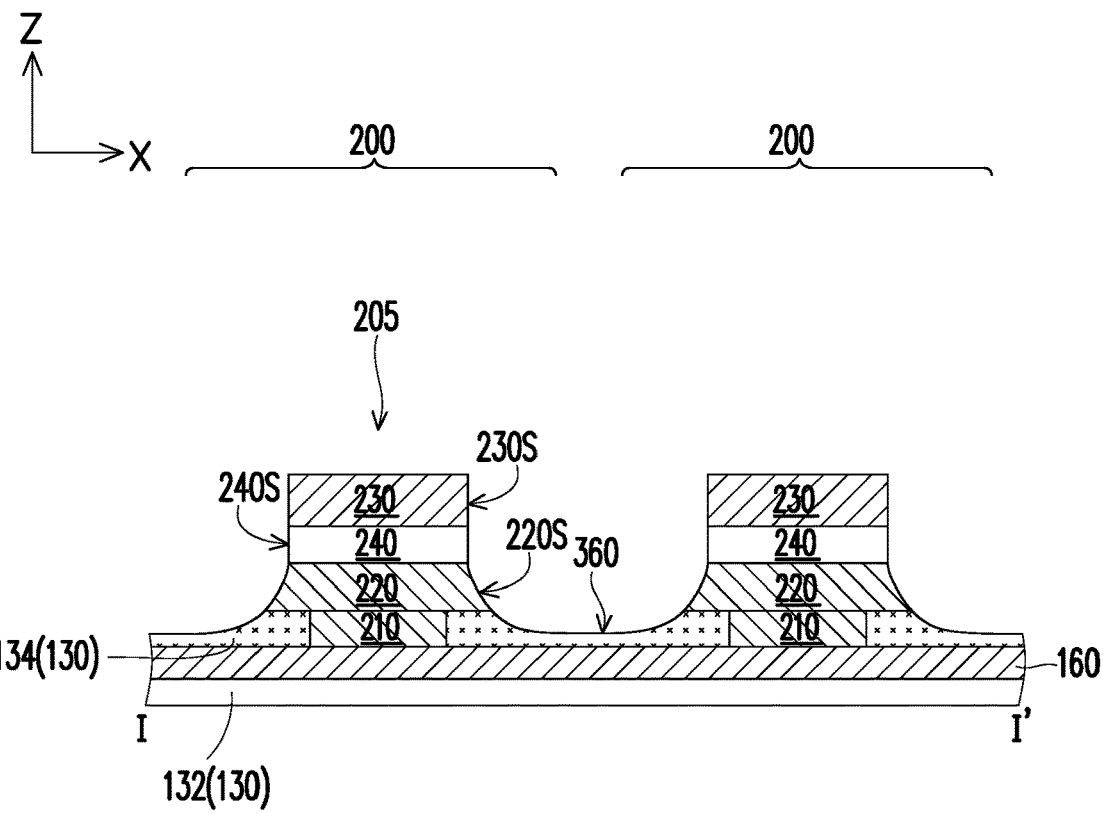
Figure 9D:
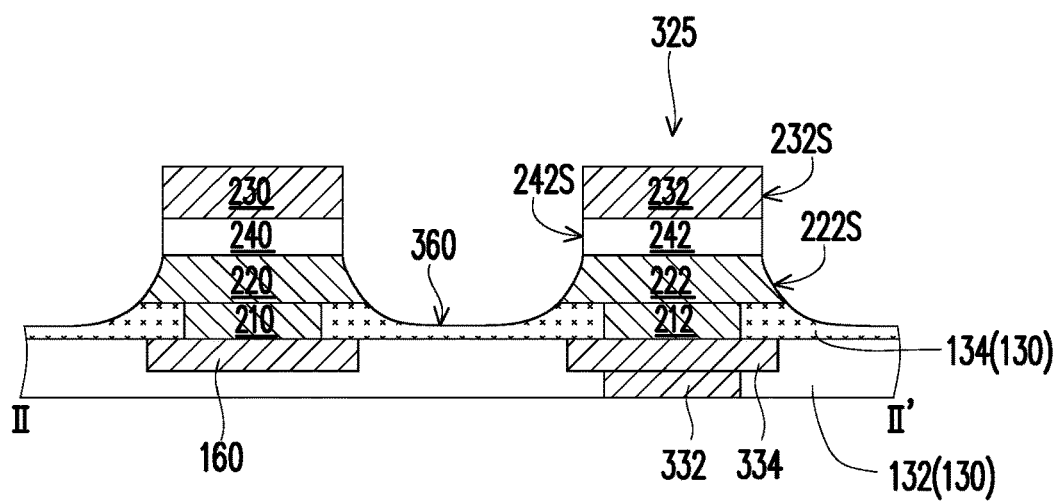
Figure 10A:
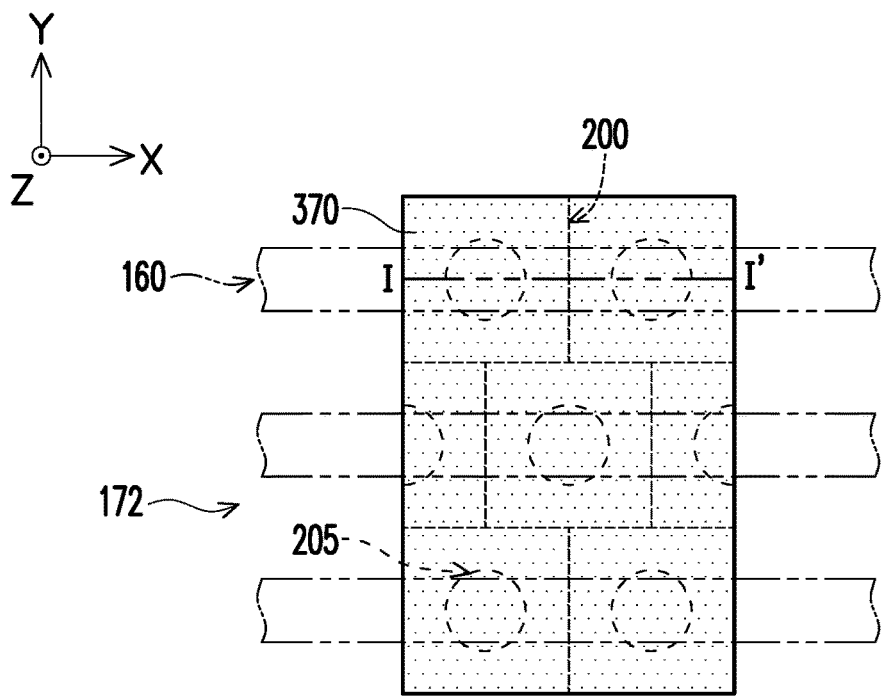
Figure 10B:
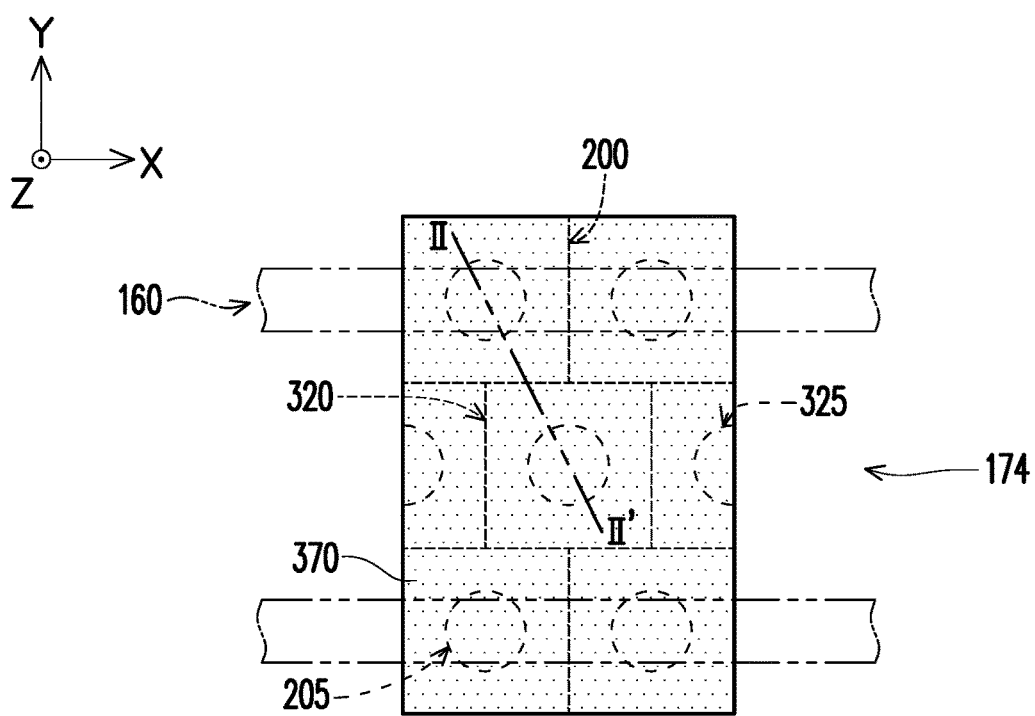
Figure 10C:
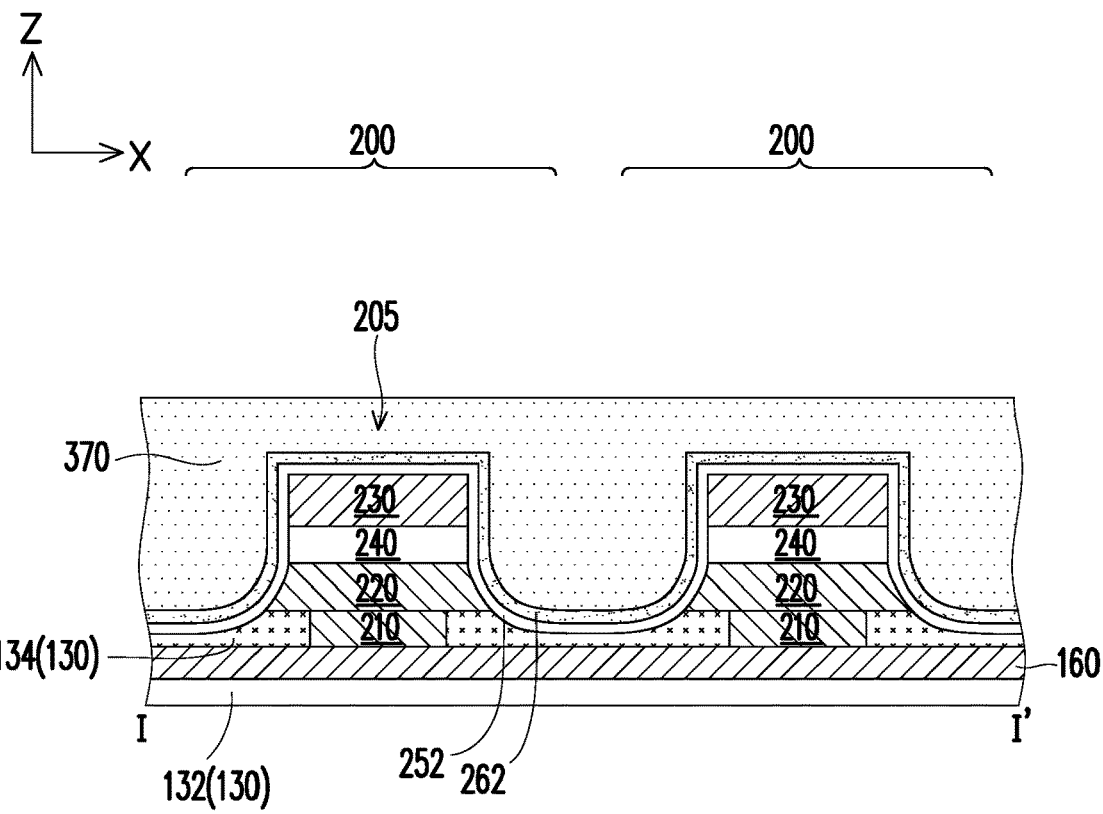
Figure 10D:
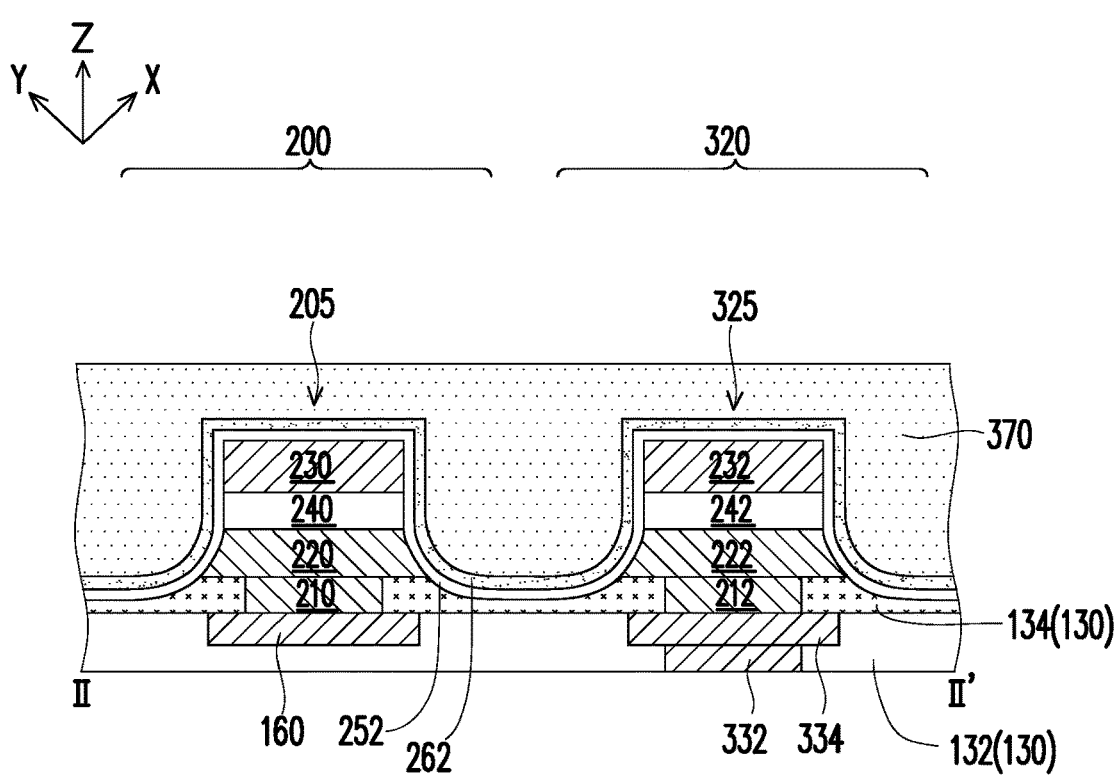
Figure 11A:
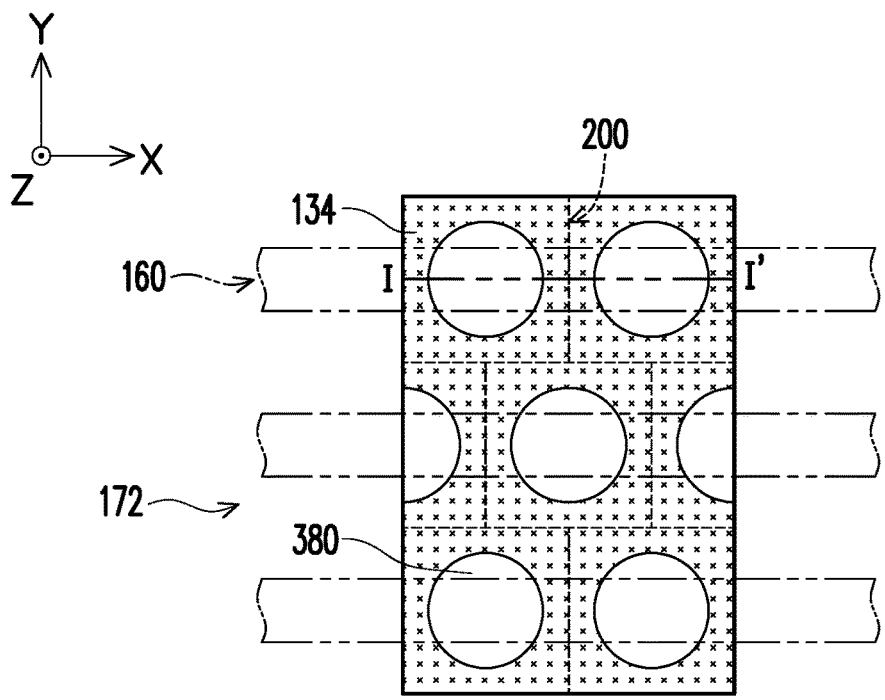
Figure 11B:
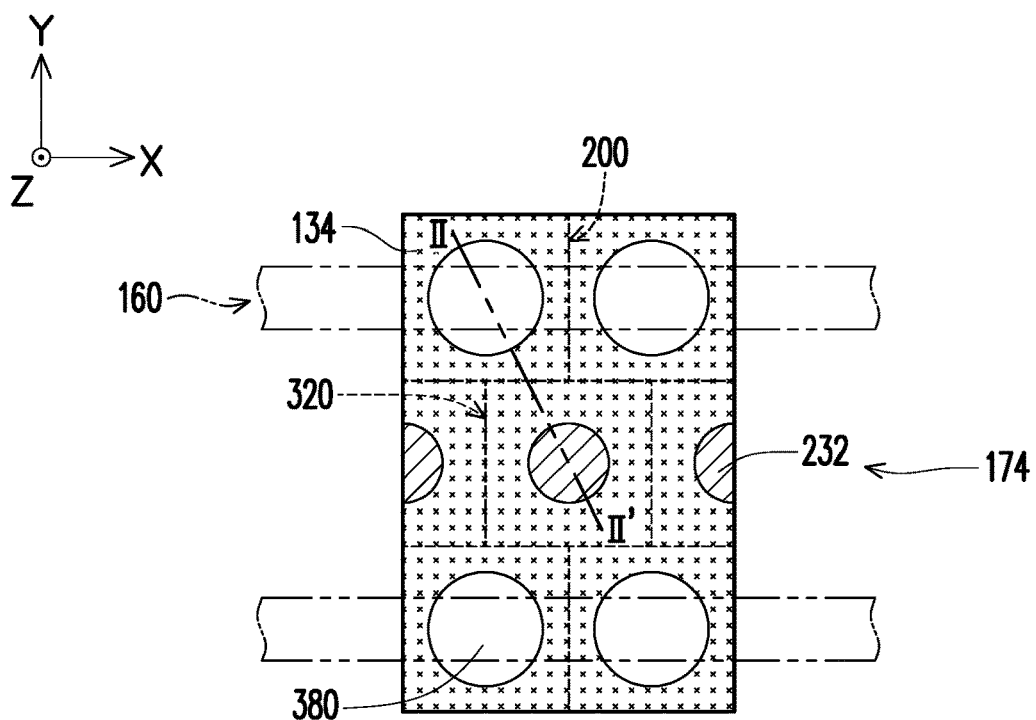
Figure 11C:
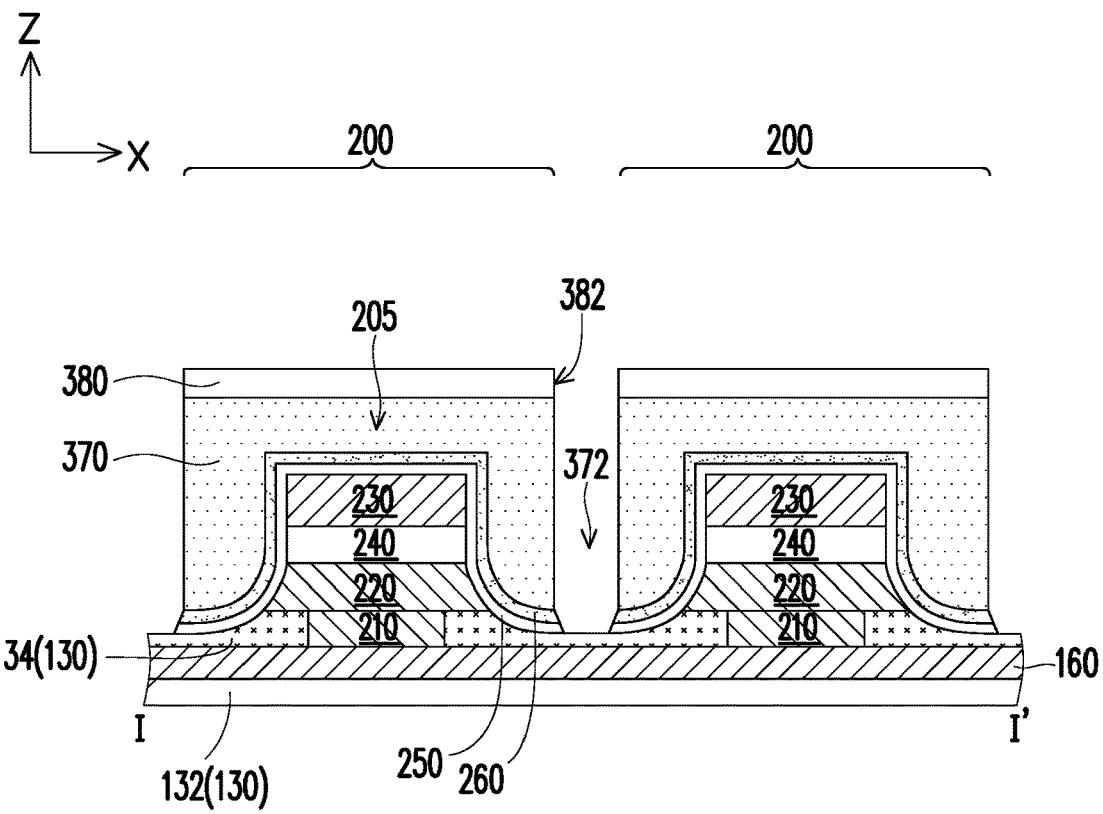
Figure 11D:
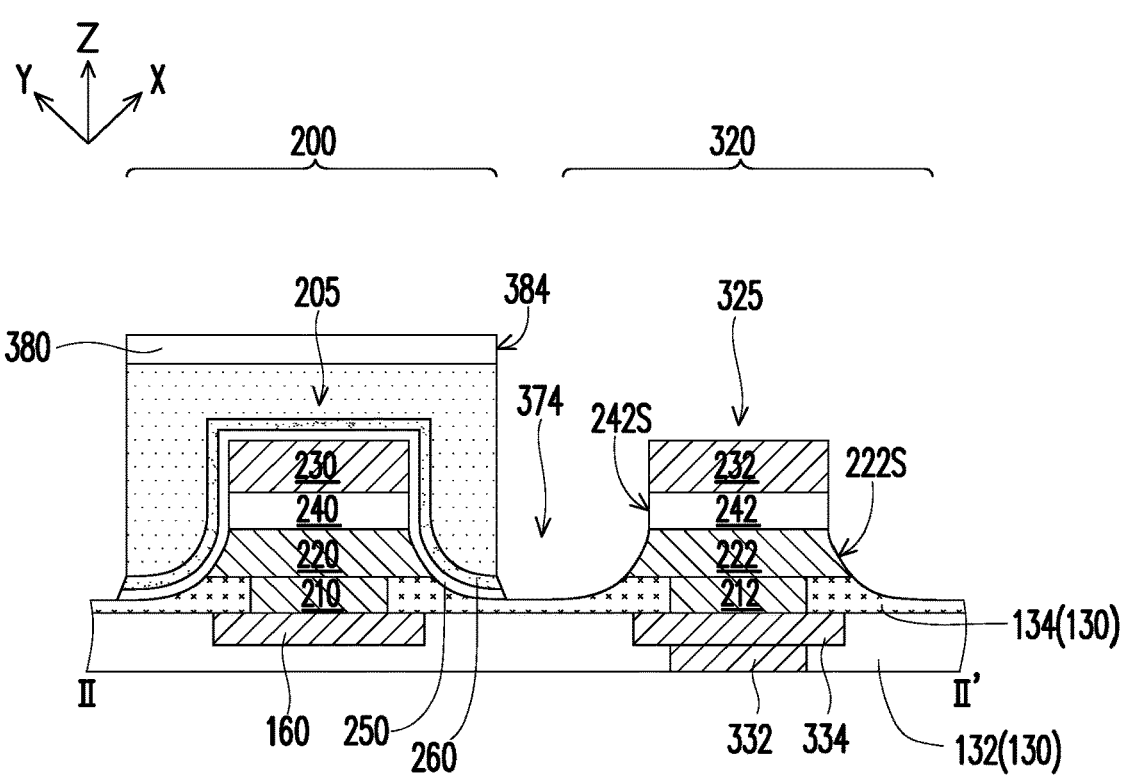
Figure 12A:
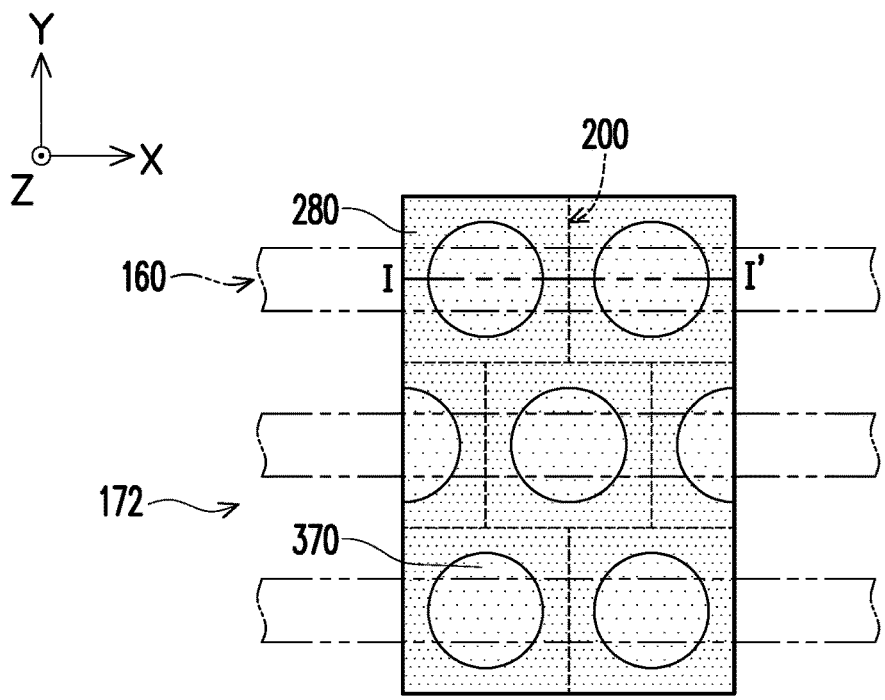
Figure 12B:
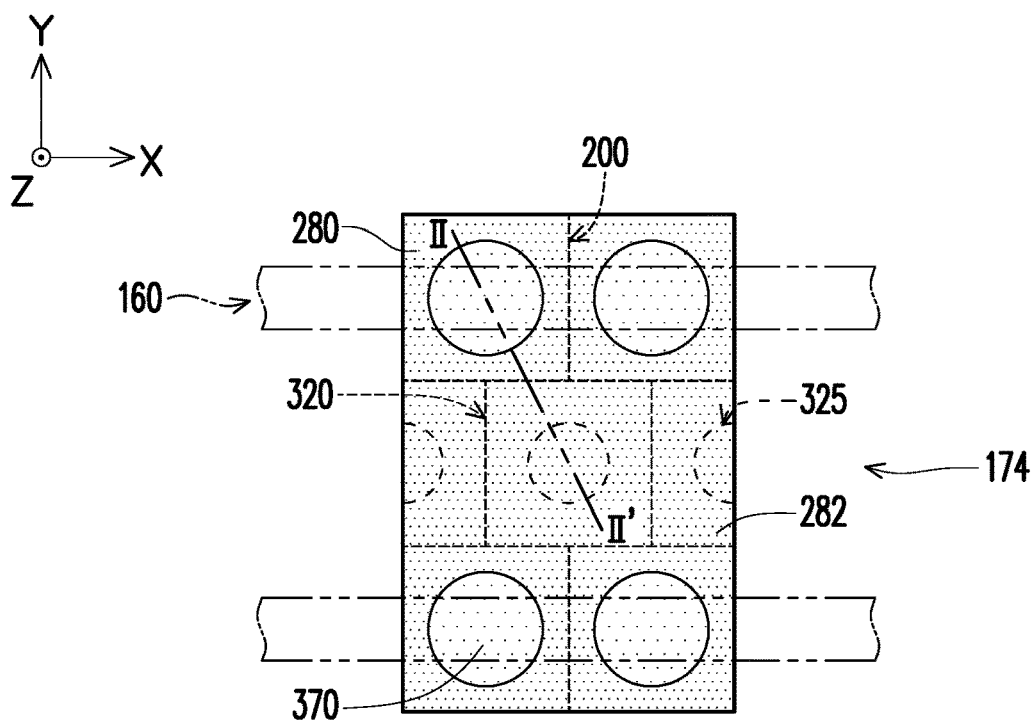
Figure 12C:
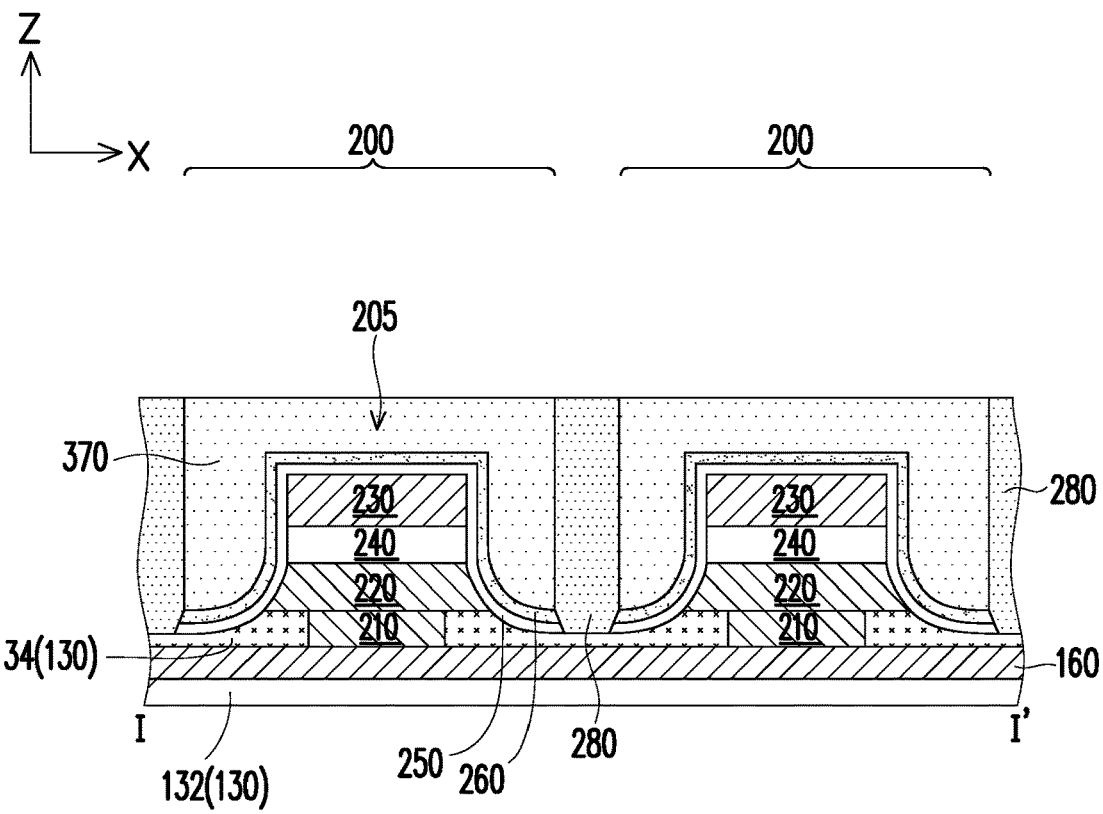
Figure 12D:
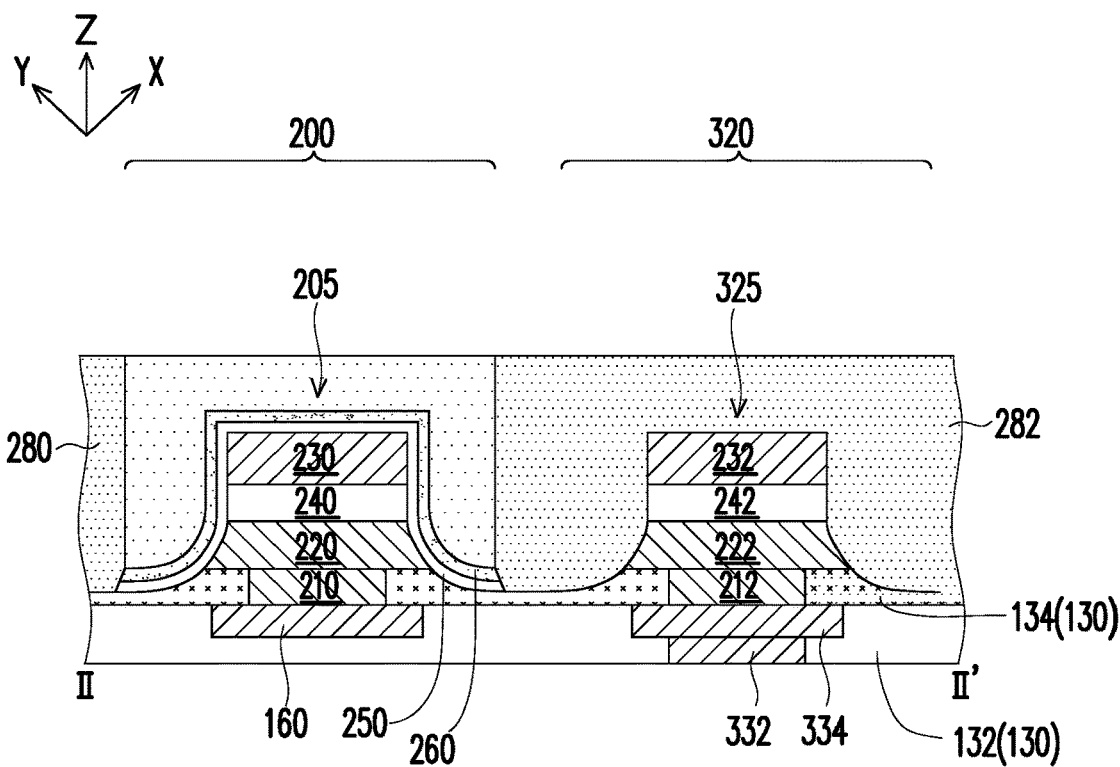
Figure 13A:
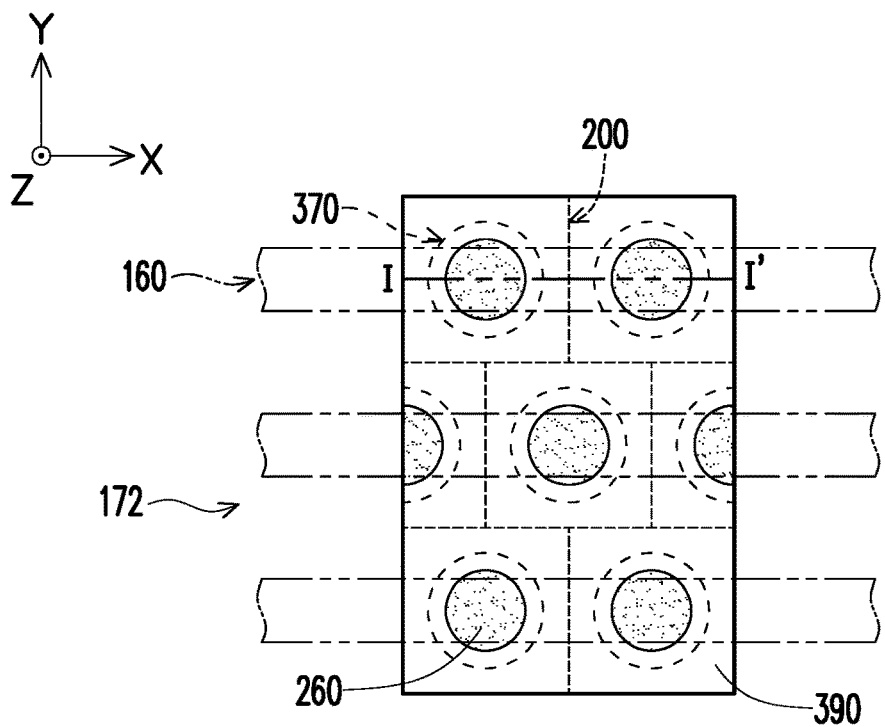
Figure 13B:
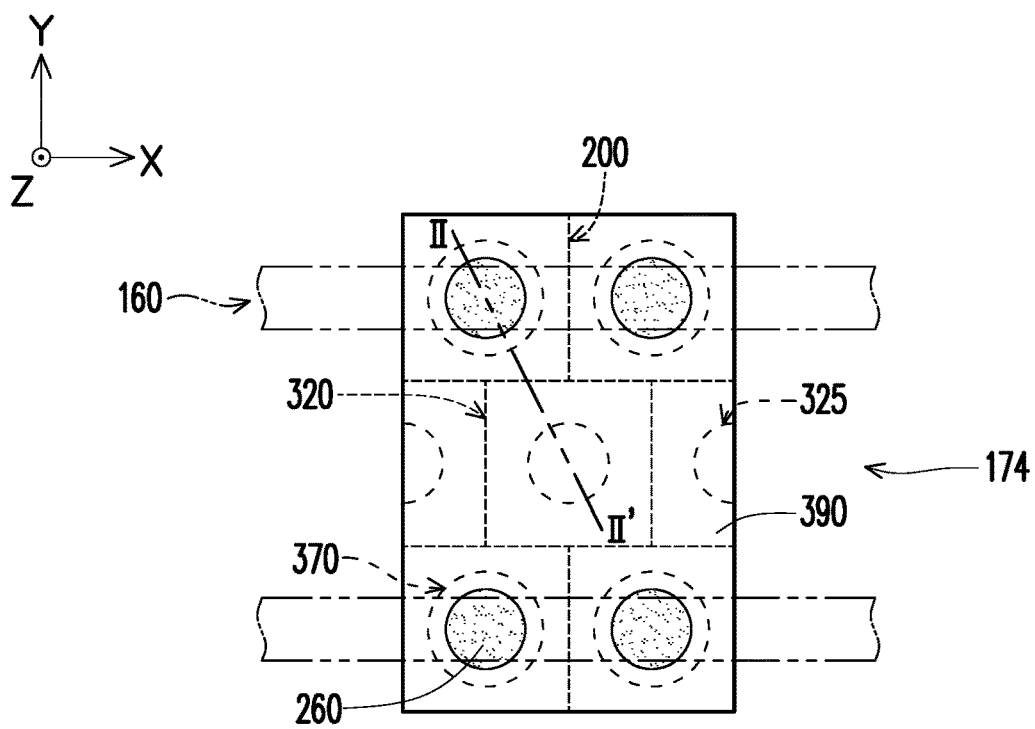
Figure 13C:
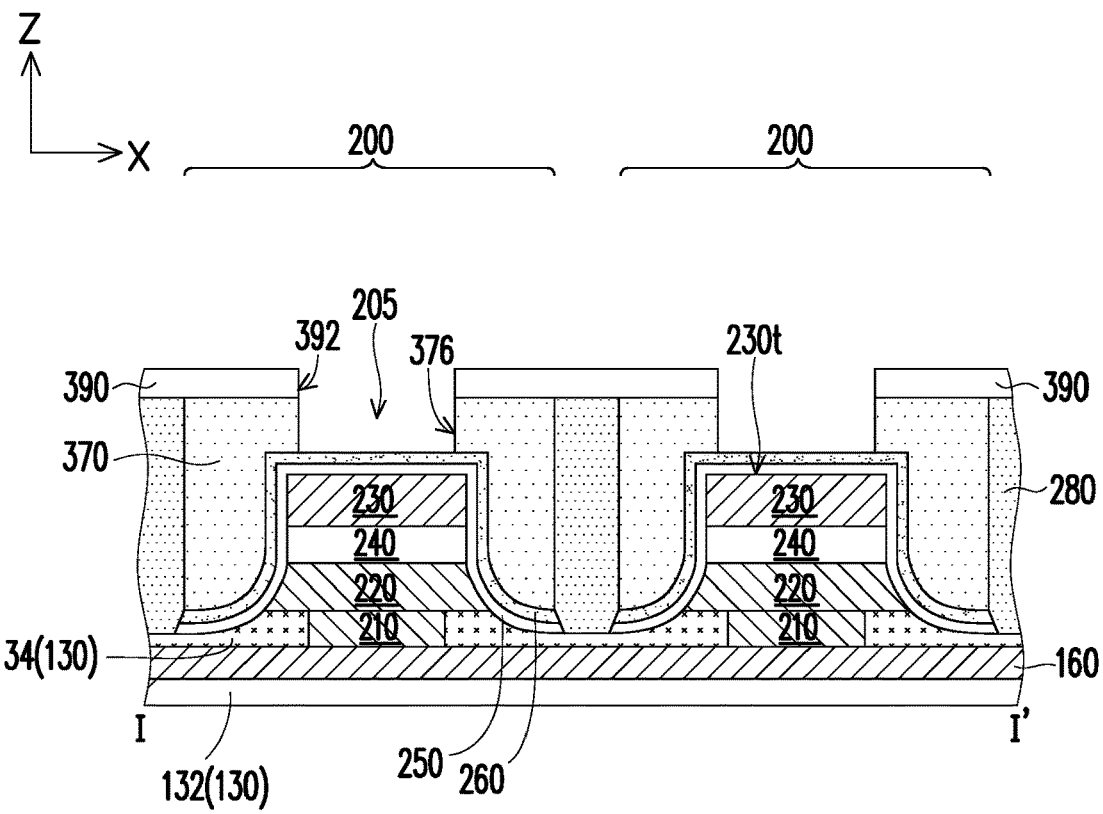
Figure 13D:
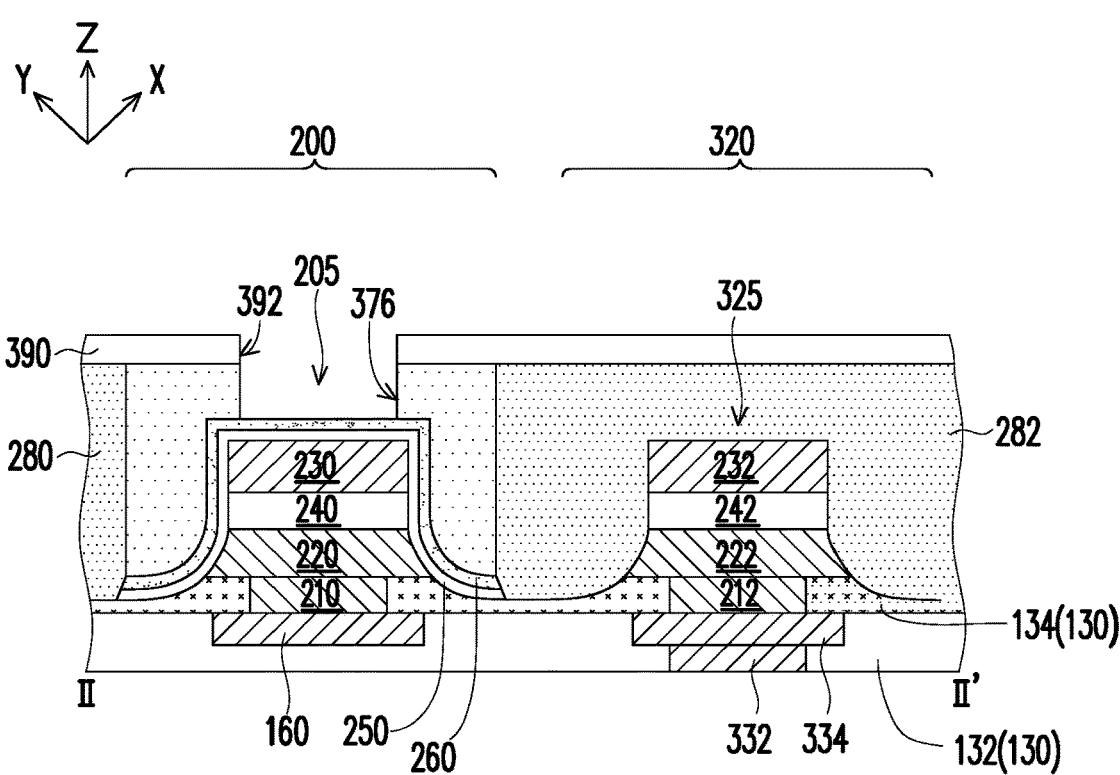
Figure 14A:
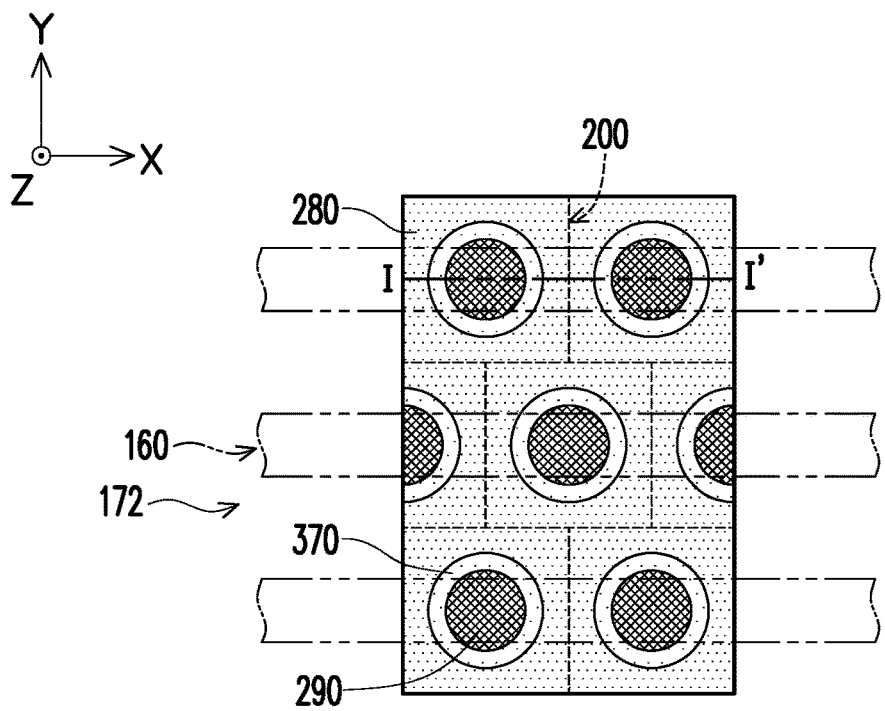
Figure 14B:
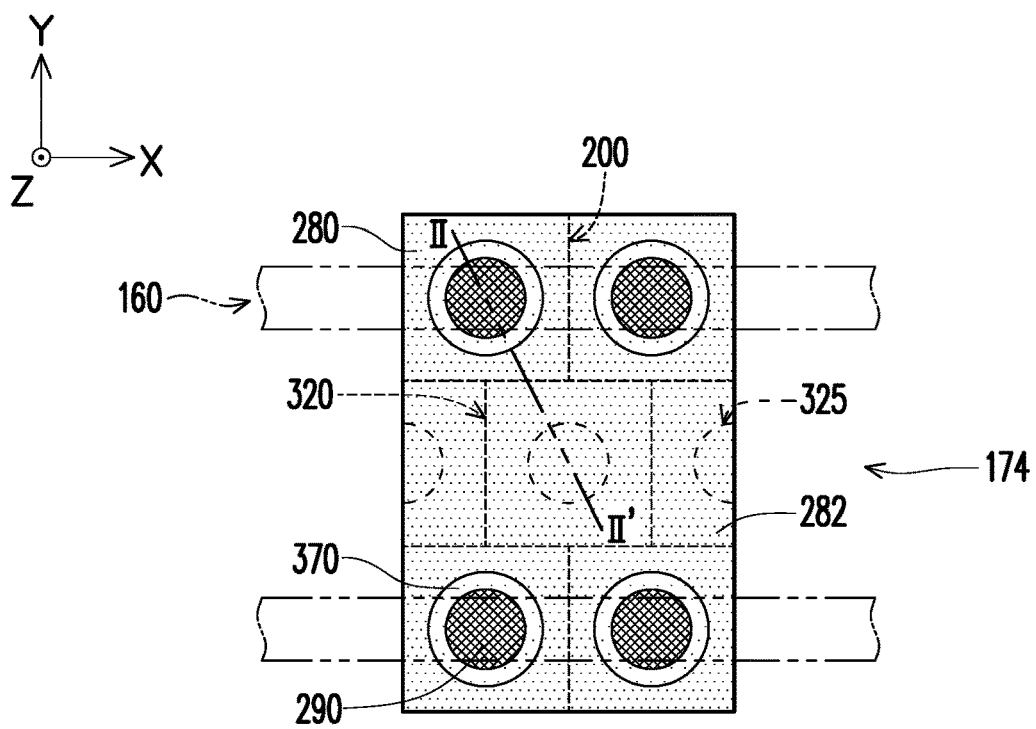
Figure 14C:
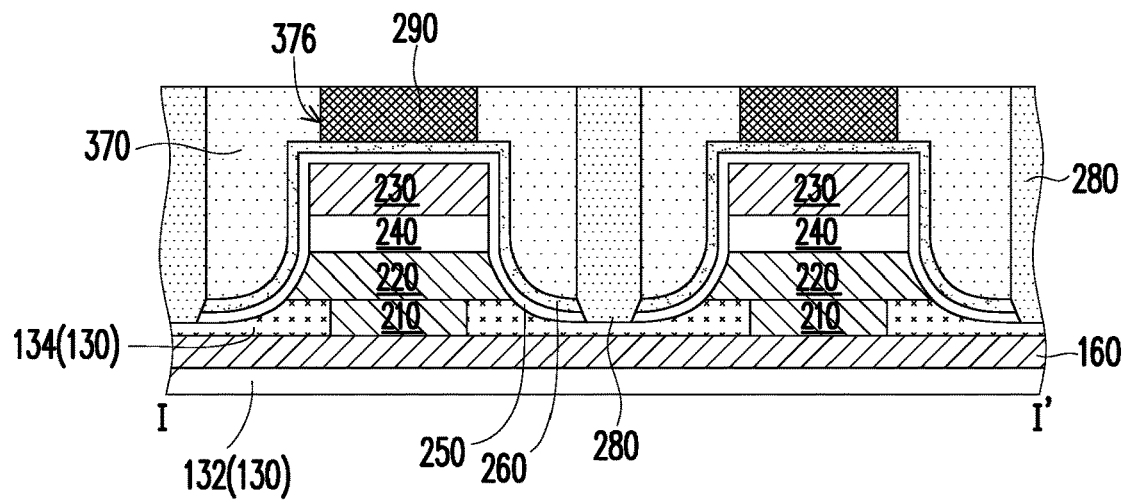
Figure 14D:
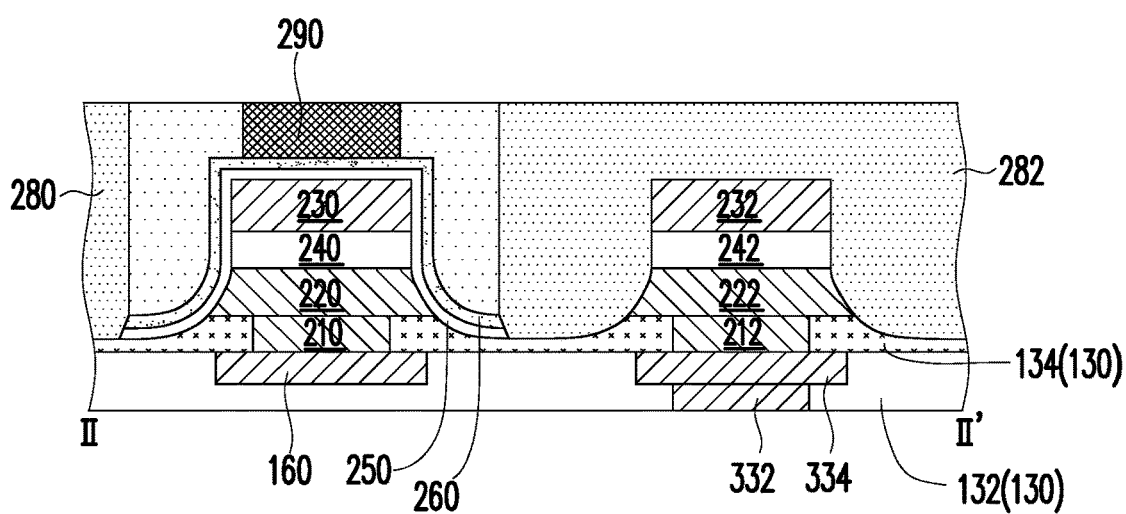
Figure 15A:
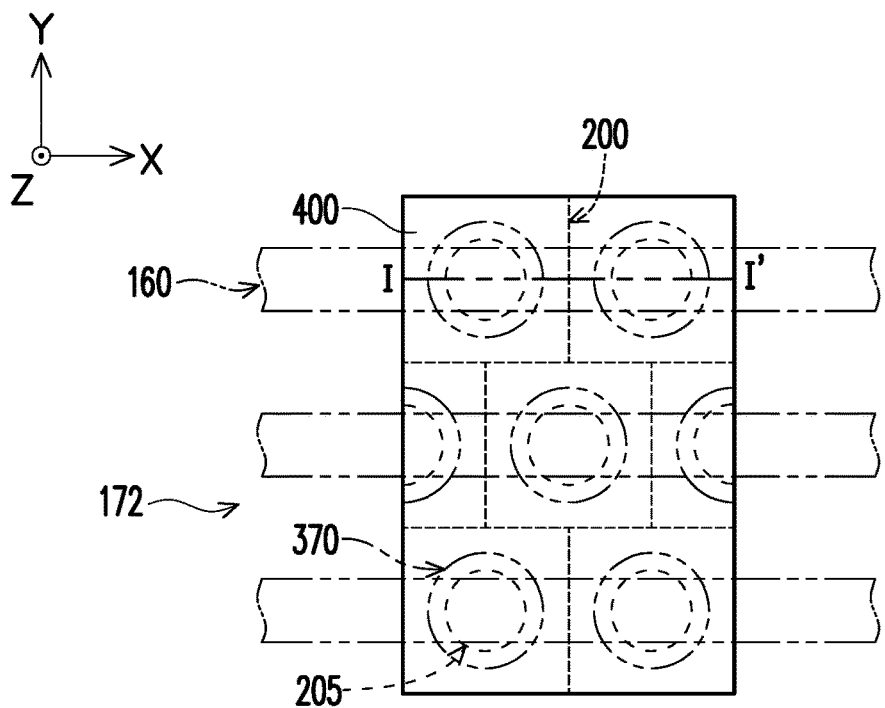
Figure 15B:
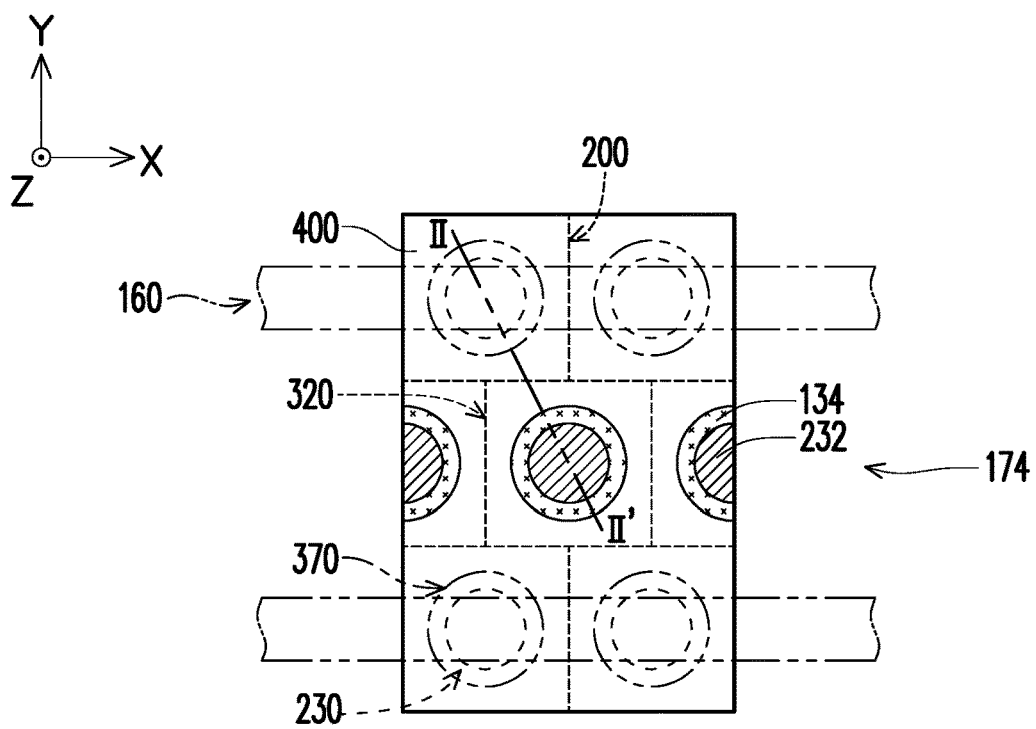
Figure 15C:
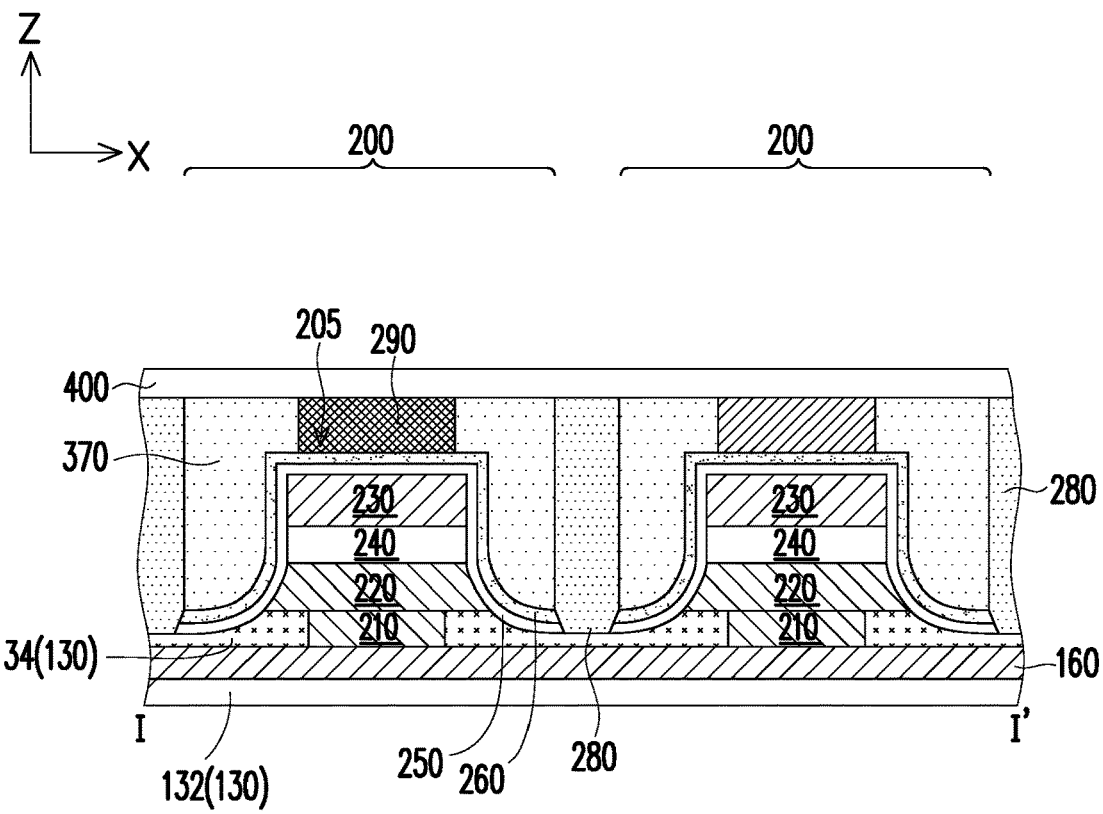
Figure 15D:
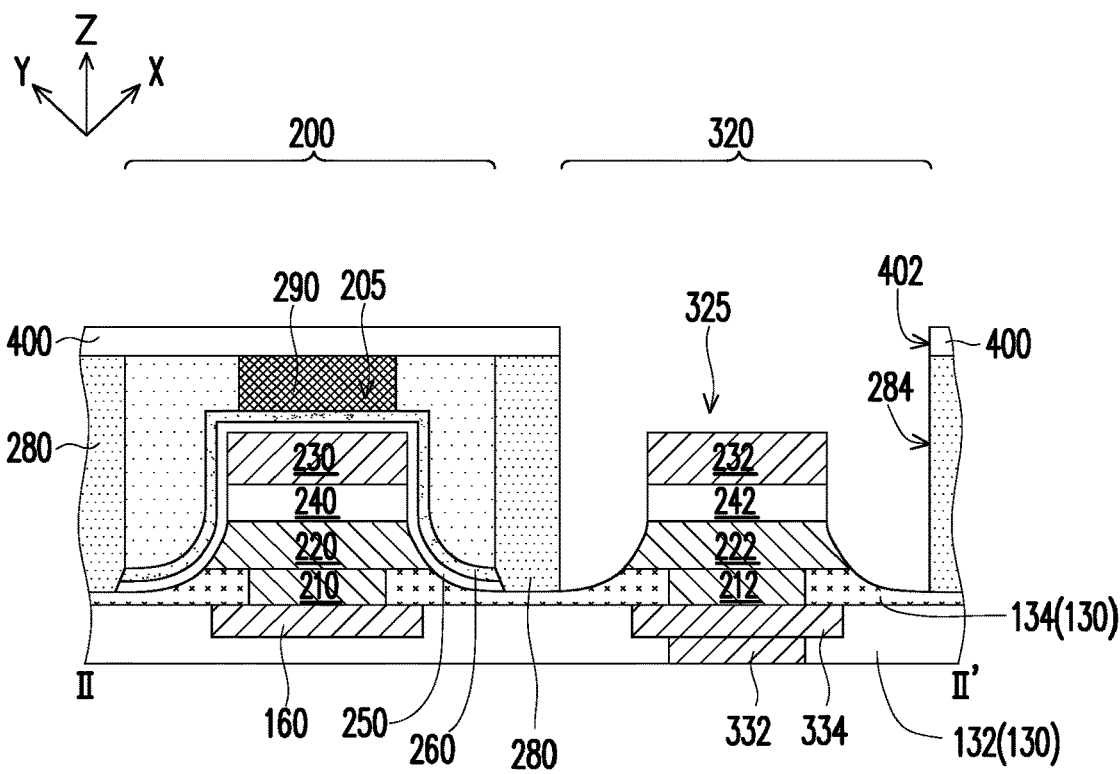
Figure 16A:
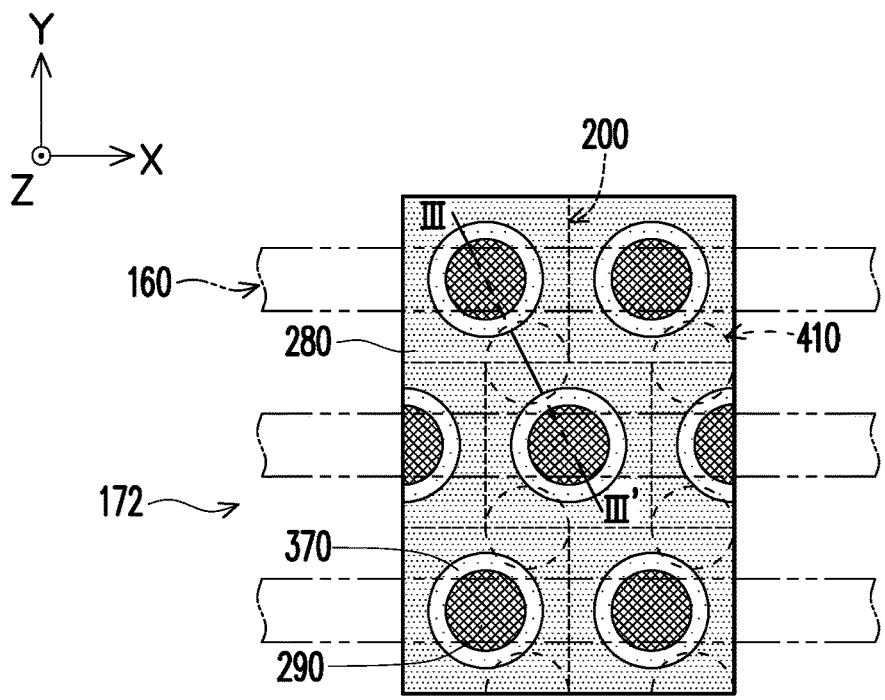
Figure 16B:
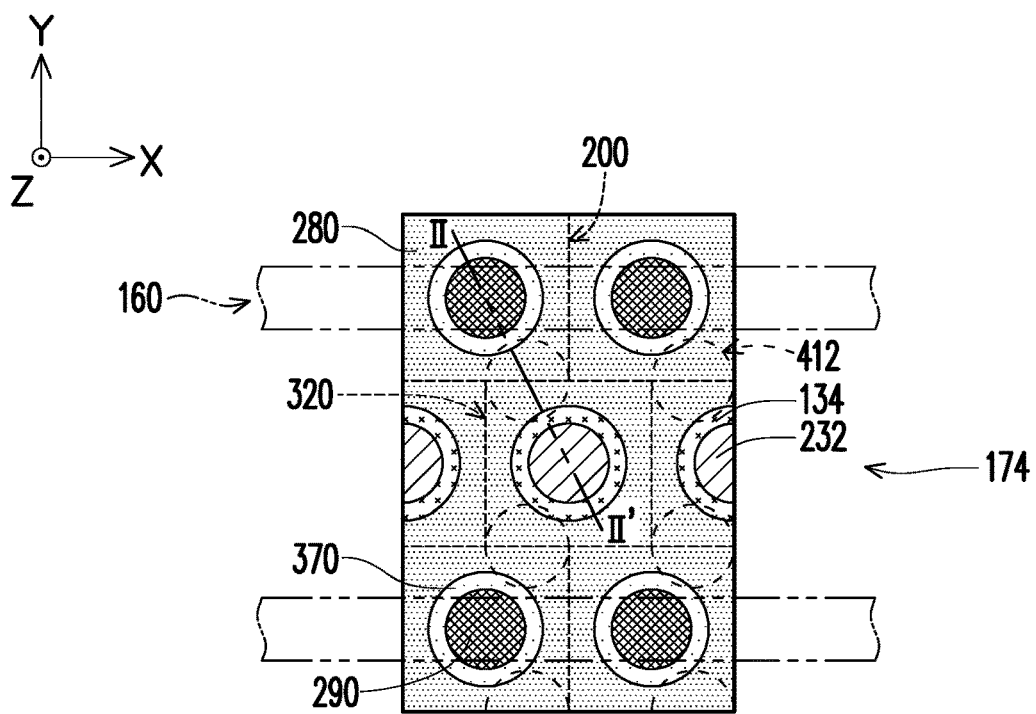
Figure 16C:
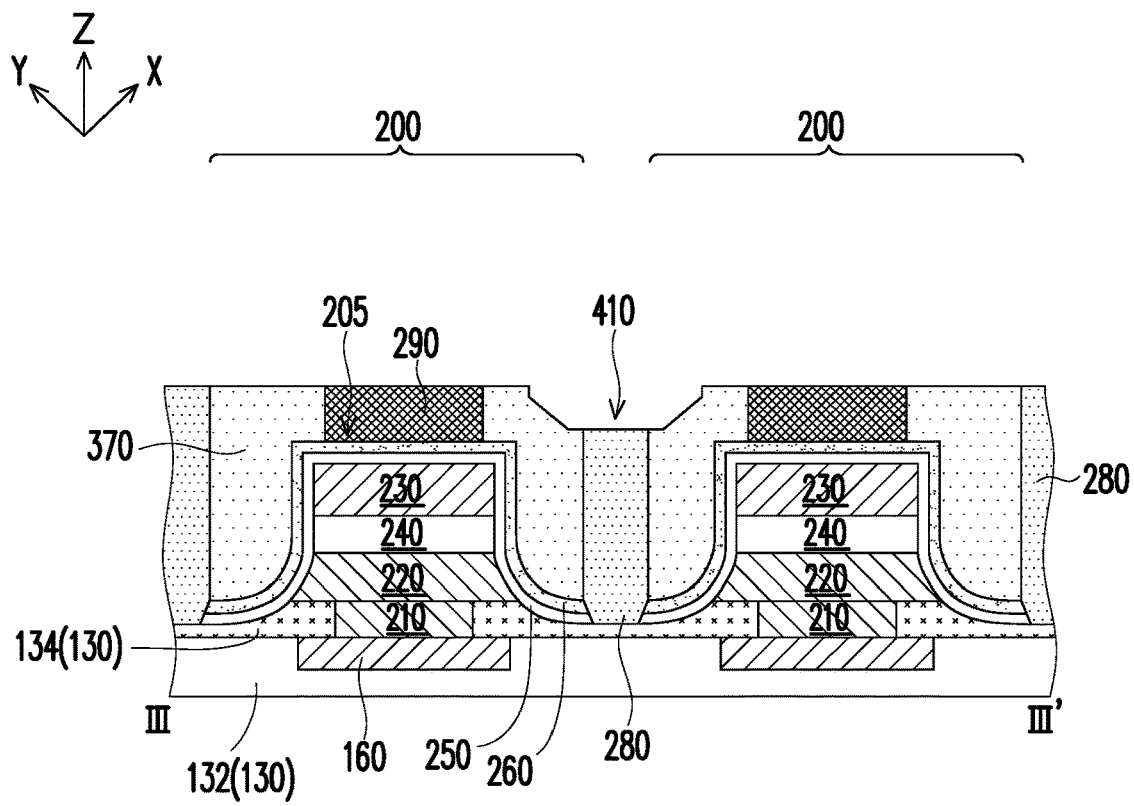
Figure 16D:
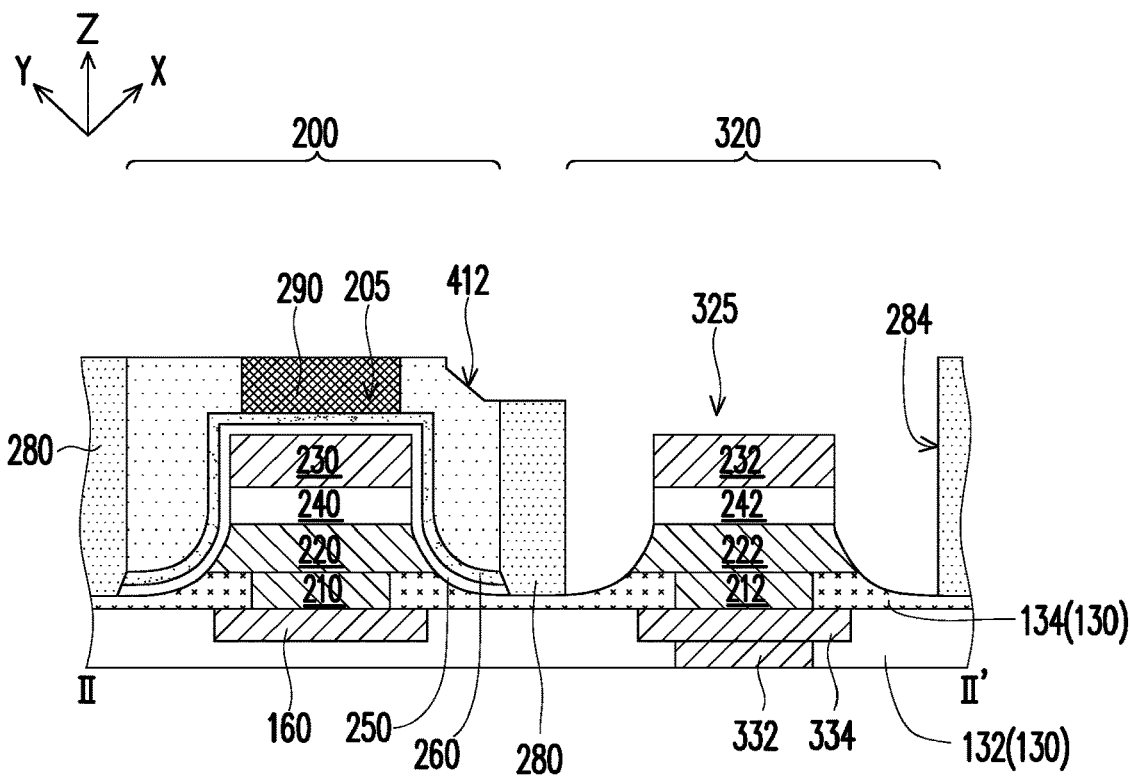
Figure 17A:
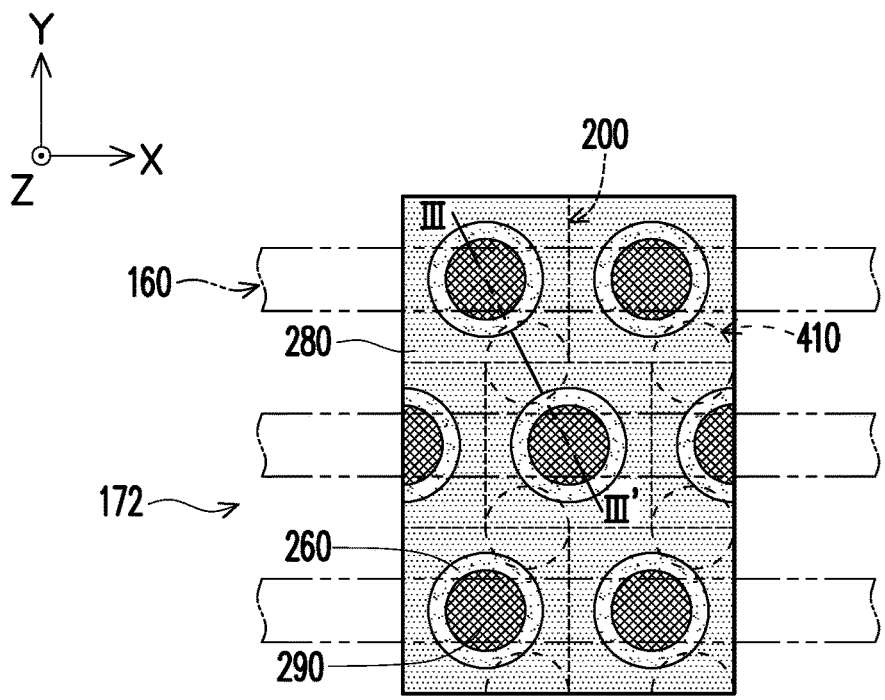
Figure 17B:
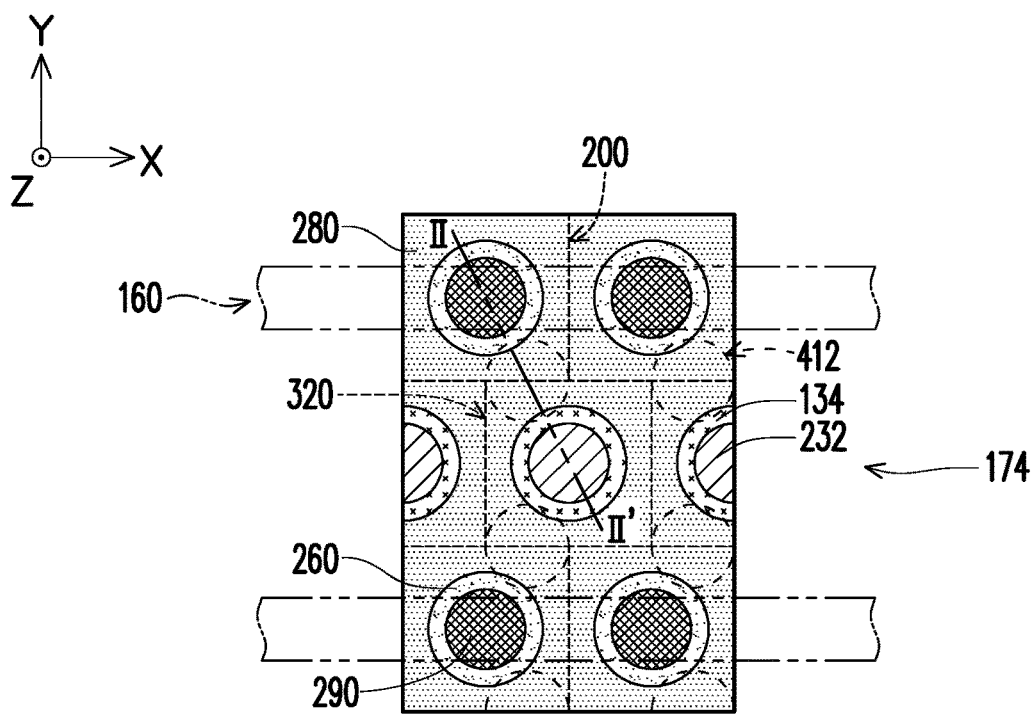
Figure 17C:
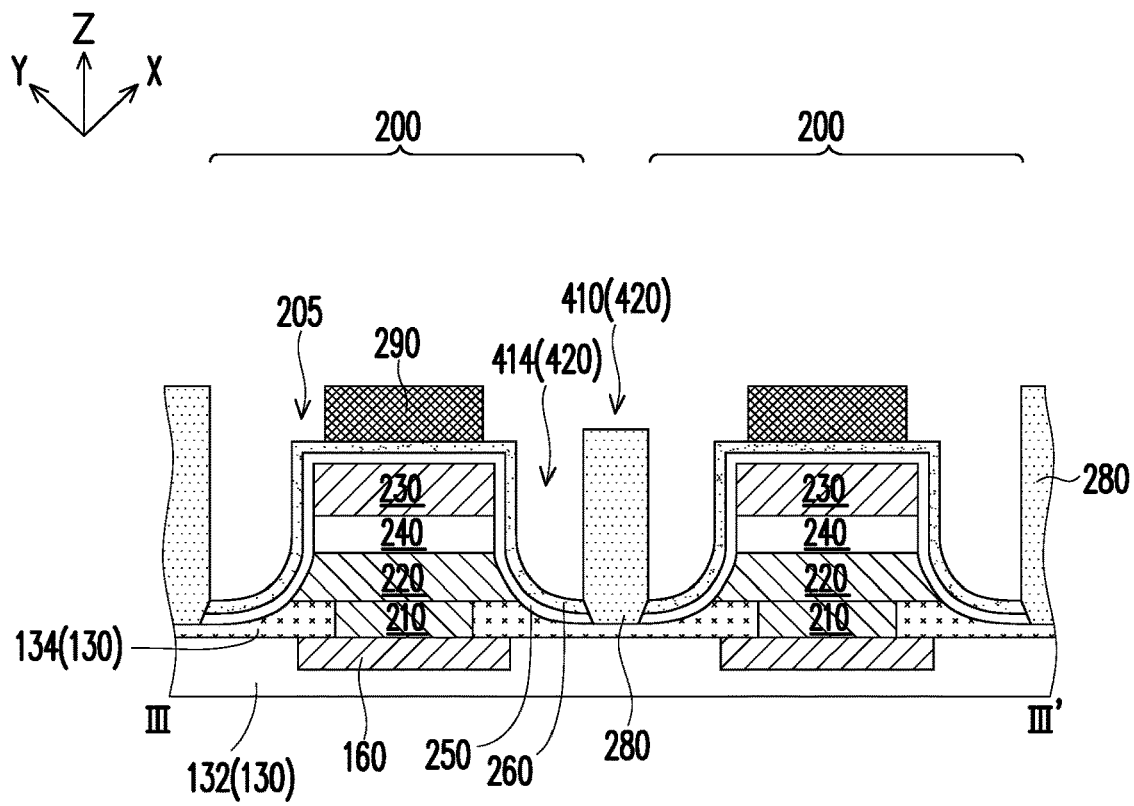
Figure 17D:
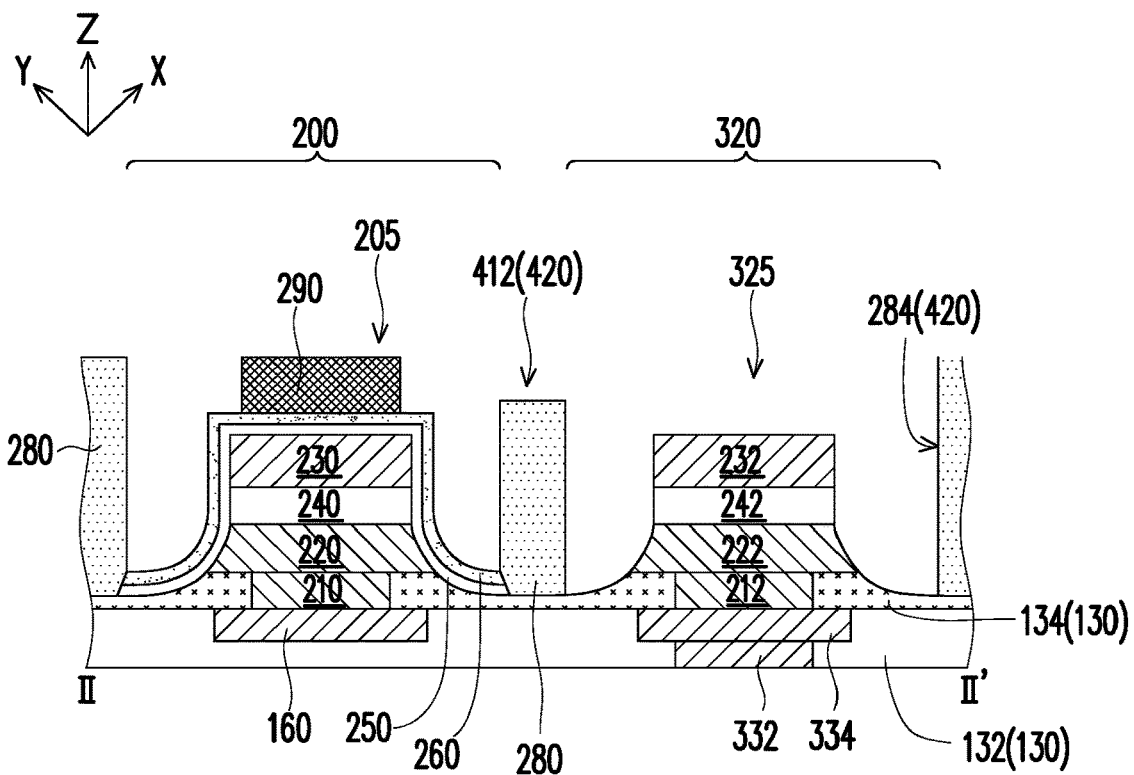
Figure 18A:
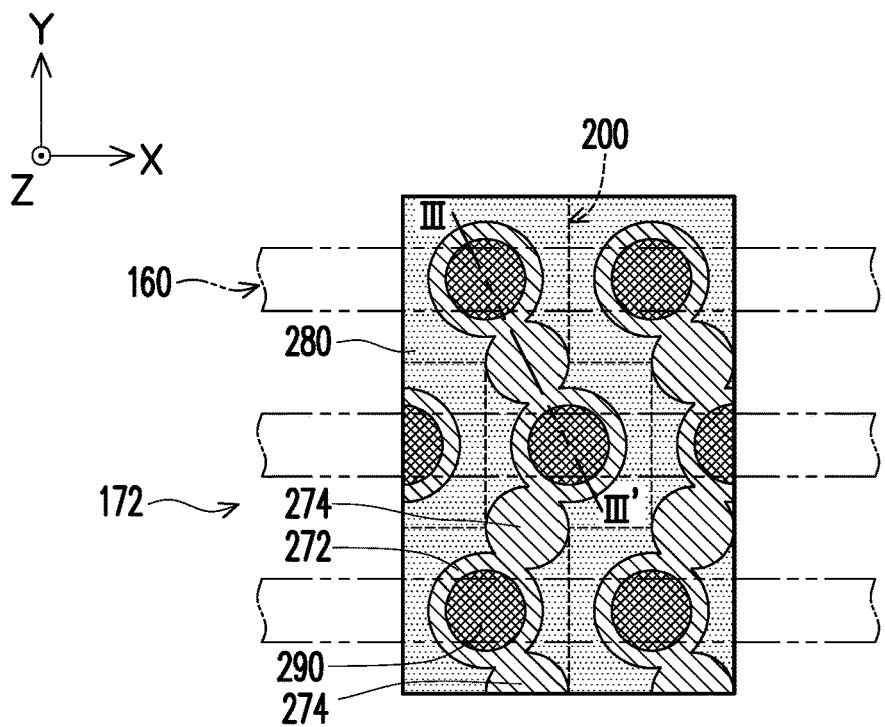
Figure 18B:
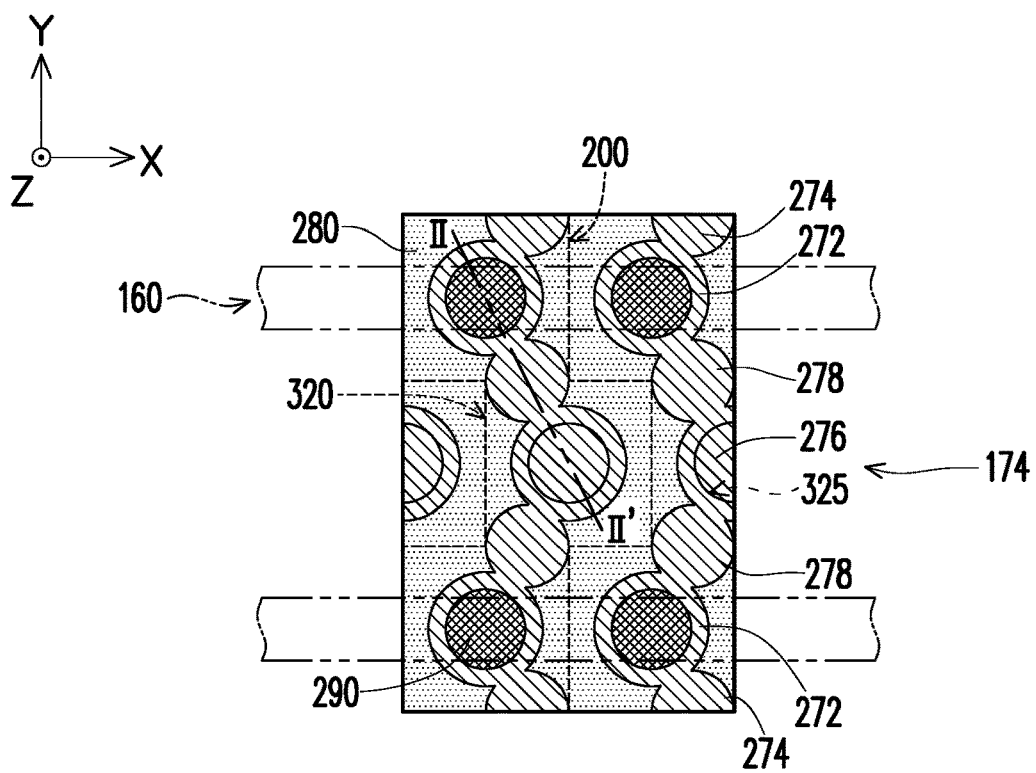
Figure 18C:
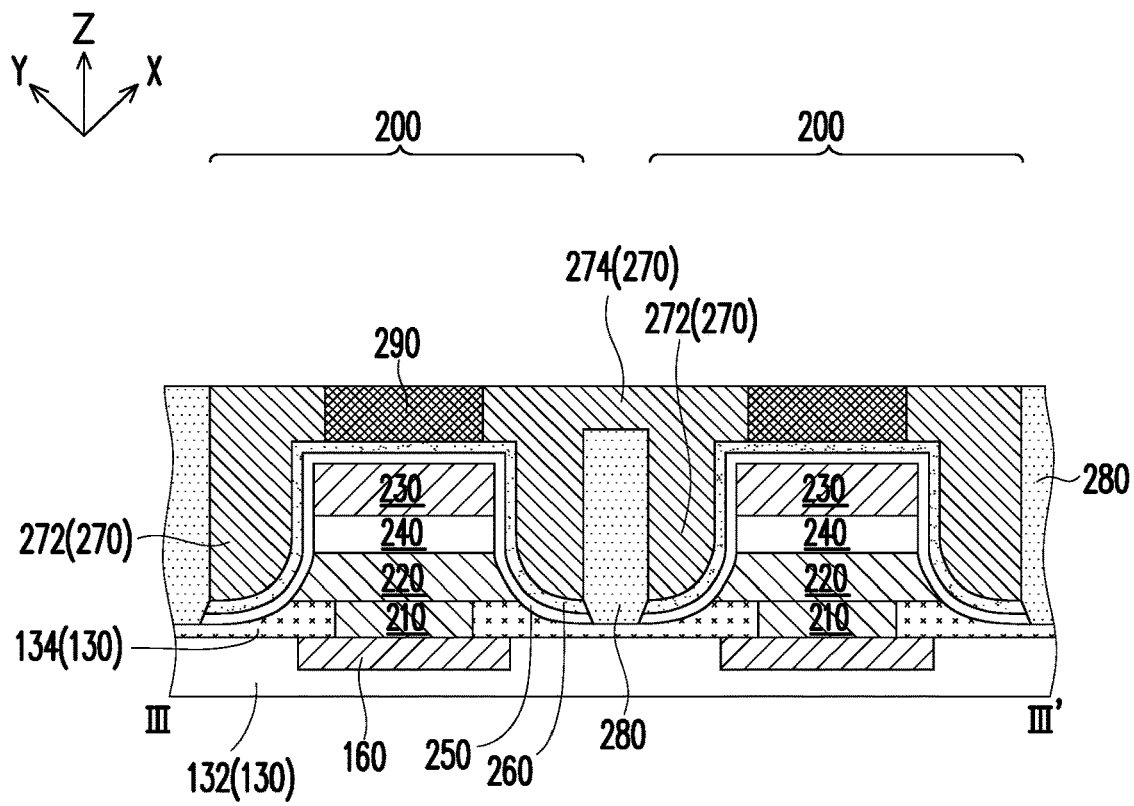
Figure 18D:
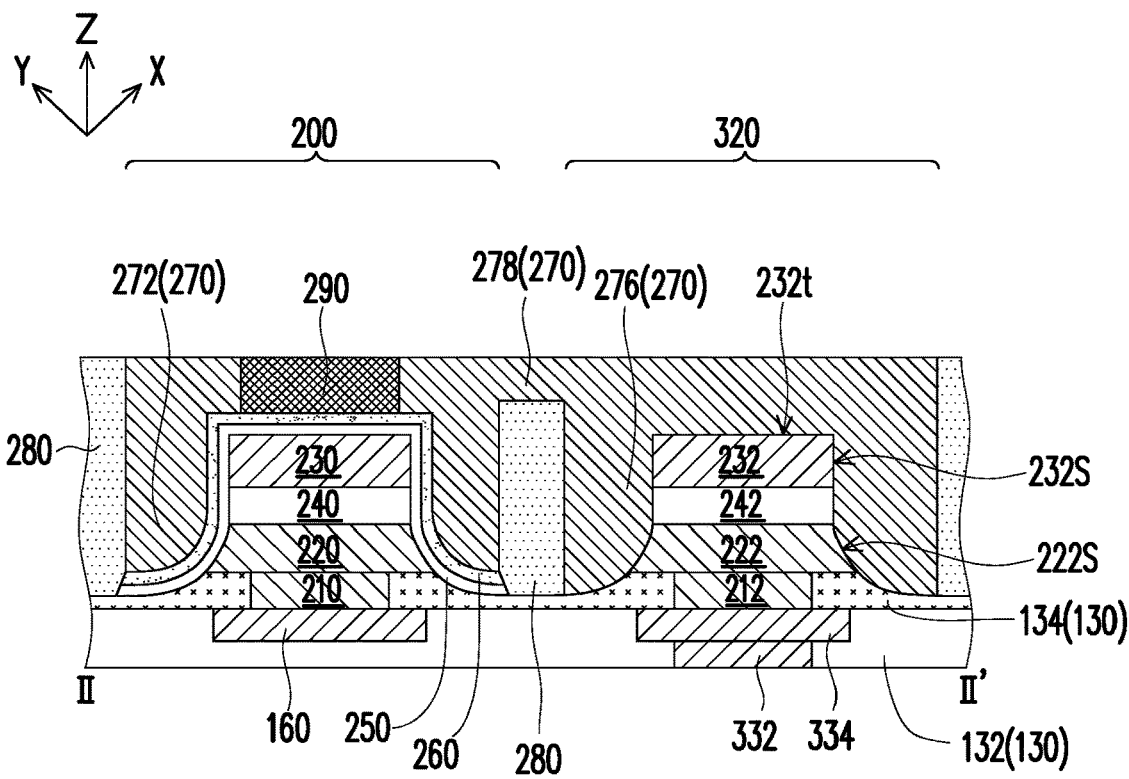

In the following, some aspects of a manufacturing method of the semiconductor device SD10 will be illustrated with reference to FIG. 5A to FIG. 19D. FIG. 5A to FIG. 19A are schematic top views of a region of structures formed during a manufacturing method of the semiconductor device SD10 according to some embodiments of the disclosure. The views of FIG. 5A to FIG. 19A may correspond to a portion of the cell region 172 of the transistor array 170 enclosed in the area A in FIG. 3. FIG. 5B to FIG. 19B are schematic top views of another region of the same structures respectively illustrated in FIG. 5A to FIG. 19B. The region illustrated in FIG. 5B to FIG. 19B may correspond to a portion of the transistor array 170 including part of the contact region 174 enclosed in the area B of FIG. 3. FIG. 5C to FIG. 19C and FIG. 5D to FIG. 19D are schematic cross-sectional views of the regions of the same structures respectively illustrated in FIG. 5A to FIG. 19A and FIG. 5B to FIG. 19B. The cross-sectional views illustrated in the Figures labelled as "C" are taken along the lines I-I', or III-III' indicated in the Figures of the same number labelled as "A", and the cross-sectional views illustrated in the Figures labelled as "D" are taken along the lines II-II' indicated in the Figures of the same number labelled as "B". For example, in FIG. 5C is illustrated the cross-sectional view taken along the line I-I' of FIG. 5A and in FIG. 5D is illustrated the cross-sectional view taken along the line II-II' of FIG. 5B.

Referring to FIG. 5A to FIG. 5D, in some embodiments, the drain contacts 220 are formed within the interlayer dielectric layer 134. Briefly, the interlayer dielectric layer 134 may be formed, for example, by deposition, spin coating, or the like, on the interlayer dielectric layer 132, blanketly extending on the conductive lines 160 in the cell region 172 and the conductive patterns 332, 334 in the contact region 174. In some embodiments, the interlayer dielectric layer 134 may then be patterned to form openings in which metallic material is filled to form the contact vias 210 and the drain contacts 220 in the cell region 172, and the lower metallic blocks 222 and the contact vias 212 in the contact region 174. While in FIG. 5C the contact vias 210, 212 are illustrated as formed within the same interlayer dielectric layer 134 as the drain contacts 220 and the lower metallic blocks 222, the disclosure is not limited thereto. In some embodiments, what is illustrated as a single interlayer dielectric layer 134 in FIG. 5C and FIG. 5D may be actually constituted by at least two interlayer dielectric layers stacked on each other, with the contact vias 210, 212 formed in the lower interlayer dielectric layer, and the drain contacts 220 and the lower metallic blocks 222 formed in the upper interlayer dielectric layer. In some embodiments, the metallic material of the lower metallic blocks 222 and the drain contacts 220 may be formed so as to overfill the opening of the interlayer dielectric layer 134, and the excess may be subsequently removed, for example via grinding or polishing (e.g., chemical mechanical polishing). In some embodiments, the drain contacts 220 and the lower metallic blocks 222 are formed as isolated islands within the interlayer dielectric layer 134 in the intended locations for the transistors 200 and the gate contacts 320. While in FIG. 5A and FIG. 5B the drain contacts 220 and the lower metallic blocks 222 are formed as circular island, the disclosure is not limited thereto, and other shapes (e.g., polygonal, etc.) are contemplated within the scope of the disclosure.

In FIG. 6A to FIG. 6D, stacked layers 244, 340, 350 are blanketly formed in the cell region 172 and the contact region 174. In some embodiments, the layers 244 and 350 include a dielectric material different than the layer 340. In particular, the layer 340 includes a material having sufficiently different etching rates with respect to the materials of the layers 244 and 350, so as to be used as etch stop layer. For example, the layers 244 and 350 may include an oxide material, such as silicon oxide, and the layer 340 may include a nitride, such as silicon nitride. In FIG. 7A to FIG. 7D, openings 352 and 354 are formed in the upper layer 350 in correspondence of the drain contacts 220 and the lower metallic blocks 222, respectively. The openings 352, 354 may be initially formed through the layer 350, to expose sections of the layer 340, and may be subsequently extended through the layer 340 to expose the layer 244. The openings 352, 354 may be formed by etching, for example employing auxiliary masks (not shown) to determine the pattern of the openings 352, 354. Referring to FIG. 7A to FIG. 8D, the openings 352, 354 may be filled with metallic material to form the source contacts 230 and the upper metallic blocks 232, respectively. In some embodiments, filling the openings 352, 354 includes depositing the metallic material via suitable techniques such as CVD or PVD, and performing a planarization process (e.g., grinding or polishing) to remove excess material that may have been deposited on the layer 350. As such, the source contacts 230 and the upper metallic blocks 232 are formed as islands in the layer 350, overlying corresponding drain contacts 220 and lower metallic blocks 222.

Referring to FIG. 8A to FIG. 9D, in some embodiments, one or more etching steps are performed to form the pillar stacks 205, 325 in the intended locations of the transistors 200 and the gate contacts 320. For example, materials from the layers 244, 340, 350 and the interlayer dielectric 314 may be removed using the source contacts 230 and the upper metallic blocks 232 as patterning masks. The etching may be any acceptable etch process, such as dry etching, plasma etching, ion beam etch (IBE), the like, or a combination thereof. In some embodiments, following etching, recesses 360 are formed between adjacent pillar stacks 205, 325. At the bottom of the recesses 360 portions of the interlayer dielectric layer 134 remains, so that the conductive lines 160 are left unexposed. At the sides of the recesses are exposed the sidewalls 220S of the drain contacts 220, 240S of the spacers 240, and 230S of the source contacts 230 in correspondence of the intended locations of the transistors 200, and the sidewalls 222S of the lower metallic blocks 222, 242S of the spacers 242, and 232S of the upper metallic blocks 232 in correspondence of the intended locations of the gate contacts 320. In some embodiments, the sidewalls 220S of the drain contacts 220 and the sidewalls 222S of the lower metallic blocks 222 are slanted, inclinedly rising from the interlayer dielectric layer 134 towards the sidewalls 240S, 242S of the spacers 240, 242. In some embodiments, the source contacts 230 and the upper metallic blocks 232 may include different materials with respect to the drain contacts 220 and the lower metallic blocks 222, so that portions of the drain contacts 220 and the lower metallic blocks 222 laterally protruding with respect to the overlying source contacts 230 and upper metallic blocks 232 may be at least partially removed, resulting in the slanted sidewalls 220S, 222S.

As illustrated above, in some embodiments, the lower metallic blocks 222 are formed simultaneously with the drain contacts 220, during the same deposition step of metallic material; the spacers 240 are formed simultaneously with the spacers 242, from the same dielectric layer; and the upper metallic blocks 232 are formed simultaneously with the source contacts 230, during the same deposition step of metallic material. As such, the lower metallic blocks 222, the spacers 242, and the upper metallic blocks 232 may have the same composition and thickness as the drain contacts 220, the spacers 240, and the source contacts 230, respectively. However, the disclosure is not limited thereto. In some embodiments, by using additional masks and performing separate deposition processes, lower metallic blocks 222 and upper metallic blocks 232 including different materials than the corresponding drain contacts 220 and source contacts 230 may be obtained.

In FIG. 10A to FIG. 10D, the semiconductor channel layer 252 and the gate dielectric layer 262 are blanketly formed over the cell regions 172 and the contact regions 174, conformally covering the pillar stacks 205 in the cell regions 172 as well as the pillar stacks 325 in the contact region 174. That is, in the structure illustrated in FIG. 10A to FIG. 10D, the gate dielectric layer 262 and the semiconductor channel layer 252 continuously extend on and between the pillar stacks 205, 325 of source and drain contacts 230, 220 and upper and lower metallic blocks 232, 222. In some embodiments, a dielectric filling 370 is formed on the gate dielectric layer 262. The dielectric filling 370 may include an oxide (e.g., silicon oxide, etc.), a nitride (e.g., silicon nitride), or the like, and may be formed by suitable processes such as CVD, PVD, or the like. In some embodiments, the dielectric filling 370 is formed of sufficient thickness to bury the pillar stacks 205, 325 in both of the cell region 172 and the contact region 174. A planarization process, such as CMP and/or grinding may be performed to flatten the top surface of the dielectric filling 370, while leaving the pillar stacks 205, 325 buried.

Referring to FIG. 10A to FIG. 11D, a patterned mask 380 is formed on the cell regions 172. The patterned mask 380 includes openings 382 exposing the dielectric filling 370 in between adjacent pillar stacks 205, and openings 384 exposing the dielectric filling 370 overlying the pillar stacks 325 in the contact region 174. In some embodiments, the patterned mask 380 may be formed as a plurality of blocks (e.g., circular blocks) overlying the pillar stacks 205. In some embodiments, the patterned mask 380 may include a photoresist material, and may be formed by a sequence of deposition, exposure and development. The dielectric filling 370 left exposed by the patterned mask 380 may be removed, for example via etching, to form isolation trenches 372 and 374 in correspondence of the openings 382, 384. The etching may be any acceptable etch process, such as dry etching, plasma etching, ion beam etch (IBE), the like, or a combination thereof. In some embodiments, the etching may be anisotropic. In some isolation trenches 372 and 374 are extended until the pillar stacks 325 and the interlayer dielectric layer 134 are exposed. That is, the portions of the semiconductor channel layer 252 and gate dielectric layer 262 extending in between adjacent pillar stacks 205 or over the pillar stacks 325 may also be removed during patterning of the dielectric filling 370. As such, the semiconductor channel layer 250 and the gate dielectric layer 260 remaining on any pillar stack 205 may be isolated from the semiconductor channel layers 250 and the gate dielectric layer 260 of the adjacent pillar stacks 205. Furthermore, the pillar stacks 325 may be once again exposed in the isolation trenches 372. That is, the upper metallic blocks 232 and at least the sidewalls 242S, 222S of the spacers 242 and the lower metallic blocks 222 are exposed in the isolation trenches 374.

Referring to FIG. 11A to FIG. 12D, in some embodiments, the patterned mask 380 is removed, for example via stripping or ashing, and an isolation material is disposed in the isolation trenches 372 and 374 to respectively form the isolation structures 280 and an isolation plug 282. The isolation structures 280 surrounds the pillar stacks 205, which pillar stacks 205 are still encapsulated by the remaining portion of the dielectric filling 370. The isolation plug 282 extends through the contact region 174 to bury the pillar stacks 325. The isolation plug and the isolation structures 280 may be connected to each other, so that the pillar stacks 205 with the dielectric filling 370 may have a sea-island configuration, appearing as isolated islands surrounded by the isolation structures 280. Furthermore, the isolation structures 280 are also connected to the isolation plug 282, in some embodiments with no clear interface in between, thus forming a continuous structure. In some embodiments, disposing the isolation material of the isolation structures 280 and the isolation plug 282 includes depositing the isolation material, for example via CVD or PVD, and performing a planarization process (e.g., CMP and/or grinding) to flatten the top surfaces of the isolation structures 280 and the isolation plug 282 until the dielectric filling 370 is once again exposed. In some embodiments, the composition of the isolation material is selected so that selective removal (e.g., selective etching) with respect to the dielectric filling 370 is possible. For example, if the dielectric filling 370 includes an oxide (e.g., silicon oxide), the isolation material may include a nitride (e.g., silicon nitride). In some embodiments, if the dielectric filling 370 includes a nitride (e.g., silicon nitride), the isolation material may include an oxide (e.g., silicon oxide).

Referring to FIG. 13A to FIG. 13D, a patterned mask 390 is formed on the cell regions 172 and the contact region 174. The patterned mask 390 may (fully) cover the isolation structures 280 and the isolation plug 282, and at least partially cover the dielectric filling 370 remaining on top of the pillar stacks 205. The patterned mask 390 includes openings 392 exposing part of the dielectric filling 370 overlying the pillar stacks 205. In some embodiments, the patterned mask 390 may be blanketly formed over the cell regions 172 and the contact region 174, leaving exposed through the openings 392 portions of the dielectric filling 370 extending over the top surfaces 230t of the source contacts 230. In some embodiments, the patterned mask 390 may include a photoresist material, and may be formed by a sequence of deposition, exposure and development. The dielectric filling 370 left exposed by the patterned mask 390 may be removed, for example via etching, to form cap trenches 376 over the pillar stacks 205. The etching may be any acceptable etch process, such as dry etching, plasma etching, ion beam etch (IBE), the like, or a combination thereof. In some embodiments, the etching may be anisotropic. The cap trenches 376 may expose at their bottom the gate dielectric layer 260, in particular a section of the gate dielectric layer 260 extending over the top surface of the source contacts 230. However, the cap trenches 376 may have a footprint smaller than the source trenches 230, so that part of the gate dielectric layer 260 and the dielectric filling 370 extending on the top surface 230t of the source contacts 230 may still remain.

Referring to FIG. 13A to FIG. 14D, in some embodiments, the patterned mask 390 is removed, for example via stripping or ashing, and a dielectric material is disposed in the cap trenches 376 to form the dielectric caps 290. The dielectric caps 290 are located on top of the pillar stacks 205 and the gate dielectric layer 260, encircled by the dielectric filling 370. The dielectric filling 370 may separate the dielectric caps 290 from the isolation structures 280. In some embodiments, disposing the dielectric material of the dielectric caps 290 includes depositing the dielectric material, for example via CVD or PVD, and performing a planarization process (e.g., CMP and/or grinding) to flatten the top surfaces of the dielectric caps 290 until the dielectric filling 370, the isolation structures 280, and the isolation plug 282 are once again exposed. In some embodiments, the composition of the dielectric material of the dielectric caps 290 is selected so that selective removal (e.g., selective etching) with respect to the dielectric filling 370 is possible. For example, if the dielectric filling 370 includes an oxide (e.g., silicon oxide), the dielectric caps 290 may include a nitride (e.g., silicon nitride). In some embodiments, if the dielectric filling 370 includes a nitride (e.g., silicon nitride), the dielectric caps 290 may include an oxide (e.g., silicon oxide). In some embodiments, the dielectric caps 290 include the same isolation material as the isolation structures 280.

Referring to FIG. 15A to FIG. 15D, a patterned mask 400 is formed on the cell regions 172 and in the contact region 174. The patterned mask 400 may (fully) cover the cell region 172 and at least partially cover the isolation plug 282 (illustrated, e.g., in FIG. 13D) which encapsulates the pillar stacks 325. The patterned mask 400 includes openings 402 exposing part of the isolation plug 282 overlying the pillar stacks 325. In some embodiments, the patterned mask 400 may be blanketly formed over the cell regions 172 and the contact region 174, leaving exposed through the openings 402 portions of the isolation plug 282 immediately surrounding the pillar stacks 325. In some embodiments, the patterned mask 400 may include a photoresist material, and may be formed by a sequence of deposition, exposure and development. The portion of the insulation plug 282 left exposed by the patterned mask 400 may be removed, for example via etching, to form contact trenches 284 exposing the pillar stacks 325 and, possibly, portions of the interlayer dielectric layer 134 surrounding the pillar stacks 325. The etching may be any acceptable etch process, such as dry etching, plasma etching, ion beam etch (IBE), the like, or a combination thereof. In some embodiments, the etching may be anisotropic. Along the sidewalls of the contact trenches 284, isolation structures 280 may remain, avoiding exposure of the dielectric filling 370 surrounding the pillar stacks 205 in the contact trenches 284. That is, at the sidewalls of the contact trenches 284, the isolation material of the isolation structures 280 may be exposed.

Referring to FIG. 15A to FIG. 16D, the patterned mask 400 may be removed, for example via stripping or ashing, and additional recesses 410, 412 may be formed in the isolation structures 280 and the dielectric filling 370, for example via etching in presence of one or more auxiliary masks (not shown). In some embodiments, the recesses 410 are formed in the cell region 172, removing portions of the dielectric filling 370 and the isolation structure 280. The recesses 410 may extend from a portion of dielectric filling 370 surrounding a pillar stack 205 to another portion of dielectric filling 370 surrounding an adjacent pillar stack 205. For example, the recesses 410 may be formed in regions overlapping with and connecting to each other the dielectric fillings 370 encircling pairs of adjacent pillar stacks 205. For example, on one side of a recess 410, the dielectric filling 370 of a first pillar stack 205 is exposed, and at an opposite side of the same recess 410, the dielectric filling 370 of a second pillar stack 205 adjacent to the first pillar stack 205 is exposed. In between such two sides of the recess 410, an isolation structure 280 separating the first pillar stack 205 from the second pillar stack 205 is exposed. That is, any one of the recesses 410 may be formed by removing material from two adjacent portions of dielectric filling 370 and the intervening isolation structure 280. In some embodiments, two recesses 410 are formed for each pillar stack 205 which is not formed at the boundaries of the cell regions 172. The two recesses 410 may be formed at a same side of the pillar stack 205 with respect to an extending direction of the conductive lines 160, and may be formed at opposite sides of the pillar stack 205 with respect to a direction perpendicular to the extending direction of the conductive lines 160. For example, when the conductive lines 160 extend along the X direction, the two recesses 410 of a pillar stack 205 may be formed at same sides along the X direction with respect to the pillar stack 205 (e.g., both recesses 410 being formed at the positive or negative X direction considering the associated pillar stack 205 as origin of the X direction in FIG. 16A), and at opposite sides along the Y direction with respect to the pillar stack 205 (e.g., one recess 410 formed in the positive Y direction, one recess 410 formed in the negative Y direction considering the associated pillar stack 205 as origin of the Y direction). In a similar fashion, the recesses 412 are formed at the boundaries between the cell regions 172 and the contact region 174. The recesses 412 are connected at one side to the contact trenches 284 and at an opposite side expose the dielectric filling 370 encapsulating a pillar stack 205 adjacent to the pillar stack 305. At the bottom of the recesses 412, the isolation structure 280 separating the pillar stack 305 from the adjacent pillar stack 205 is exposed. If the gate contacts 320 are formed in between cell regions 172, the transistors 200 of which are connected to said gate contacts 320 (e.g., the gate contacts 320 are not disposed at the periphery of the transistor array 170 of FIG. 3), each contact trench 284 will be connected to two recesses 412, and the relative positions of the recesses 412 and the contact trenches 284 may be as previously described for the recesses 410 and the pillar stacks 205. It should be noted that starting from FIG. 16C, the cross-sectional view of the portion of the cell region 172 is taken along the line III-III illustrated in FIG. 16A.

Referring to FIG. 16A to FIG. 17D, the dielectric filling 370 may be selectively removed, for example via etching, forming gate portion trenches 414 encircling the pillar stacks 205. The etching process to remove the dielectric filling 370 may be any suitable etching process, such as wet etching. At the bottom of the gate portion trenches 414 the gate dielectric layer 260 is exposed. The isolation structures 280 divide adjacent gate portion trenches 414 from each other and from the contact trench 284. Isolation structures 280 disposed between pillar stacks 205 which are to be connected to a same gate pattern (e.g., one of the gate patterns 270 illustrated in FIG. 3) may be shorter because of the formation of the recesses 410 and 412. In practice, the recesses 410 and 412 connects to each other gate portion trenches 414 and contact trenches 284 to form gate trenches 420 in which the gate patterns are subsequently formed. In the structure illustrated in FIG. 17A to FIG. 17D, multiple gate trenches 420 may extend substantially parallel to each other along the Y direction (according to the intended shape of the later formed gate patterns 270), delimited at the sides by the taller portions of the isolation structures 280.

Referring to FIG. 17A to FIG. 18D, the gate material is filled in the gate trenches 420 to form the gate patterns 270. The gate material may be disposed so as to initially overfill the gate trenches 420, and a planarization process (e.g., grinding or CMP) may be performed to remove excess material until the dielectric caps 290 are exposed. As such, top surfaces of the gate sections 272, the contact sections 276, and the connecting sections 274, 278 may be substantially at the same level height along the Z direction. The gate sections 272 formed in the gate portion trenches 414 land on the gate dielectric layers 260, and may be used to control the corresponding transistors 200. The gate sections 272 of a same gate pattern 270 are interconnected to each other by the connecting sections 274, which are formed where the recesses 410 were located. The contact sections 276 are formed in the contact trenches 284, and directly contact both of the upper metallic block 232 (in correspondence of the sidewalls 232S and the top surface 232t) and the lower metallic block 222 (at least in correspondence of the sidewalls 222S). In particular, in view of the direct contact with the lower metallic block 222, the contact sections 276 may be considered the connection point between the gate patterns 270 and the remaining circuitry (e.g., the conductive patterns 332, 334), from which voltages may be applied to the gate patterns 270. The contact sections 276 are connected to the gate sections 272 by the connecting sections 278. As illustrated by the above example, the contact sections 276 and the gate sections 272 have similar structures, the main difference being the removal of the semiconductor channel layer 250 and the gate dielectric layer 260 from the pillar stacks 325 with respect to the pillar stacks 205, and are formed during the same process steps. As such, the controlling elements of the transistors 200 (e.g., the gate sections 272) and the contact sections 276 from which voltage may be applied are closely integrated in the structure, so that safety areas around the contact sections 276 may be dispensed with. As such, integration of the gate patterns 270 with the remaining circuitry may be achieved without incurring in significant area penalty.

Referring to FIG. 18A to FIG. 19D, the interlayer dielectric layer 136 may be blanketly formed on the isolation structures 280, the gate patterns 270, and the dielectric caps 290, following similar processes as previously described for the other layers of the interlayer dielectric 130. The interlayer dielectric layer 136 may then be patterned to include openings exposing portions of the dielectric caps 290. The exposed portions of the dielectric caps 290 together with the underlying portions of the gate dielectric layer 260 and the semiconductor channel layer 250 may be removed, to form via trenches 292 which are subsequently filled by conductive material to form the contact vias 300. That is, the contact vias 300 may extend through the dielectric cap 290, the gate dielectric layer 260 and the semiconductor channel layer 250 to land on the source contacts 230. The dielectric caps 290 remain on the gate dielectric layer 260, for example as annular portions of insulating material encircling the contact vias 300, so as to separate the contact vias 300 from the gate patterns 270. The structure of FIG. 2 may be obtained from the structure illustrated in FIG. 19A to FIG. 19D by forming the additional conductive patterns 182, 184, the contact pads 186, and the interlayer dielectric layers of the interconnection structure 105 via processes similar to the ones previously described. The passivation layer 190 may be formed according to any suitable process, such as deposition (e.g., CVD, PVD, ALD), spin-coating, or the like.

Figure 20A:
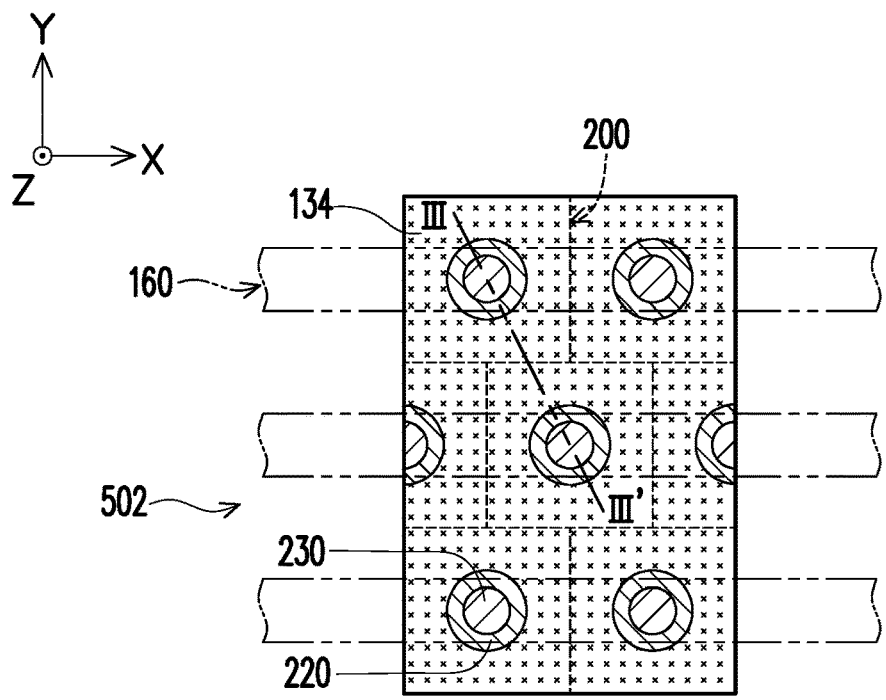
FIG. 20A and FIG. 20B are schematic top views of regions of a structure formed during a manufacturing method of a semiconductor device according to some embodiments of the disclosure.
Figure 20B:
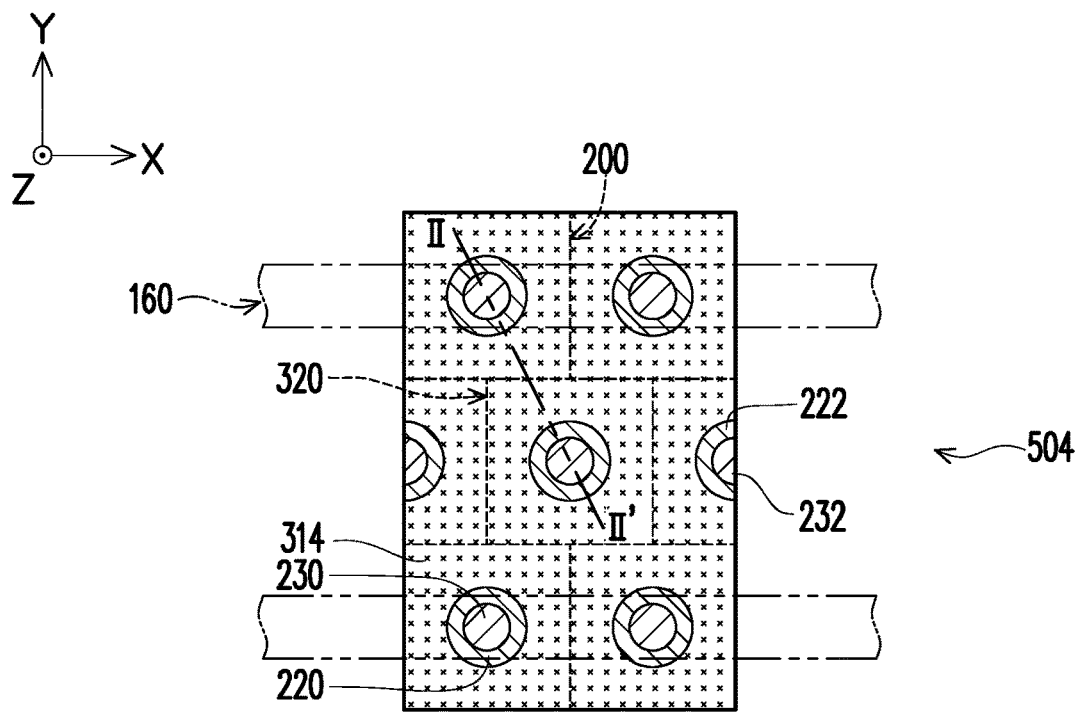
Figure 20C:
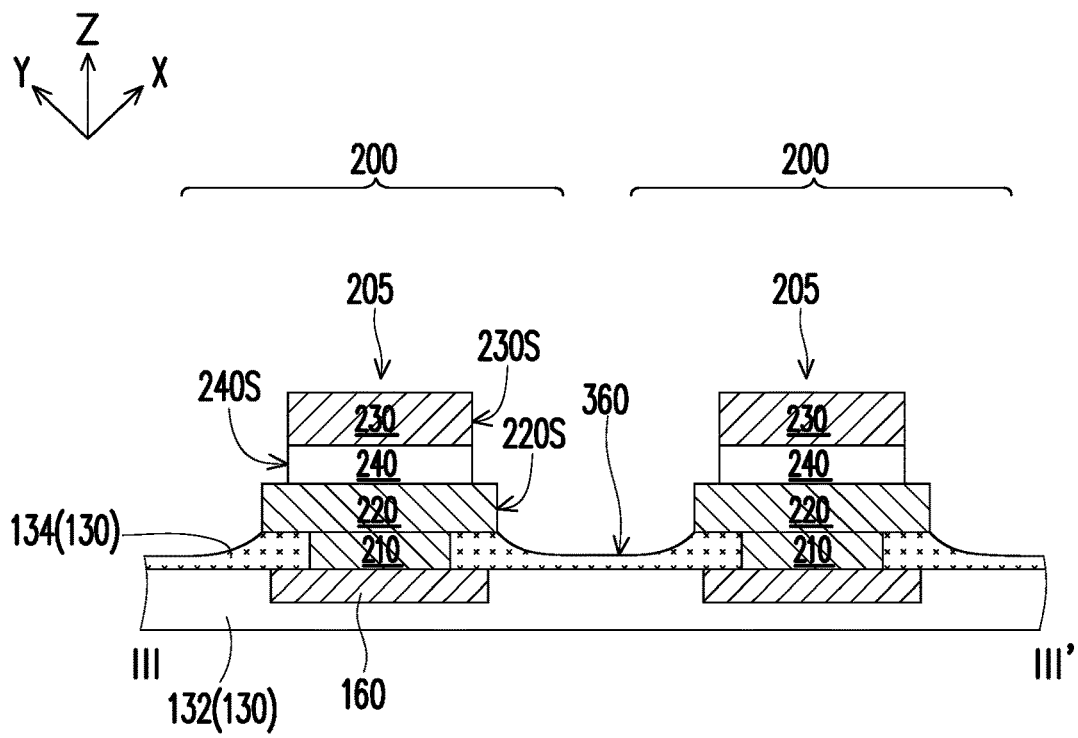
FIG. 20C and FIG. 20D are schematic cross-sectional views of regions of a structure formed during a manufacturing method of a semiconductor device according to some embodiments of the disclosure.
Figure 20D:
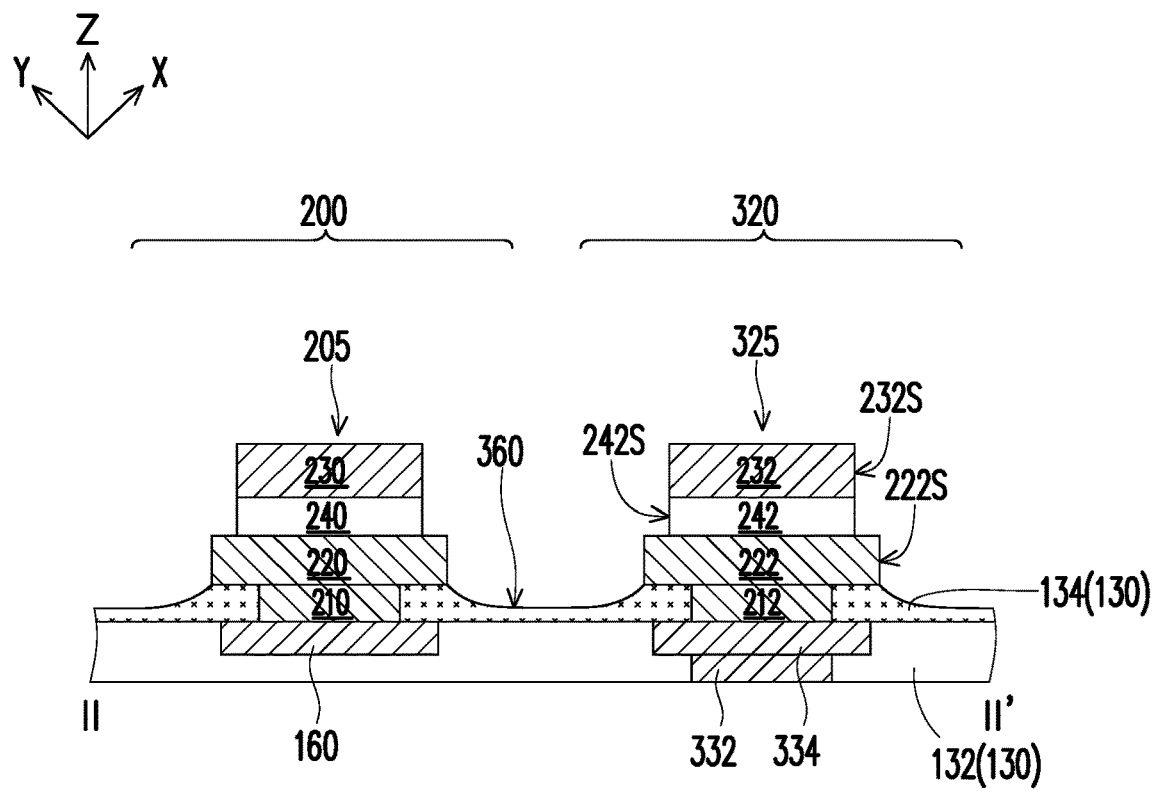
Figure 21A:
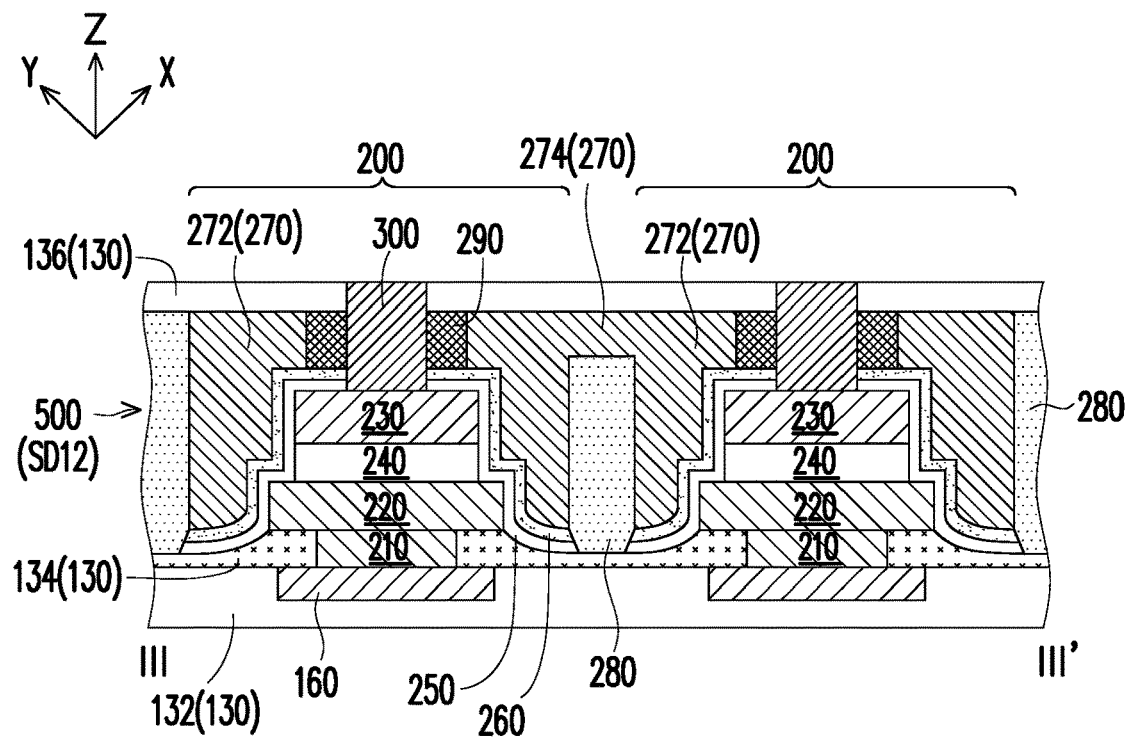
FIG. 21A and FIG. 21B are schematic cross-sectional views of regions of a semiconductor device according to some embodiments of the disclosure.
Figure 21B:
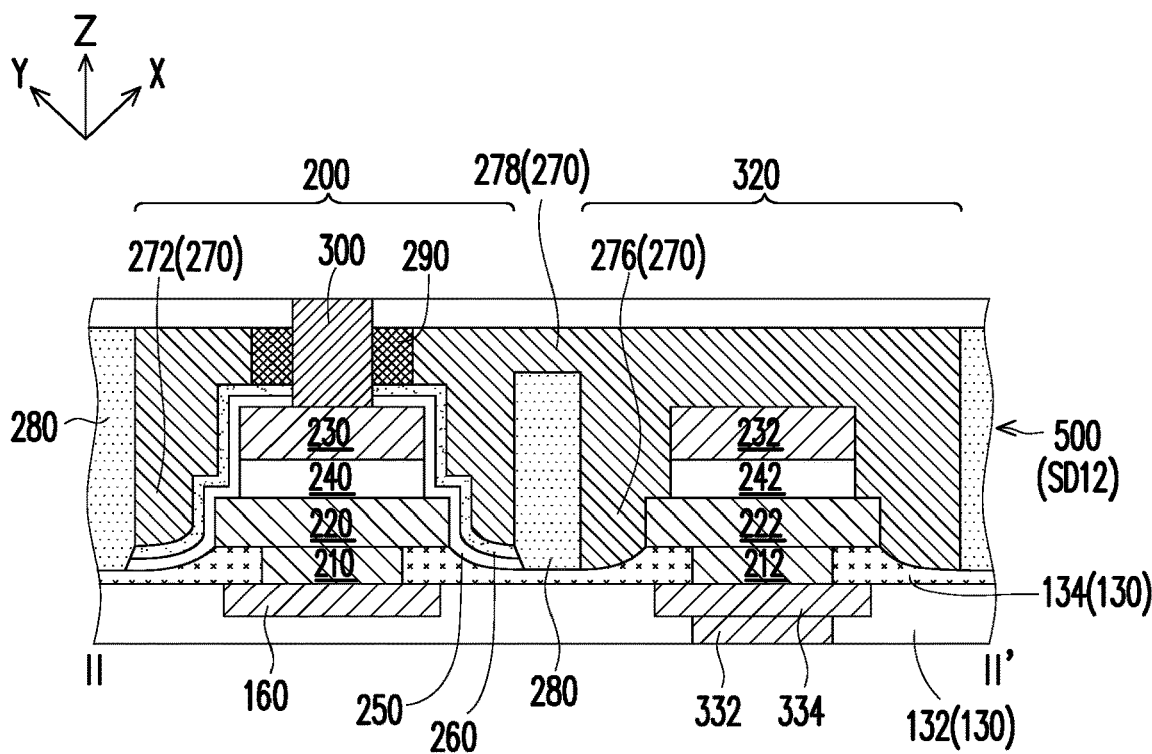

FIG. 20A to FIG. 21B illustrate structures formed during a manufacturing method of a semiconductor device SD12 according to some embodiments of the disclosure. The semiconductor device SD12 may have a similar structure to the semiconductor device SD10 of FIG. 2, and all previous description presented with respect to the structure and manufacturing of the semiconductor device SD10 may be considered to apply also for the semiconductor device SD12. The views of FIG. 20A to FIG. 20D may correspond to the manufacturing stage previously discussed with reference to FIG. 9A to FIG. 9D. In particular, FIG. 20A is a schematic top view of a region corresponding to a portion of the cell region 502 of a transistor array 500, similar to the area A illustrated in FIG. 3. FIG. 20B is a schematic top view of another region of the same structure of FIG. 20A which may correspond to a portion of the transistor array 500 including part of the contact region 504, as indicated by the area B of FIG. 3. The cross-sectional views illustrated in FIG. 20C and FIG. 21A are taken along the line III-III' indicated in FIG. 20A, and the cross-sectional views illustrated in FIG. 20D and FIG. 21B are taken along the lines II-II' indicated in FIG. 20B.

Referring to FIG. 20A to FIG. 20D, in some embodiments, the drain contacts 220 and the source contacts 230 may include the same material. Similarly, the lower metallic blocks 222 and the upper metallic blocks 232 may include the same material. As such, when the source contacts 230 and the upper metallic blocks 232 are used as etching masks (as previously described with reference to FIG. 9A to FIG. 9D), the drain contacts 220 and the lower metallic blocks 222 may be left unconsumed or may be barely affected by the etching process. As a result, after the pillar stacks 205 and 325 are formed, the drain contacts 220 and the lower metallic blocks 222 may laterally protrude with respect to the overlying source contacts 230 and upper metallic blocks 232, with sidewalls 220S, 222S substantially vertical and vertically misaligned with respect to the sidewalls 230S, 232S, 240S, 242S of the overlying source contacts 230, upper metallic blocks 232, and spacers 240, 242. In particular, the pillar stacks 205, 325 may present a step-like configuration at the level of the drain contacts 220/lower metallic blocks 222 and the spacers 240, 242. For example, narrower pillars tops including the source contacts 230 and the spacers 240 or the upper metallic blocks 232 and the spacers 242 may vertically project from wider pedestals formed by the drain contacts 220 or the lower metallic blocks 222. As a consequence, a similar step-like configuration may be formed for the semiconductor channel layer 250 and the gate dielectric layer 260, as illustrated in FIG. 21A and FIG. 21B.

Figure 22:
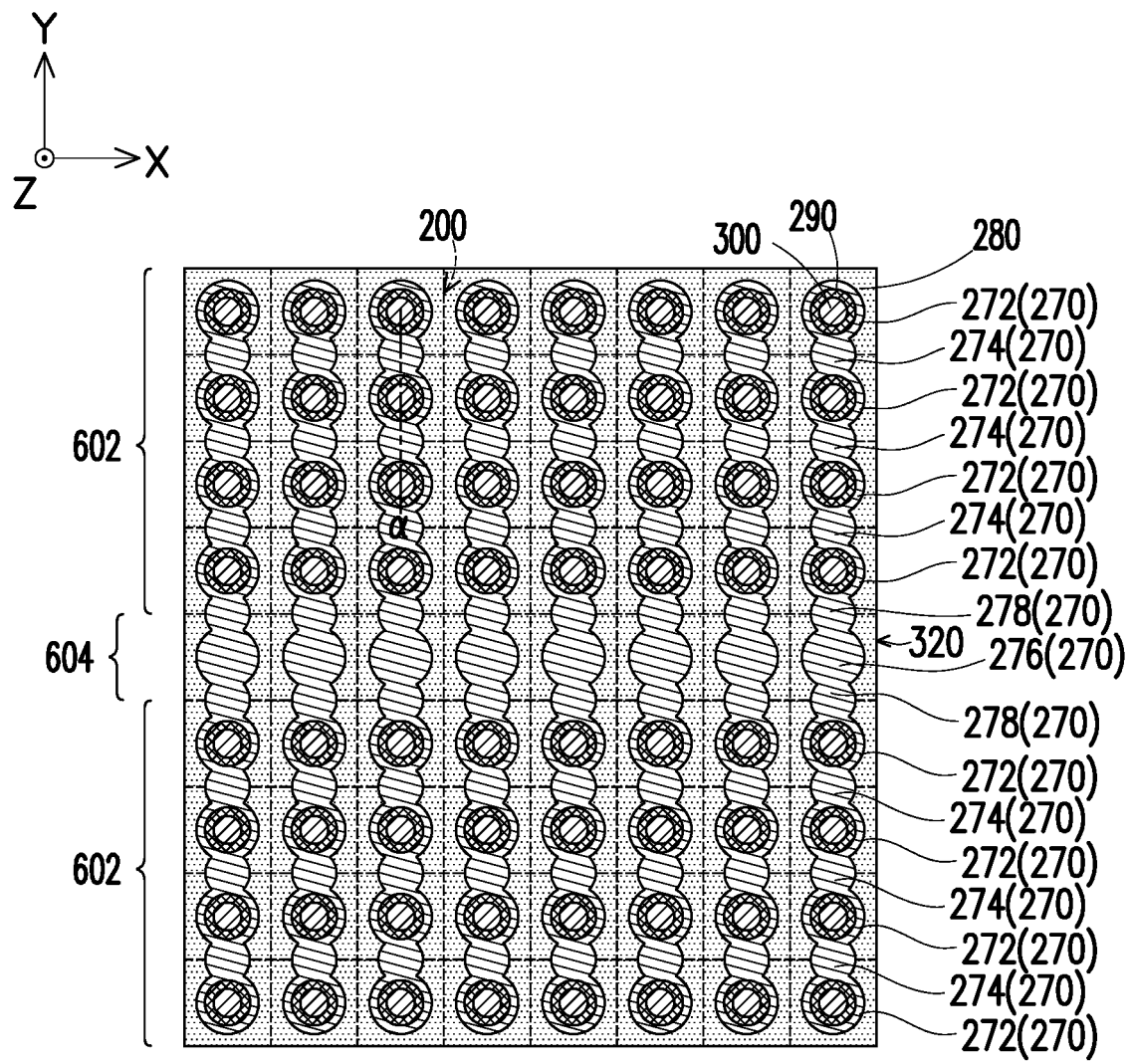
FIG. 22 and FIG. 23 are schematic top views of regions of semiconductor devices according to some embodiments of the disclosure.

FIG. 22 is a schematic top view of a transistor array 600 of a semiconductor device SD14 according to some embodiments of the disclosure. The semiconductor device SD14 may have a similar structure to the semiconductor device SD10 of FIG. 2 and the semiconductor device SD12 of FIG. 21A and FIG. 21B, and all previous description presented with respect to the structure and manufacturing of the semiconductor devices SD10 and SD12 may be considered to apply also for the semiconductor device SD14. As previously discussed for the schematic top view of FIG. 3, also in FIG. 22 may be illustrated elements which would be visible in cross-sectional views taken in XY planes located at different level heights along the Z direction. In some embodiments, the transistor array 600 may also include cell regions 602 disposed at opposite sides of a contact region 604. In some embodiments, the transistors 200 and the gate contacts 320 may be substantially aligned along the extending direction of the gate patterns 270. For example, the gate patterns 270 may extend along the Y direction, with the gate sections 272, the connecting sections 274, 278, and the contact sections 276 being substantially located at a same level height along the X direction. That is, while in FIG. 3 was presented a staggered configuration of the transistor array 170 with an absolute value of the magnitude of the staggering angle α of about 30 degrees, the staggering angle α of the transistor array 600 may be about 0 degrees.

Figure 23:
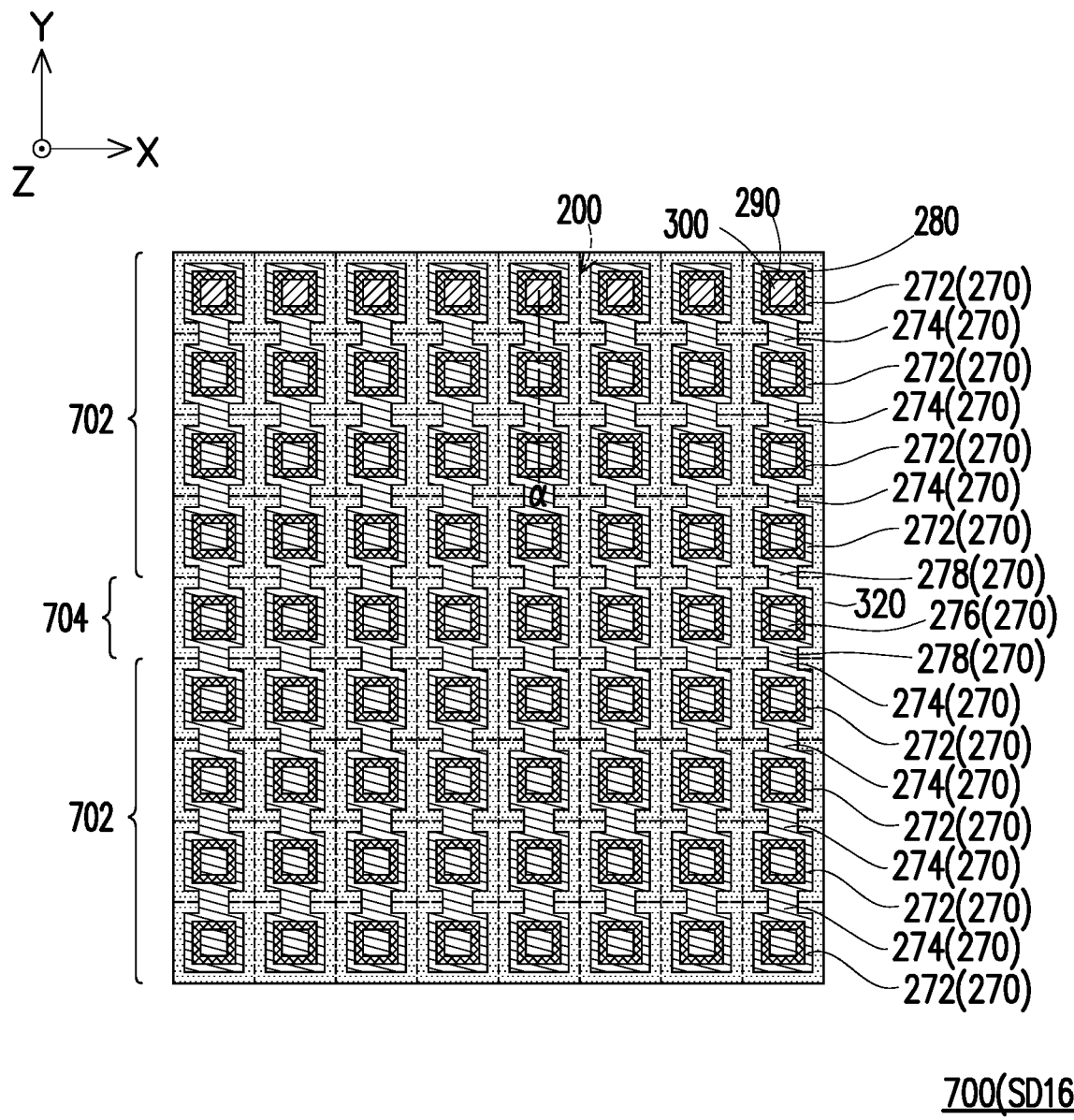

FIG. 23 is a schematic top view of a transistor array 700 of a semiconductor device SD16 according to some embodiments of the disclosure. The semiconductor device SD14 may have a similar structure to the semiconductor device SD10 of FIG. 2 and the semiconductor device SD12 of FIG. 21A and FIG. 21B, and all previous description presented with respect to the structure and manufacturing of the semiconductor devices SD10 and SD12 may be considered to apply also for the semiconductor device SD16. As previously discussed for the schematic top view of FIG. 3, also in FIG. 23 may be illustrated elements which would be visible in cross-sectional views taken in XY planes located at different level heights along the Z direction. In some embodiments, the transistor array 700 may also include cell regions 702 disposed at opposite sides of a contact region 704. In some embodiments, the transistors 200 and the gate contacts 320 may be substantially aligned along the extending direction of the gate patterns 270, as previously discussed with reference to the transistor array 600 of FIG. 22. That is, also in FIG. 23, the staggering angle α of the transistor array 700 may be about 0 degrees. However, the disclosure is not limited thereto, and other values for the magnitude of the staggering angle α are possible. For example, the absolute value of the magnitude of the staggering angle α may be in the range from 0 to 45 degrees. Furthermore, the transistors 200 and the gate contacts 320 of the transistor array 700 may have been formed with a polygonal footprint, such as a rectangular footprint. However, the disclosure is not limited thereto, and other footprints (e.g., square, pentagonal, hexagonal, octagonal, etc.) are contemplated within the scope of the disclosure.

Figure 19A:
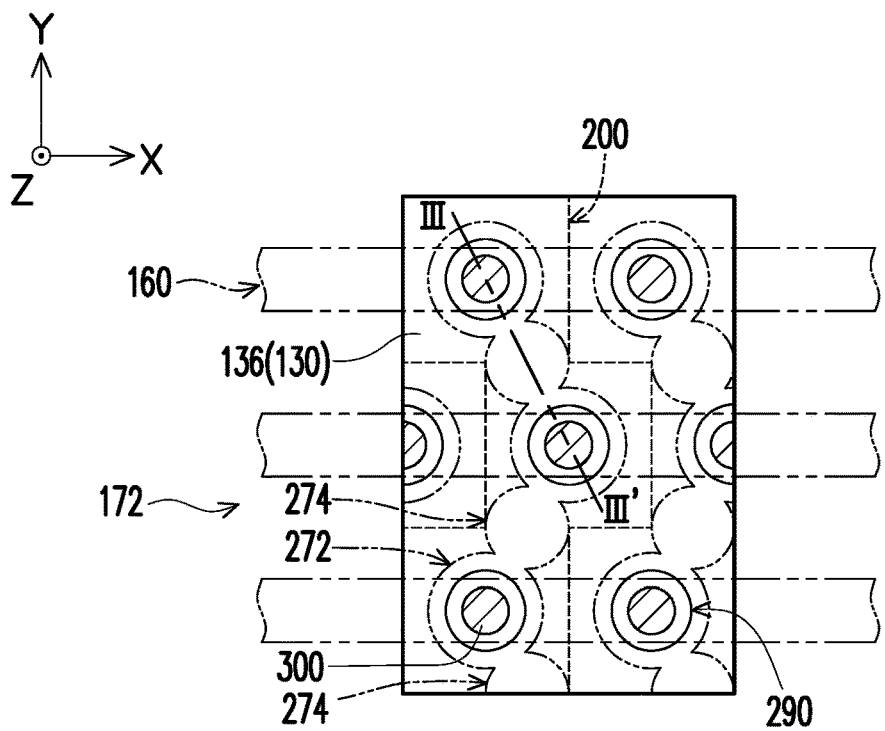
Figure 19B:
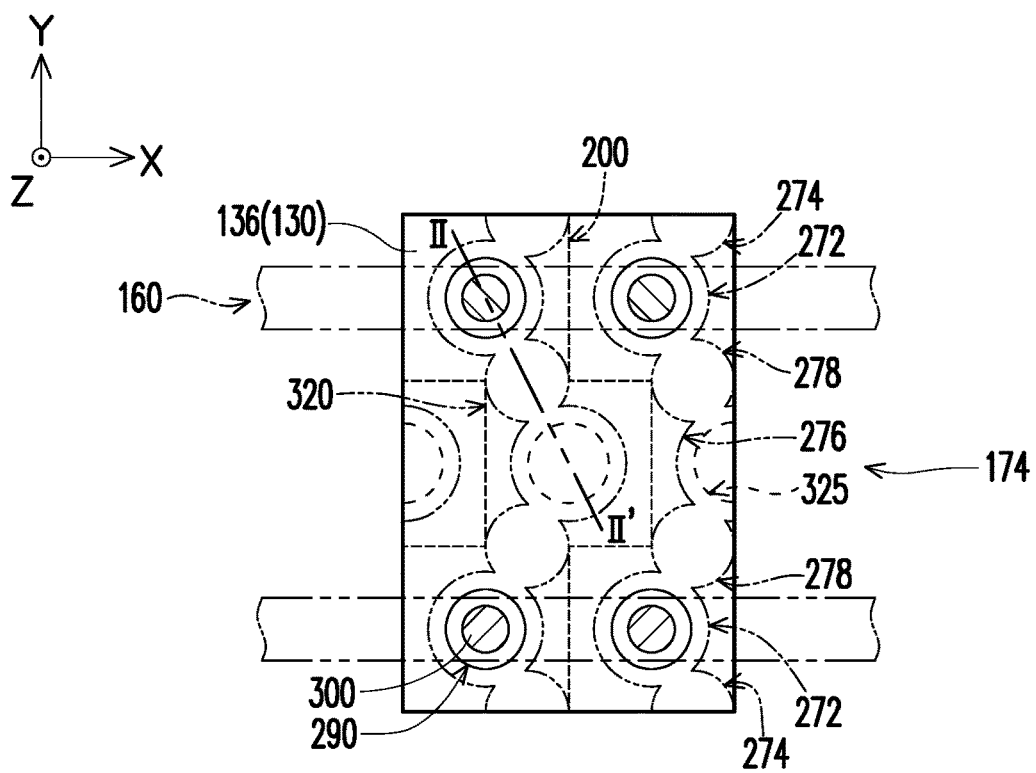
Figure 19C:
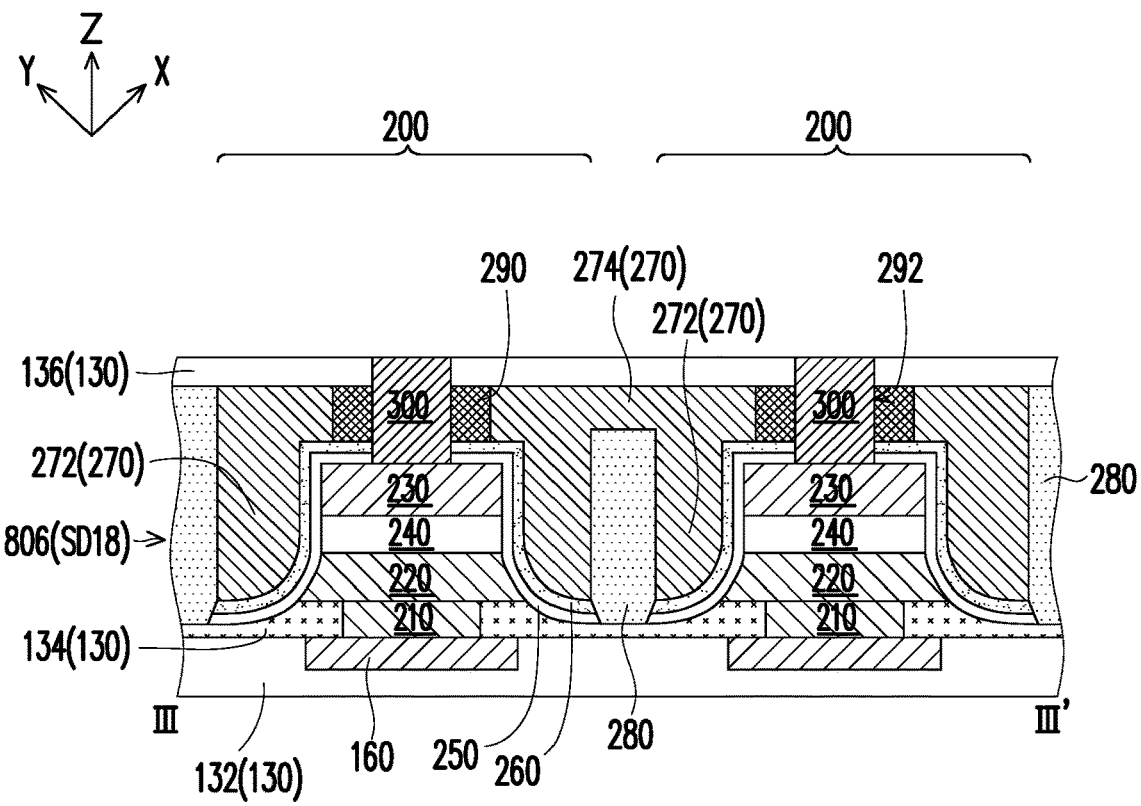
Figure 19D:
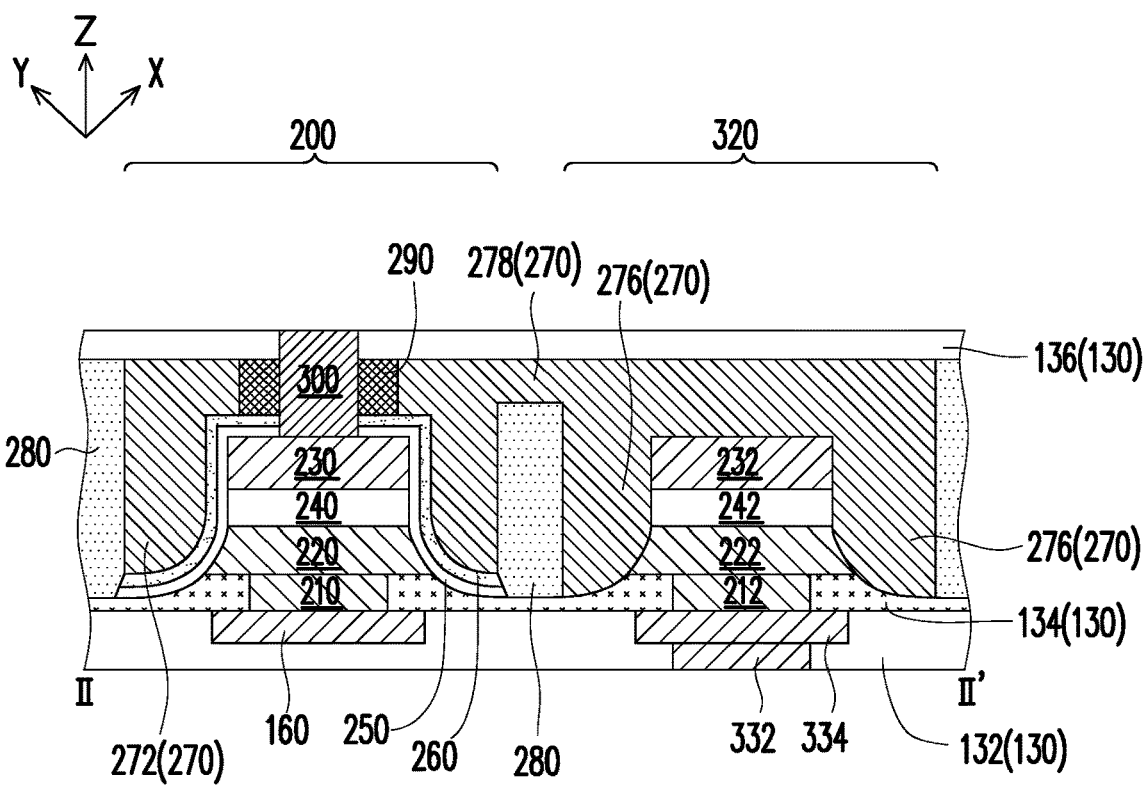
Figure 24A:
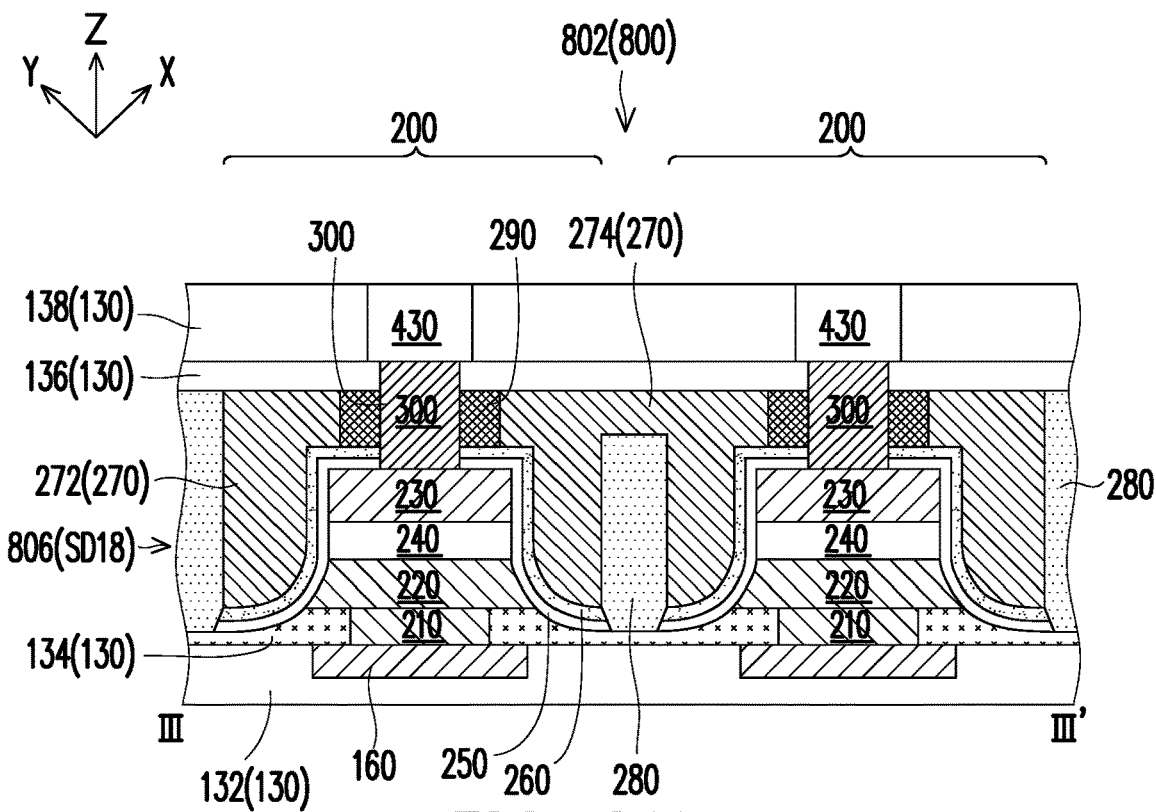
FIG. 24A and FIG. 24B are schematic cross-sectional views of regions of a semiconductor device according to some embodiments of the disclosure.
Figure 24B:
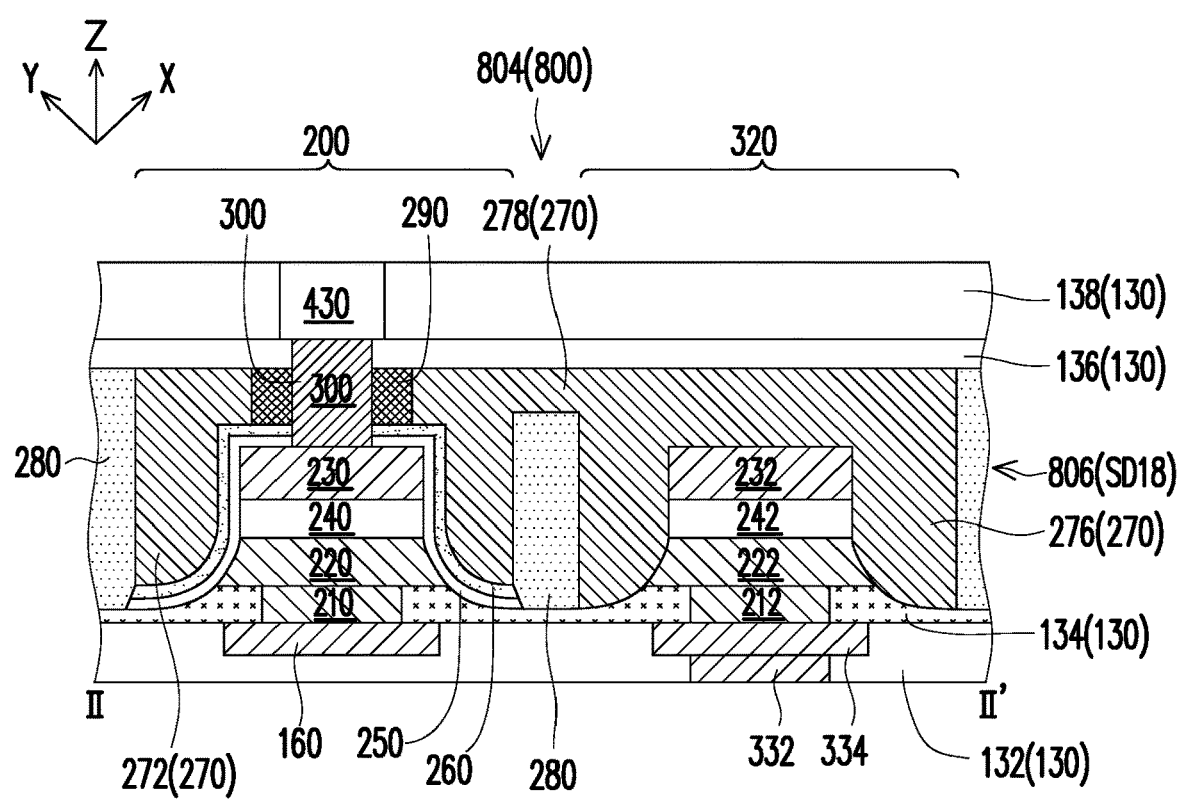

FIG. 24A and FIG. 24B are cross-sectional views of regions of a semiconductor device SD18 according to some embodiments of the disclosure. The semiconductor device SD18 may have a similar structure to the semiconductor device SD10 of FIG. 2, and all previous description presented with respect to the structure and manufacturing of the semiconductor devices SD10, SD12 of FIG. 21A and FIG. 21B, SD14 of FIG. 22, and SD16 of FIG. 23, may be considered to apply also for the semiconductor device SD12. The cross-sectional view of FIG. 24A may be taken in a region corresponding to a portion of the cell region 802 of a transistor array 800, similar to the area A illustrated in FIG. 3, along a line III-III' as indicated in FIG. 19A, for example. The cross-sectional view of FIG. 24B may be taken in a region corresponding to a portion of the contact region 804 of the transistor array 800, similar to the area B illustrated in FIG. 3, along a line II-II' as indicated in FIG. 19B, for example.

In some embodiments, the transistor array 800 is part of a memory array 806, in which the conductive lines 160 are configured as bit lines, and the gate patterns 270 are configured as word lines. Individual transistors 200 of the transistor array 800 may be part of corresponding memory cells, and their source contacts 230 may be connected through the contact vias 300 to memory elements 430 formed over the transistor array 800. For example, each transistor 200 may be connected to a dedicated memory element 430, and the memory elements 430 may be embedded in a common interlayer dielectric layer 138 formed on the interlayer dielectric layer 136. The memory elements 430 may be configured in a variety of manner, as long as they are capable of storing a bit of information. For example, the memory elements 430 may be capacitors connected to a common ground plane at a terminal opposite with respect to the transistors 200. Each memory element 430 may then be capable of storing a certain amount of electric charge. By applying predetermined voltages to the gate patterns 270 and the conductive lines 160 associated with a certain transistor 200, and monitoring voltage drifts in the conductive lines 160, it is possible to determine the charge state of the selected memory element 430. That is, in some embodiments, the memory array 806 of the semiconductor device SD18 may be configured as a dynamic random-access memory. However, the disclosure is not limited thereto. The transistor array 800 may be integrated in other types of memories such as magneto-resistive random-access memories (MRAM), resistive random-access memories (RRAM), phase-change random-access memories (PCRAM), conductive bridging random-access memories (CBRAM), or the like, by appropriately selecting the types of memory elements 430. In some embodiments, the memory arrays 806 are operated based on two terminals per cell, and the memory elements 430 may be commonly grounded at terminals opposite to the associated transistors 200. In some embodiments, the memory arrays 806 are operated based on three terminals per cell, and the memory elements 430 may be connected to source lines (not shown) extending parallel to the conductive lines 160, with memory elements 430 belonging to the same row of the memory array 806 connected to the same source line.

In accordance with some embodiments of the disclosure, a semiconductor die includes a semiconductor substrate and an interconnection structure disposed over the semiconductor substrate. The interconnection structure includes first conductive lines, first conductive patterns, first pillar stacks, second pillar stacks, and gate patterns. The first conductive lines extend parallel to each other in a first direction and are embedded in an interlayer dielectric layer of the interconnection structure. The first conductive patterns are disposed in a row along the first direction and are embedded in the interlayer dielectric layer beside the first conductive lines. The first pillar stacks include first pairs of metallic blocks separated by first blocks of dielectric material. The first pillar stacks are arranged by rows extending along the first direction. The first pillar stacks belonging to a same row are connected to a same first conductive line of the first conductive lines. The second pillar stacks include second pairs of metallic blocks separated by second blocks of dielectric material. Each second pillar stack is electrically connected to a respective first conductive pattern of the first conductive patterns. The gate patterns extend substantially perpendicular to the first conductive lines. Each gate pattern directly contacts one respective second pillar stack of the second pillar stacks and extends over a group of first pillar stacks. Each first pillar stack contacted by a same gate pattern is connected to a different first conductive line of the first conductive lines.

In accordance with some embodiments of the disclosure, a semiconductor device includes a semiconductor substrate and a memory array. The memory array is disposed over the semiconductor substrate. The memory array includes memory cells, gate contacts, isolation structures, and word lines. The memory cells and the gate contacts are disposed in rows extending along a first direction. The isolation structures are interposed between adjacent memory cells and gate contacts of the memory array. The word lines extend parallel to each other to intersect the rows of memory cells and gate contacts. The memory cells include source contacts and drain contacts vertically stacked, and semiconductor oxide layers extending on sidewalls of the source contacts and the drain contacts. The gate contacts include lower metallic blocks, first dielectric layers, and upper metallic blocks sequentially stacked. Each word line includes gate sections, first connecting sections, a contact section, and at least one second connecting section. The gate sections encircle the semiconductor oxide layers on the sidewalls of the source contacts and the drain contacts of memory cells associated with the word line. The first connecting sections extend on the isolation structures to interconnect the gate sections of the word line. The contact section encircles a respective gate contact of the word line. The contact section directly contacts the lower metallic block of the encircled gate contact. The at least one second connecting section extends on an isolation structure disposed between the associated gate contact and the source and drain contacts of an adjacent memory cell to interconnect the contact section with the gate section encircling the source and drain contacts of the adjacent memory cell.

In accordance with some embodiments of the disclosure, a manufacturing method of a semiconductor device includes the following steps. Pillar stacks are formed over a semiconductor substrate. The pillar stacks include first metallic blocks, dielectric blocks, and second metallic blocks sequentially stacked. The first metallic blocks are closer to the semiconductor substrate. A semiconductor channel layer is formed. The semiconductor channel layer covers sidewalls and top surfaces of the pillar stacks. A high-k dielectric layer is formed on the semiconductor channel layer. First portions of the semiconductor channel layer and the high-k dielectric layer are removed to form first trenches exposing first pillar stacks of the pillar stack. Strips of conductive material are formed on the pillar stacks. The strips of conductive material extend on the high-k dielectric layer remaining on second pillar stacks of the pillar stacks and directly contact the first metallic blocks of the first pillar stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
a semiconductor substrate and an interconnection structure disposed over the semiconductor substrate, wherein the interconnection structure comprises:
first conductive lines extending parallel to each other in a first direction, embedded in an interlayer dielectric layer of the interconnection structure;
first conductive patterns, disposed in a row along the first direction, embedded in the interlayer dielectric layer beside the first conductive lines;
first pillar stacks, comprising first pairs of metallic blocks separated by first blocks of dielectric material and arranged by rows extending along the first direction, wherein the first pillar stacks belonging to a same row are connected to a same first conductive line of the first conductive lines;
second pillar stacks, comprising second pairs of metallic blocks separated by second blocks of dielectric material, each second pillar stack being electrically connected to a respective first conductive pattern of the first conductive patterns; and
gate patterns, extending substantially perpendicular to the first conductive lines, wherein each gate pattern directly contacts one respective second pillar stack of the second pillar stacks and extends over a group of first pillar stacks, each first pillar stack contacted by a same gate pattern being connected to a different first conductive line of the first conductive lines.

2. The semiconductor die of claim 1, further comprising semiconductor channel layers, extending on the first pillar stacks, and extending in between the first pillar stacks and the corresponding gate patterns.

3. The semiconductor die of claim 1, further comprising high-k dielectric layers, extending on the semiconductor channels layers, and extending in between the semiconductor channel layers and the corresponding gate patterns.

4. The semiconductor die of claim 1, wherein the first conductive patterns are located in a gap between a pair of consecutive first conductive lines.

5. The semiconductor die of claim 4, wherein an equal number of the first conductive lines is disposed at each side of the gap.

6. The semiconductor die of claim 1, wherein the first blocks of dielectric material have a composition and a thickness the same as those of the second blocks of dielectric material.

7. The semiconductor die of claim 1, wherein an absolute value of a magnitude of a staggering angle between an alignment direction of first pillar stacks consecutively contacted by a same gate pattern and a second direction perpendicular to the first direction is in a range from 0 to 45 degrees.

8. A semiconductor device, comprising:
a semiconductor substrate and
a memory array disposed over the semiconductor substrate, wherein the memory array comprises:
memory cells and gate contacts disposed in rows extending along a first direction,
isolation structures, interposed between adjacent memory cells and gate contacts of the memory array; and
word lines, extending parallel to each other to intersect the rows of memory cells and gate contacts,
wherein the memory cells comprise source contacts and drain contacts vertically stacked, and semiconductor oxide layers extending on sidewalls of the source contacts and the drain contacts, the gate contacts comprise lower metallic blocks, first dielectric layers, and upper metallic blocks sequentially stacked, and each word line comprises:
- gate sections, encircling the semiconductor oxide layers on the sidewalls of the source contacts and the drain contacts of memory cells associated with the word line;
- first connecting sections, extending on the isolation structures to interconnect the gate sections of the word line;
- a contact section, encircling a respective gate contact of the word line, the contact section directly contacting the lower metallic block of the encircled gate contact; and
- at least one second connecting section, extending on an isolation structure disposed between the associated gate contact and the source and drain contacts of an adjacent memory cell to interconnect the contact section with the gate section encircling the source and drain contacts of the adjacent memory cell.

9. The semiconductor device of claim 8, wherein the source contacts and the upper metallic blocks have a same thickness and include a same metallic material.

10. The semiconductor device of claim 9, wherein the drain contacts and the lower metallic blocks laterally protrude with respect to the overlying source contacts and upper metallic blocks.

11. The semiconductor device of claim 8, wherein the memory array further comprises:
- bit lines, extending along the first direction in correspondence of the rows of memory cells; and
- word line signal conductive patterns, contacting the lower metallic blocks of the gate contacts and adapted to transmit word line signals to the word lines.

12. The semiconductor device of claim 8, wherein the memory array further comprises:
- dielectric caps, located on portions of the semiconductor oxide layers extending on top surfaces of the source contacts and encircled by the gate sections; and
- contact vias, extending through the dielectric caps to contact the source contacts, wherein the dielectric caps separate the contact vias from the gate sections.

13. The semiconductor device of claim 8, wherein top surfaces of the gate sections, the first connecting sections, the contact sections, and the second connecting sections are level with each other.

14. The semiconductor device of claim 8, wherein the contact section further directly contacts sidewalls of the first dielectric layer and the upper metallic block of the encircled gate contact and a top surface of the upper metallic block of the encircled gate contact.

15. A manufacturing method of a semiconductor device, comprising:
- forming pillar stacks over a semiconductor substrate, the pillar stacks comprising first metallic blocks, dielectric blocks, and second metallic blocks sequentially stacked, the first metallic blocks being closer to the semiconductor substrate;
- forming a semiconductor channel layer covering sidewalls and top surfaces of the pillar stacks;
- forming a high-k dielectric layer on the semiconductor channel layer;
- removing first portions of the semiconductor channel layer and the high-k dielectric layer to form first trenches exposing first pillar stacks of the pillar stacks; and
- forming strips of conductive material on the pillar stacks, wherein the strips of conductive material extend on the high-k dielectric layer remaining on second pillar stacks of the pillar stacks and directly contact the first metallic blocks of the first pillar stacks.

16. The manufacturing method of claim 15, further comprising:
- removing second portions of the semiconductor channel layer and the high-k dielectric layer in between adjacent second pillar stacks to form separate semiconductor channel layers and high-k dielectric layers on the individual second pillar stacks; and
- filling an isolating material in the first trenches to form an isolation plug covering the first pillar stacks and in place of the second portions of the semiconductor channel layer and the high-k dielectric layer to form isolation structures encircling individual second pillar stacks.

17. The manufacturing method of claim 16, further comprising:
- disposing a dielectric filling material on the high-k dielectric layer before removing the second portions of the semiconductor channel layer; and
- removing first portions of the dielectric filling material overlying the second portions of the semiconductor channel layer and the high-k dielectric layer,
- wherein forming the first trenches further comprises removing second portions of the dielectric filling material overlying the first portions of the semiconductor channel layer and the high-k dielectric layer,
- the isolating material is filled in place of the first portions and the second portions of the dielectric filling material, and
- third portions of the dielectric filling material remain on the second pillar stacks.

18. The manufacturing method of claim 17, wherein forming the strips of conductive material comprises:
- removing first portions of the isolating material from the isolation plug to form second trenches exposing the first pillar stacks,
- removing the third portions of the dielectric filling material to form third trenches exposing the high-k dielectric layers on the second pillar stacks, wherein the second trenches are connected to the third trenches; and
- filling the conductive material of the strips in the second trenches and the third trenches.

19. The manufacturing method of claim 18, further comprising:
- removing part of the third portions of the dielectric filling material overlying the second pillar stacks before forming the second trenches to form cap trenches exposing at their bottom sections of the high-k dielectric layers extending on top surfaces of the second pillar stacks;
- filling the cap trenches with an additional isolating material to form dielectric caps;
- removing central regions of the dielectric caps with the underlying sections of the high-k dielectric layers and the semiconductor channel layers to form via trenches exposing at their bottom the top surfaces of the second pillar stacks; and
- filling the via trenches with additional conductive material to form via contacts.

20. The manufacturing method of claim 15, wherein forming the pillar stacks comprises:
- disposing a conductive material in first recesses of a first interlayer dielectric layer to form the first metallic blocks;
- forming a pair of stacked dielectric layers on the first interlayer dielectric layer;
- forming second recesses in an upper dielectric layer of the stacked dielectric layers;
- disposing additional conductive material in the second recesses to form the second metallic blocks; and
- etching the pair of stacked dielectric layers and the first interlayer dielectric layers using the second metallic blocks as masks.

* * * * *